(12) United States Patent
Kubota et al.

(10) Patent No.: US 11,941,197 B2
(45) Date of Patent: Mar. 26, 2024

(54) FUNCTIONAL PANEL, DISPLAY DEVICE, INPUT/OUTPUT DEVICE, AND DATA PROCESSING DEVICE

(71) Applicant: Semiconductor Energy Laboratory Co., Ltd., Atsugi (JP)

(72) Inventors: Daisuke Kubota, Atsugi (JP); Susumu Kawashima, Atsugi (JP); Koji Kusunoki, Isehara (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 17/633,634

(22) PCT Filed: Aug. 26, 2020

(86) PCT No.: PCT/IB2020/057948
§ 371 (c)(1),
(2) Date: Feb. 8, 2022

(87) PCT Pub. No.: WO2021/044253
PCT Pub. Date: Mar. 11, 2021

(65) Prior Publication Data
US 2022/0317796 A1    Oct. 6, 2022

(30) Foreign Application Priority Data

Sep. 6, 2019 (JP) ................. 2019-162688

(51) Int. Cl.
*G06F 3/042* (2006.01)
*G06F 3/041* (2006.01)

(52) U.S. Cl.
CPC .......... *G06F 3/0412* (2013.01); *G06F 3/0421* (2013.01); *G06F 2203/04106* (2013.01);
(Continued)

(58) Field of Classification Search
CPC .... G06F 1/1637; G06F 1/1643; G06F 1/3218; G06F 1/324; G06F 1/3262; G06F 3/0412;
(Continued)

(56) References Cited

U.S. PATENT DOCUMENTS 9,310,915 B2    4/2016   Kurokawa
9,368,090 B2    6/2016   Koyama et al.
(Continued)

FOREIGN PATENT DOCUMENTS

CN    102265244 A    11/2011
CN    103413522 A    11/2013
(Continued)

OTHER PUBLICATIONS

International Search Report (Application No. PCT/IB2020/057948) dated Oct. 13, 2020.
(Continued)

*Primary Examiner* — Julie Anne Watko
(74) *Attorney, Agent, or Firm* — Eric J. Robinson; Robinson Intellectual Property Law Office, P.C.

(57) ABSTRACT

A novel functional panel that is highly convenient, useful, or reliable is provided. The functional panel includes a first driver circuit, a second driver circuit, and a pixel set, the first driver circuit has a function of supplying a first selection signal and a second selection signal, a second driver circuit has a function of supplying an image signal and a control signal, and the control signal includes a first level and a second level. The pixel set includes a first pixel, and the first pixel includes a first element and a first pixel circuit. The first pixel circuit has functions of obtaining the image signal on the basis of the first selection signal, obtaining the control signal on the basis of the second selection signal, and holding a first state to a third state. The first element is electrically connected to the first pixel circuit, performs
(Continued)

display with first brightness on the basis of the first state, performs display with second brightness on the basis of the second state, and performs display using the image signal on the basis of the third state. The first brightness is darker than the second brightness.

11 Claims, 29 Drawing Sheets

(52) U.S. Cl.
CPC . *G09G 2300/0814* (2013.01); *G09G 2310/06* (2013.01); *G09G 2310/08* (2013.01); *G09G 2354/00* (2013.01); *G09G 2360/141* (2013.01)

(58) Field of Classification Search
CPC ............. G06F 3/04164; G06F 3/04166; G06F 3/0421; G06F 3/0446; G06F 3/04883; G06F 2203/04106; G06F 2203/04112; G09G 3/3233; G09G 2300/0452; G09G 2300/0814; G09G 2310/06; G09G 2310/08; G09G 2354/00; G09G 2360/14; G09G 2360/141; H10K 59/40

See application file for complete search history.

(56) References Cited

U.S. PATENT DOCUMENTS

| | | |
|---|---|---|
| 9,806,098 B2 | 10/2017 | Kaneyasu |
| 9,985,052 B2 | 5/2018 | Kaneyasu |
| 2010/0156851 A1 | 6/2010 | Kurokawa |
| 2015/0162359 A1 | 6/2015 | Kaneyasu |
| 2015/0234540 A1* | 8/2015 | Sasaki ............... G02B 27/026 |
| | | 345/175 |
| 2015/0317932 A1 | 11/2015 | Zhou et al. |
| 2021/0066669 A1 | 3/2021 | Kubota et al. |
| 2022/0068181 A1 | 3/2022 | Watanabe et al. |

FOREIGN PATENT DOCUMENTS

| | | |
|---|---|---|
| JP | 2010-170538 A | 8/2010 |
| JP | 2011-191473 A | 9/2011 |
| JP | 2015-005280 A | 1/2015 |
| JP | 2015-132817 A | 7/2015 |
| JP | 2019-009672 A | 1/2019 |
| KR | 2011-0100295 A | 9/2011 |
| TW | 201035835 | 10/2010 |
| WO | WO-2010/073892 | 7/2010 |

OTHER PUBLICATIONS

Written Opinion (Application No. PCT/IB2020/057948) dated Oct. 13, 2020.

* cited by examiner

FUNCTIONAL PANEL, DISPLAY DEVICE, INPUT/OUTPUT DEVICE, AND DATA PROCESSING DEVICE

TECHNICAL FIELD

One embodiment of the present invention relates to a functional panel, a display device, an input/output device, a data processing device, or a semiconductor device.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Thus, more specifically, examples of the technical field of one embodiment of the present invention disclosed in this specification include a semiconductor device, a display device, a light-emitting device, a power storage device, a memory device, a driving method thereof, and a manufacturing method thereof.

BACKGROUND ART

An imaging panel including a substrate with an insulating surface and a plurality of imaging pixels on the insulating surface is known (Patent Document 1). The imaging pixel on the imaging panel includes a plurality of windows which are arranged in a matrix and transmit visible light, a photoelectric conversion element having a grid-like formation which extends between the plurality of windows and supplies a signal, and a sensing circuit supplied with the signal.

REFERENCE

[Patent Document]
[Patent Document 1] Japanese Published Patent Application No. 2015-005280

SUMMARY OF THE INVENTION

Problems to be Solved by the Invention

An object of one embodiment of the present invention is to provide a novel functional panel that is highly convenient, useful, or reliable. Another object is to provide a novel display device that is highly convenient, useful, or reliable. Another object is to provide a novel input/output device that is highly convenient, useful, or reliable. Another object is to provide a novel data processing device that is highly convenient, useful, or reliable. Another object is to provide a novel functional panel, a novel display device, a novel input/output device, a novel data processing device, or a novel semiconductor device.

Note that the descriptions of these objects do not preclude the existence of other objects. One embodiment of the present invention does not have to achieve all these objects. Other objects are apparent from the descriptions of the specification, the drawings, the claims, and the like, and other objects can be derived from the descriptions of the specification, the drawings, the claims, and the like.

Means for Solving the Problems (1) One embodiment of the present invention includes a first driver circuit, a second driver circuit, and a pixel set.

The first driver circuit has a function of supplying a first selection signal and a second selection signal, the second driver circuit has a function of supplying an image signal and a control signal, and the control signal includes a first level and a second level.

The pixel set includes a first pixel, and the first pixel includes a first element and a first pixel circuit.

The first pixel circuit is supplied with the first selection signal, the second selection signal, the image signal, and the control signal. The first pixel circuit obtains the image signal on the basis of the first selection signal, and the first pixel circuit obtains the control signal on the basis of the second selection signal.

The first pixel circuit has a function of holding a first state to a third state. The first level is held in the first state, the second level is held in the second state, and the image signal is held in the third state.

The first element is electrically connected to the first pixel circuit, the first element performs display with first brightness on the basis of the first state, the first element performs display with second brightness on the basis of the second state, the first element performs display using the image signal on the basis of the third state, and the first brightness is darker than the second brightness.

Thus, the first pixel can be brought into a non-display state in the first state, for example. The first pixel can be used as a light in the second state, for example. The first pixel can perform display using the image signal in the third state, for example. In a period where the display of the first pixel is switched using the first selection signal and the image signal, the first pixel can be brought into a non-display state or can be used as a light using the second selection signal and the control signal. The period where the first pixel is brought into a non-display state or the period where the first pixel is used as a light can be intervened in the period where display is performed using the image signal. Thus, a novel functional panel that is highly convenient, useful, or reliable can be provided.

(2) Another embodiment of the present invention is the functional panel including a third driver circuit. The third driver circuit has a function of supplying a third selection signal to a fifth selection signal.

The pixel set includes a second pixel, the second pixel includes a second element and a second pixel circuit, the second element is electrically connected to the second pixel circuit, and the second element has a function of generating an imaging signal.

The second pixel circuit is supplied with the third selection signal to the fifth selection signal, the second pixel circuit is initialized at a first timing on the basis of the third selection signal, the second pixel circuit obtains the imaging signal at a second timing on the basis of the fourth selection signal, and the second pixel circuit has a function of supplying the imaging signal at a third timing on the basis of the fifth selection signal.

The first pixel circuit holds the first state or the second state from the first timing to the second timing, and the first pixel circuit holds the third state at the third timing.

Thus, imaging can be performed using the second pixel circuit in a period where the first pixel circuit is in the first state, for example. Alternatively, imaging can be performed using the second pixel circuit in a period where the first pixel circuit is in the second state, for example. Alternatively, imaging can be performed using the second pixel in a period where the first pixel is in a non-display state, for example. Alternatively, a finger approaching the first pixel can be imaged using the second pixel with the use of the first pixel as a light, for example. Alternatively, imaging can be performed under different conditions using the second pixel in a period where image data displayed with the first pixel is switched. Alternatively, data imaged while the first pixel is in a non-display state can be subtracted from data imaged using the first pixel as a light. Background data can be subtracted from the imaging data. A finger or the like approaching the first pixel can be imaged clearly by subtracting the background data, for example. A pixel set can be used as a proximity sensor. The functional panel can be used for a display device. Thus, a novel functional panel that is highly convenient, useful, or reliable can be provided.

(3) Another embodiment of the present invention is the functional panel including a first conductive film, a second conductive film, a third conductive film, a fourth conductive film, and a fifth conductive film.

The first conductive film is supplied with the first selection signal, the second conductive film is supplied with the second selection signal, the third conductive film is supplied with the image signal, and the fourth conductive film is supplied with the control signal.

The first pixel circuit includes a first node, a first transistor, a first switch, and a second switch.

The first transistor includes a gate electrode electrically connected to the first node, a first electrode electrically connected to the first element, and a second electrode electrically connected to the fifth conductive film.

The first switch includes a first terminal electrically connected to the third conductive film and a second terminal electrically connected to the first node, and has a function of controlling a conduction state or a non-conduction state on the basis of a potential of the first conductive film.

The second switch includes a first terminal electrically connected to the fourth conductive film and a second terminal electrically connected to the first node, and has a function of controlling a conduction state or a non-conduction state on the basis of a potential of the second conductive film.

The first element has a function of changing brightness on the basis of a potential of the first node.

Thus, the potential of the first node can be made close to a potential of the third conductive film using the first switch. The potential of the first node can be made close to a potential of the fourth conductive film using the second switch. The potential of the first node can be made close to the potential of the fourth conductive film using the second switch in a period where the first switch is in a non-conduction state. The potential of the first node can be made close to the potential of the third conductive film using the first switch in a period where the second switch is in a non-conduction state. The potential of the first node can be that of the first state or the second state using the second switch. The potential of the first switch can be that of the third state using the first switch. Thus, a novel functional panel that is highly convenient, useful, or reliable can be provided.

(4) Another embodiment of the present invention is the functional panel including a sixth conductive film, a seventh conductive film, an eighth conductive film, a ninth conductive film, a tenth conductive film, an eleventh conductive film, and a twelfth conductive film.

The sixth conductive film is supplied with the third selection signal, the seventh conductive film is supplied with the fourth selection signal, and the twelfth conductive film is supplied with the fifth selection signal.

The second pixel circuit includes a third switch, a fourth switch, a fifth switch, a second transistor, a first capacitor, and a second node.

The third switch includes a first terminal electrically connected to the second element and a second terminal electrically connected to the second node, and has a function of controlling a conduction state or a non-conduction state on the basis of a potential of the sixth conductive film.

The fourth switch includes a first terminal electrically connected to the second node and a second terminal electrically connected to the eighth conductive film, and has a function of controlling a conduction state or a non-conduction state on the basis of the potential of the sixth conductive film.

The first capacitor includes a conductive film electrically connected to the second node and a conductive film electrically connected to the ninth conductive film.

The second transistor includes a gate electrode electrically connected to the second node and a first electrode electrically connected to the tenth conductive film.

The fifth switch includes a first terminal electrically connected to the second electrode of the second transistor and a second terminal electrically connected to the eleventh conductive film, and has a function of controlling a conduction state or a non-conduction state on the basis of a potential of the twelfth conductive film.

Thus, an imaging signal generated by the second element can be transferred to the second node using the third switch. The imaging signal generated by the second element can be stored in the second node using the third switch. Electrical continuity between the pixel circuit and the second element can be broken by the third switch. A correlated double sampling method can be used. Noise included in the imaging signal can be reduced. Thus, a novel functional panel that is highly convenient, useful, or reliable can be provided.

(5) Another embodiment of the present invention is the functional panel including a reading circuit, a thirteenth conductive film, a fourteenth conductive film, and a fifteenth conductive film.

The reading circuit includes an amplifier circuit and a sampling circuit.

The amplifier circuit includes a third transistor, and the third transistor includes a gate electrode electrically connected to the thirteenth conductive film, a first electrode electrically connected to the sixth conductive film, and a second electrode electrically connected to the fourteenth conductive film.

The sampling circuit includes a first terminal, a second terminal, and a third terminal, the first terminal is electrically connected to the sixth conductive film, the second terminal is electrically connected to the fifteenth conductive film, and the third terminal has a function of supplying a signal that changes on the basis of a potential of the first terminal.

Thus, an imaging signal can be obtained from the second pixel circuit. A correlated double sampling method can be employed, for example. The sampling circuit can be provided for each conductive film. A differential signal of the second pixel circuit can be obtained by the corresponding conductive film. The operating frequency of the sampling circuit can be low. Noise can be reduced. Thus, a novel functional panel that is highly convenient, useful, or reliable can be provided.

(6) Another embodiment of the present invention is the functional panel including a functional layer. Note that the functional layer includes the first pixel circuit and the second pixel circuit.

Thus, the first pixel circuit can be formed in the functional layer. The second pixel circuit can be formed in the functional layer. A semiconductor film used in the second pixel circuit can be formed in a step of forming a semiconductor film used in the first pixel circuit, for example. The manufacturing process can be simplified. Thus, a novel functional panel that is highly convenient, useful, or reliable can be provided.

(7) Another embodiment of the present invention is the functional panel including a region. Note that the region includes a group of pixel sets and a different group of pixel sets.

The group of pixel sets is arranged in a row direction, the group of pixel sets includes the pixel set, and the group of pixel sets is electrically connected to the first conductive film.

The different group of pixel sets is arranged in a column direction intersecting the row direction, the different group of pixel sets includes the pixel set, and the different group of pixel sets is electrically connected to the third conductive film.

Thus, imaging data can be obtained from a plurality of pixels. In addition, image data can be supplied to a plurality of pixels. Thus, a novel functional panel that is highly convenient, useful, or reliable can be provided.

(8) Another embodiment of the present invention is a display device including a control portion and the functional panel according to any one of the above.

The control portion is supplied with image data and control data, the control portion generates data on the basis of the image data, the control portion generates a control signal on the basis of the control data, and the control portion supplies the data and the control signal.

The functional panel is supplied with the data and the control signal, and the pixel set performs display on the basis of the data.

Thus, the image data can be displayed using the first element. Thus, a novel display device that is highly convenient, useful, or reliable can be provided.

(9) Another embodiment of the present invention is an input/output device including an input portion and a display portion. Note that the display portion 230 includes the functional panel according to any one of the above.

The input portion includes a sensing region, the input portion senses an object approaching the sensing region, and the sensing region includes a region overlapping with the pixel.

Thus, the object approaching the region overlapping with the display portion can be sensed while image data is displayed using the display portion. A finger or the like approaching the display portion can be used as a pointer to input position data. Position data can be associated with image data displayed on the display portion. Thus, a novel input/output device that is highly convenient, useful, or reliable can be provided.

(10) Another embodiment of the present invention is a data processing device including an arithmetic device and an input/output device.

The arithmetic device is supplied with input data or sensing data, and the arithmetic device generates control data and image data on the basis of the input data or the sensing data.

The arithmetic device supplies the control data and the image data, the input/output device supplies the input data and the sensing data, the input/output device is supplied with the control data and the image data, and the input/output device includes a display portion, an input portion, and a sensing portion.

The display portion includes the functional panel according to any one of the above, and the display portion displays the image data on the basis of the control data.

The input portion generates the input data, and the sensing portion generates the sensing data.

Thus, the control data can be generated on the basis of the input data or the sensing data. The image data can be displayed on the basis of the input data or the sensing data. Thus, a novel data processing device that is highly convenient, useful, or reliable can be provided.

(11) Another embodiment of the present invention is a data processing device including one or more of a keyboard, a hardware button, a pointing device, a touch sensor, an illuminance sensor, an imaging device, an audio input device, an eye-gaze input device, and an attitude detection device, and the functional panel according to any one of the above.

Thus, the arithmetic device can generate the image data or the control data on the basis of the data supplied using a variety of input devices. Thus, a novel data processing device that is highly convenient, useful, or reliable can be provided.

Although a block diagram in which components are classified by their functions and shown as independent blocks is shown in the drawing attached to this specification, it is difficult to completely separate actual components according to their functions and one component can relate to a plurality of functions.

In this specification, the names of a source and a drain of a transistor interchange with each other depending on the polarity of the transistor and the levels of potentials applied to the terminals. In general, in an n-channel transistor, a terminal to which a lower potential is applied is called a source, and a terminal to which a higher potential is applied is called a drain. In a p-channel transistor, a terminal to which a lower potential is applied is called a drain, and a terminal to which a higher potential is applied is called a source. In this specification, for the sake of convenience, the connection relationship of a transistor is sometimes described assuming that the source and the drain are fixed; in reality, the names of the source and the drain interchange with each other according to the above relationship of the potentials.

In this specification, a source of a transistor means a source region that is part of a semiconductor film functioning as an active layer or a source electrode connected to the semiconductor film. Similarly, a drain of a transistor means a drain region that is part of the semiconductor film or a drain electrode connected to the semiconductor film. Moreover, a gate means a gate electrode.

In this specification, a state in which transistors are connected in series means, for example, a state in which only one of a source and a drain of a first transistor is connected to only one of a source and a drain of a second transistor. In addition, a state in which transistors are connected in parallel means a state in which one of a source and a drain of a first transistor is connected to one of a source and a drain of a second transistor and the other of the source and the drain of the first transistor is connected to the other of the source and the drain of the second transistor.

In this specification, connection means electrical connection and corresponds to a state in which a current, a voltage, or a potential can be supplied or transmitted. Accordingly, a state of being connected does not necessarily mean a state of being directly connected and also includes, in its category, a state of being indirectly connected through a circuit element such as a wiring, a resistor, a diode, or a transistor that allows a current, a voltage, or a potential to be supplied or transmitted.

In this specification, even when independent components are connected to each other in a circuit diagram, there is actually a case where one conductive film has functions of a plurality of components, such as a case where part of a wiring functions as an electrode, for example. Connection in this specification also includes such a case where one conductive film has functions of a plurality of components, in its category.

Furthermore, in this specification, one of a first electrode and a second electrode of a transistor refers to a source electrode and the other refers to a drain electrode.

Effect of the Invention

According to one embodiment of the present invention, a novel functional panel that is highly convenient, useful, or reliable can be provided. A novel display device that is highly convenient, useful, or reliable can be provided. A novel input/output device that is highly convenient, useful, or reliable can be provided. A novel data processing device that is highly convenient, useful, or reliable can be provided. A novel functional panel, a novel display device, a novel input/output device, a novel data processing device, or a novel semiconductor device can be provided.

Note that the descriptions of these effects do not preclude the existence of other effects. One embodiment of the present invention does not have to have all of these effects. Other effects are apparent from the descriptions of the specification, the drawings, the claims, and the like, and other effects can be derived from the descriptions of the specification, the drawings, the claims, and the like.

MODE FOR CARRYING OUT THE INVENTION

Figure 1A:
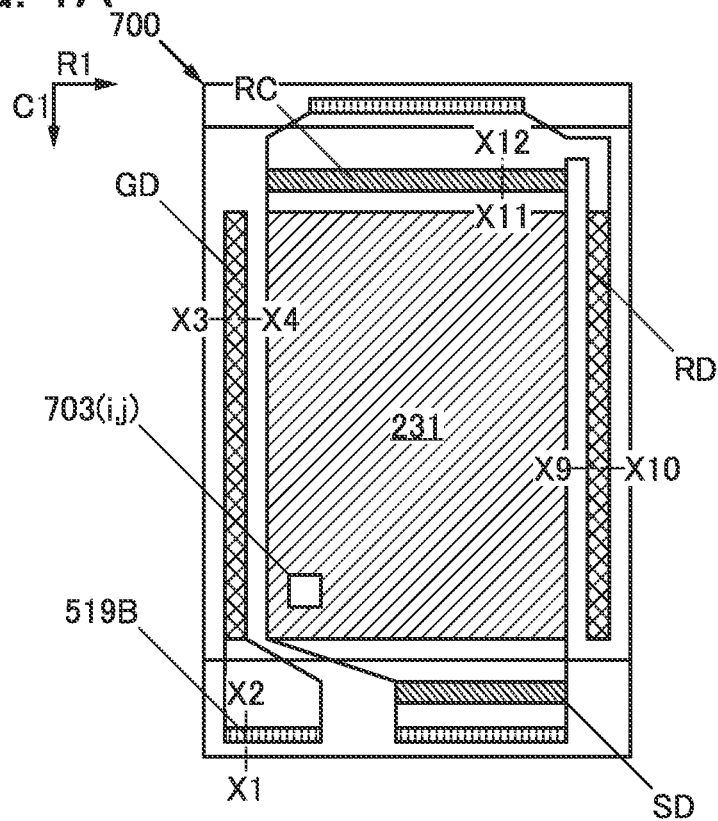
FIG. 1A and FIG. 1B are diagrams illustrating a structure of a functional panel of an embodiment.

A functional panel of one embodiment of the present invention includes a first driver circuit, a second driver circuit, and a pixel set.

The first driver circuit has a function of supplying a first selection signal and a second selection signal, a second driver circuit has a function of supplying an image signal and a control signal, and the control signal includes a first level and a second level.

The pixel set includes a first pixel, and the first pixel includes a first element and a first pixel circuit. The first pixel circuit is supplied with the first selection signal, the second selection signal, the image signal, and the control signal. The first pixel circuit has functions of obtaining the image signal on the basis of the first selection signal, obtaining the control signal on the basis of the second selection signal, and holding a first state to a third state. Note that the first level is held in the first state, the second level is held in the second state, and the image signal is held in the third state.

The first element is electrically connected to the first pixel circuit, the first element performs display with first brightness on the basis of the first state, the first element performs display with second brightness on the basis of the second state, and the first element performs display using the image signal on the basis of the third state. Note that the first brightness is darker than the second brightness.

Thus, the first pixel can be brought into a non-display state in the first state, for example. The first pixel can be used as a light in the second state. The first pixel can perform display using the image signal in the third state. In a period where the display of the first pixel is switched using the first selection signal and the image signal, the first pixel can be brought into a non-display state or can be used as a light using the second selection signal and the control signal. Thus, a novel functional panel that is highly convenient, useful, or reliable can be provided.

Embodiments are described in detail with reference to the drawings. Note that the present invention is not limited to the following description, and it will be readily appreciated by those skilled in the art that modes and details of the present invention can be modified in various ways without departing from the spirit and scope of the present invention. Thus, the present invention should not be construed as being limited to the description in the following embodiments. Note that in structures of the invention described below, the same portions or portions having similar functions are denoted by the same reference numerals in different drawings, and a description thereof is not repeated.

Embodiment 1

In this embodiment, structures of a functional panel of one embodiment of the present invention are described with reference to FIG. 1A to FIG. 6B.

Figure 1B:
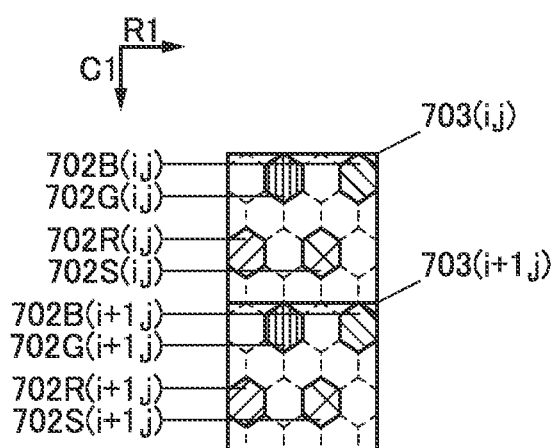

FIG. 1A and FIG. 1B illustrate a structure of the functional panel of one embodiment of the present invention. FIG. 1A is a top view illustrating the structure of the functional panel of one embodiment of the present invention, and FIG. 1B is a diagram illustrating part of FIG. 1A.

Figure 2A:
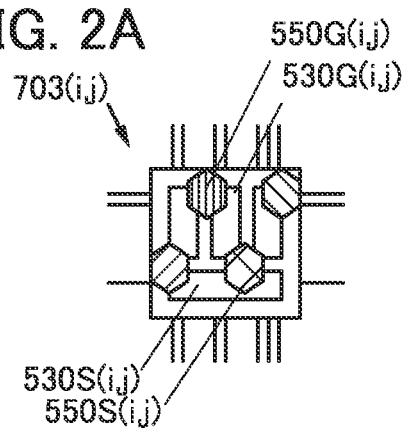
FIG. 2A to FIG. 2C are diagrams illustrating a structure of a functional panel of an embodiment.
Figure 2B:
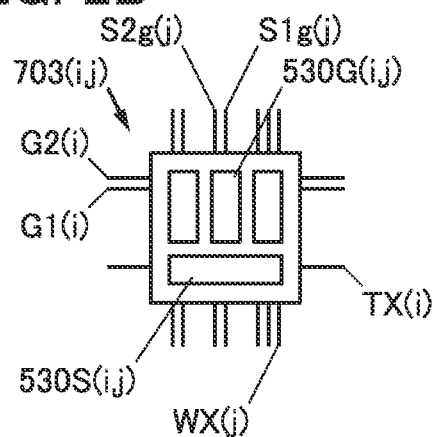
Figure 2C:
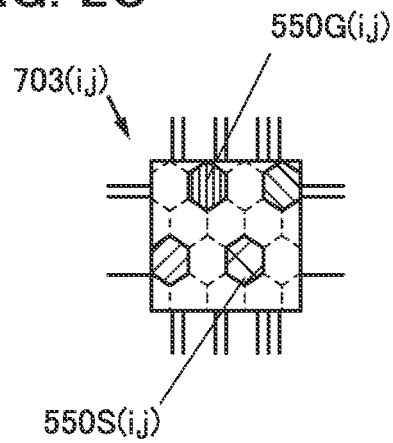

FIG. 2A, FIG. 2B and FIG. 2C illustrate a structure of a pixel set of the functional panel of one embodiment of the present invention. FIG. 2A is a diagram illustrating part of FIG. 1A, FIG. 2B is a diagram illustrating part of FIG. 2A, and FIG. 2C is a diagram illustrating another part of FIG. 2A.

Figure 3:
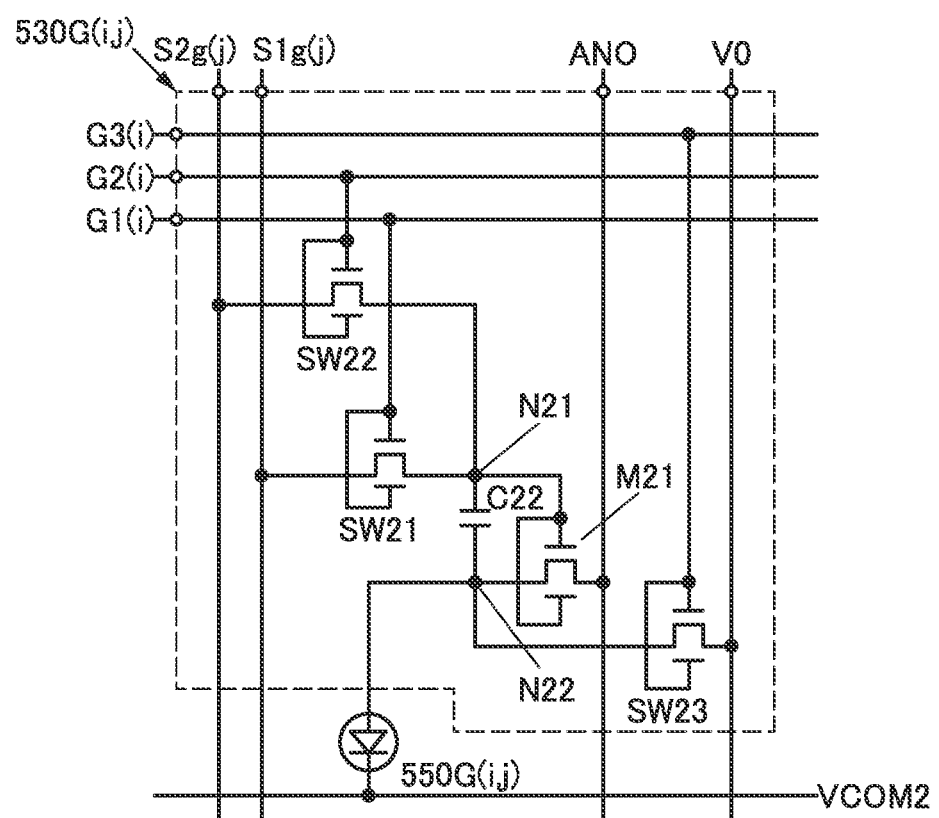
FIG. 3 is a circuit diagram illustrating a structure of a functional panel of an embodiment.

FIG. 3 is a diagram illustrating a structure of the functional panel of one embodiment of the present invention. FIG. 3 is a circuit diagram illustrating a structure of a pixel circuit.

Figure 4:
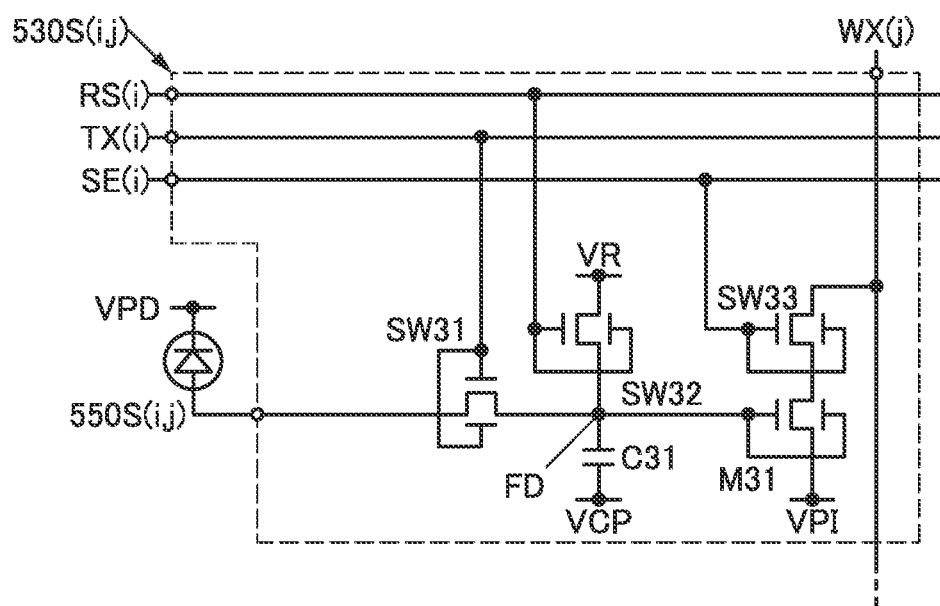
FIG. 4 is a circuit diagram illustrating a structure of a functional panel of an embodiment.

FIG. 4 is a diagram illustrating a structure of the functional panel of one embodiment of the present invention. FIG. 4 is a circuit diagram illustrating a structure of a pixel circuit.

Figure 5A:
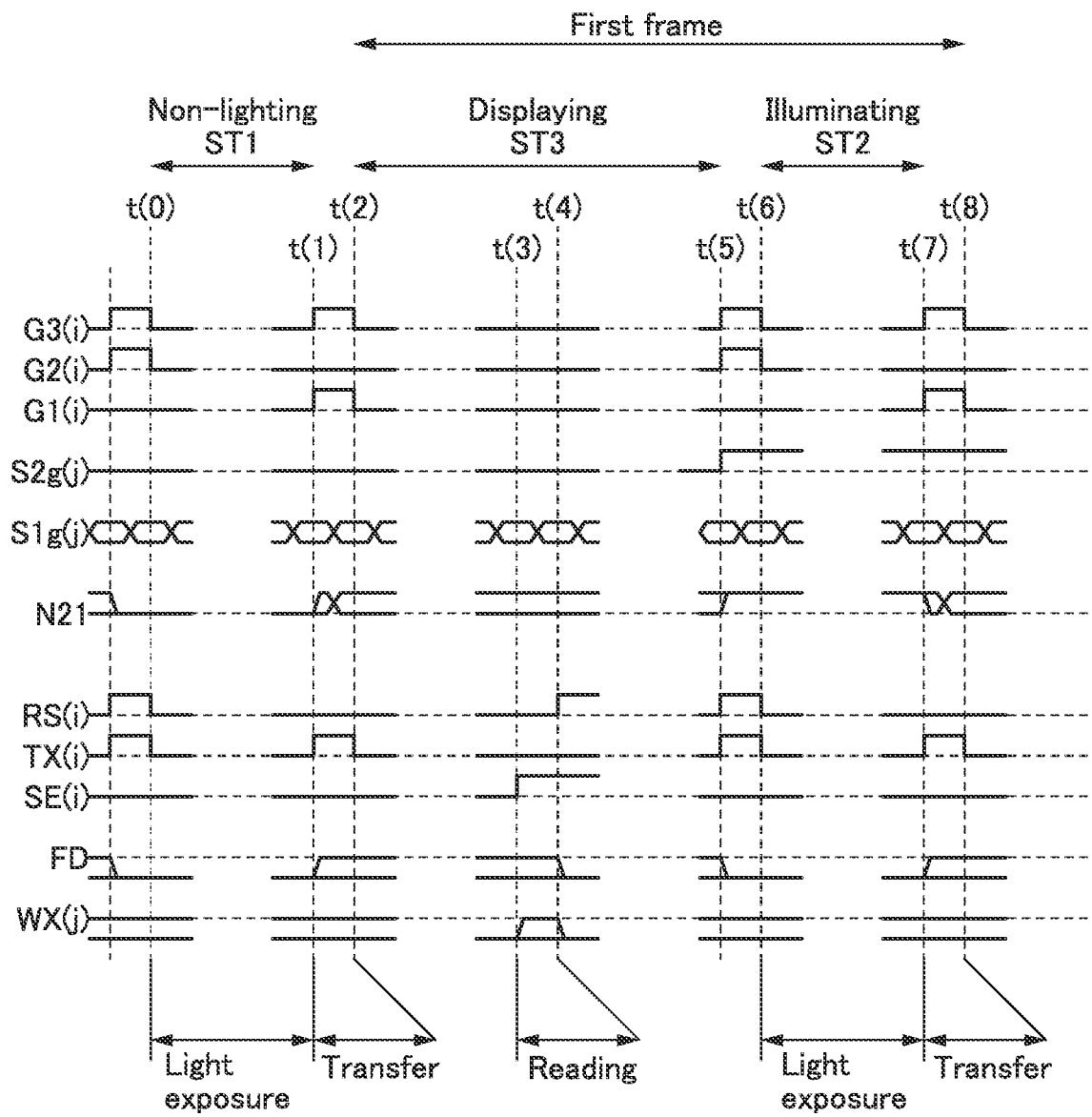
FIG. 5A and FIG. 5B are diagrams showing an operation of a functional panel of an embodiment.
Figure 5B:
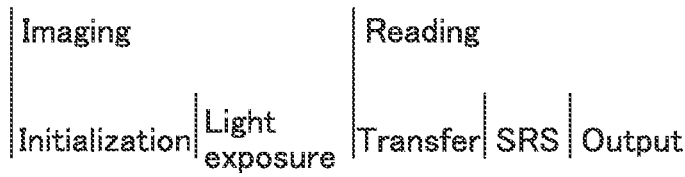

FIG. 5A and FIG. 5B are diagrams showing an operation of the functional panel of one embodiment of the present invention. FIG. 5A is a timing chart and FIG. 5B is a schematic view.

Figure 6A:
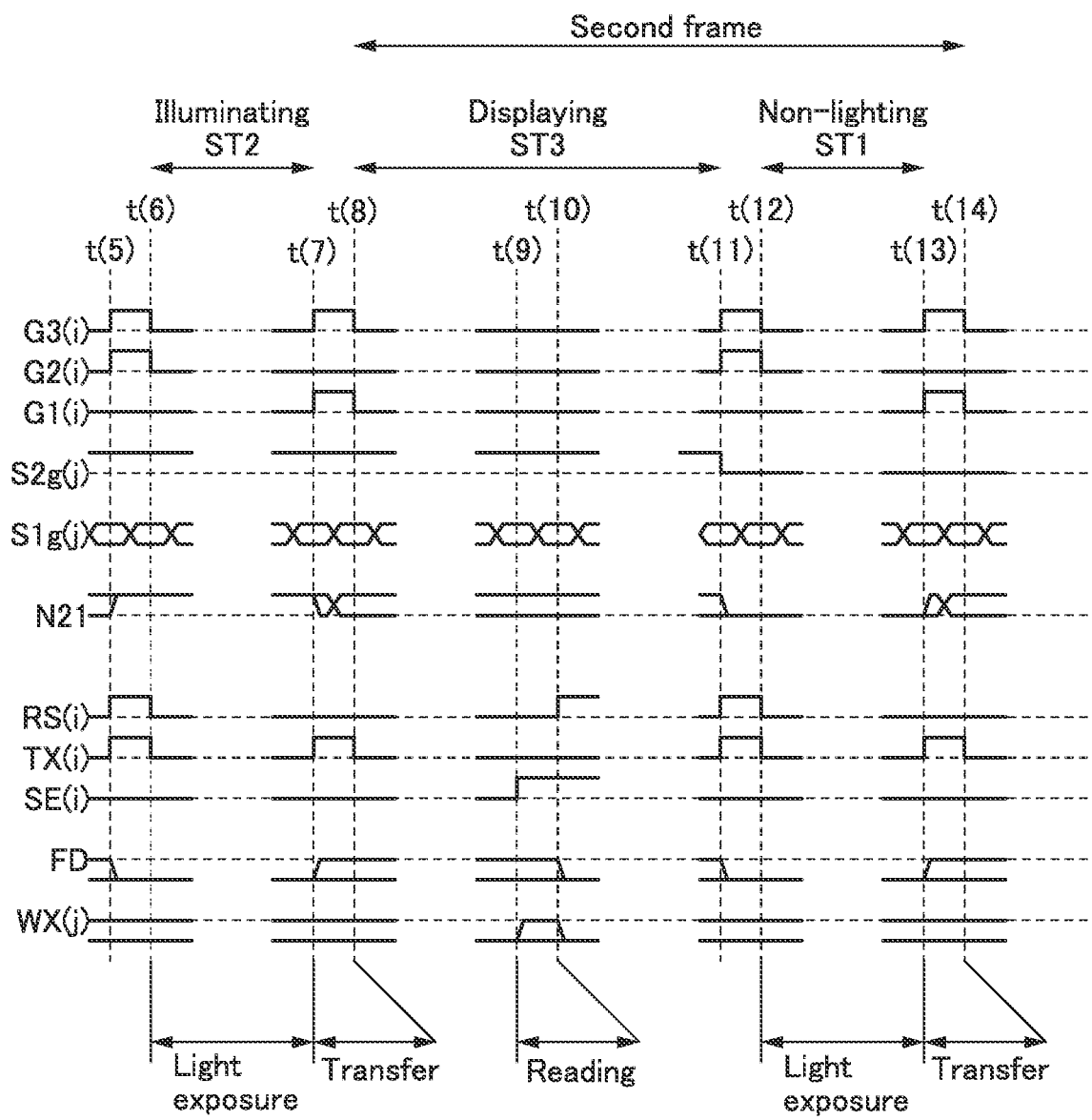
FIG. 6A and FIG. 6B are diagrams showing an operation of a functional panel of an embodiment.
Figure 6B:
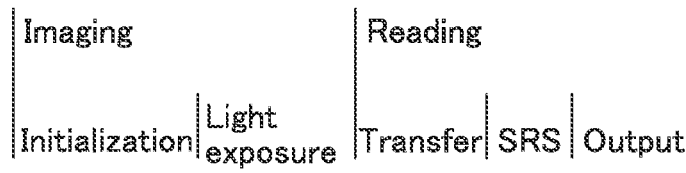

FIG. 6A and FIG. 6B are diagrams showing an operation of the functional panel of one embodiment of the present invention. FIG. 6A is a timing chart and FIG. 6B is a schematic view.

Figure 7A:
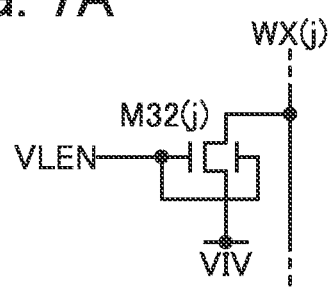
FIG. 7A and FIG. 7B are circuit diagrams illustrating a structure of a functional panel of an embodiment.
Figure 7B:
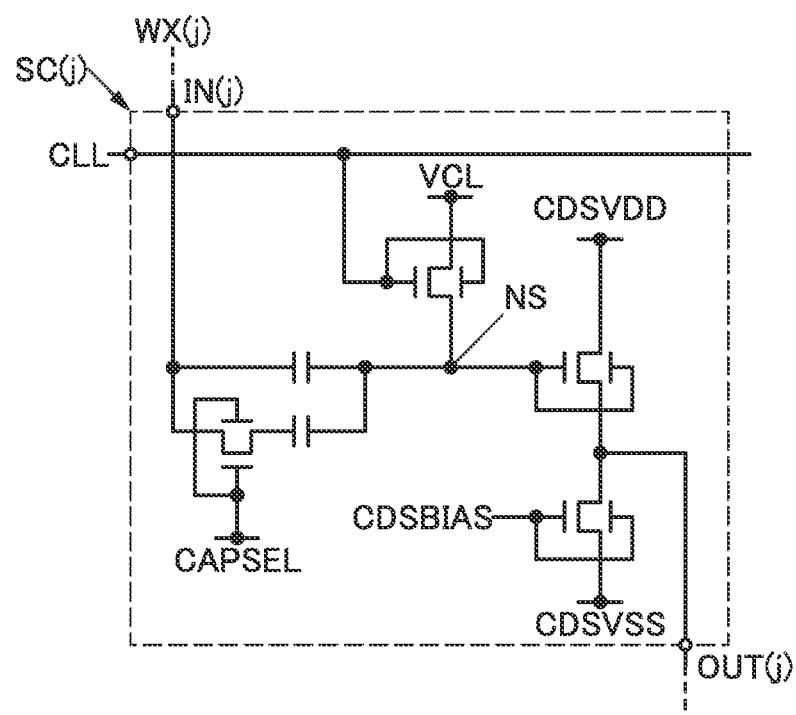

FIG. 7A and FIG. 7B illustrate a structure of the functional panel of one embodiment of the present invention. FIG. 7A is a circuit diagram illustrating part of an amplifier circuit that can be used in the functional panel of one embodiment of the present invention, and FIG. 7B is a circuit diagram of a sampling circuit that can be used in the functional panel of one embodiment of the present invention.

Note that in this specification, an integer variable of 1 or more is sometimes used in reference numerals. For example, (p) where p is an integer variable of 1 or more is sometimes used in part of a reference numeral that specifies any of p components at a maximum. As another example, (m,n) where m and n are each an integer variable of 1 or more is sometimes used in part of a reference numeral that specifies any of m×n components at a maximum.

Structure Example 1 of Functional Panel 700

The functional panel described in this embodiment includes a driver circuit GD, a driver circuit SD, and a pixel set $703(i,j)$ (see FIG. 1A).

Structure Example of Driver Circuit GD

The driver circuit GD has a function of supplying a first selection signal and a second selection signal (see FIG. 5A and FIG. 6A). For example, the driver circuit GD is electrically connected to a conductive film $G1(i)$ to supply the first selection signal, and is electrically connected to a conductive film $G2(i)$ to supply the second selection signal.

Structure Example of Driver Circuit SD

The driver circuit SD has a function of supplying an image signal and a control signal, and the control signal includes a first level and a second level. The driver circuit SD is electrically connected to a conductive film $S1g(j)$ to supply the image signal, and is electrically connected to a conductive film $S2g(j)$ to supply the control signal, for example.

Structure Example 1 of Pixel $703(i,j)$

The pixel set $703(i,j)$ includes a pixel $702G(i,j)$, and the pixel $702G(i,j)$ includes an element $550G(i,j)$ and a pixel circuit $530G(i,j)$ (see FIG. 1B and FIG. 2A).

Structure Example 1 of Pixel Circuit $530G(i,j)$

The pixel circuit $530G(i,j)$ is supplied with the first selection signal, the second selection signal, the image signal, and the control signal. The pixel circuit $530G(i,j)$ obtains the image signal on the basis of the first selection signal, and the pixel circuit $530G(i,j)$ obtains the control signal on the basis of the second selection signal (see FIG. 5A and FIG. 6A). Note that the operation of supplying the first selection signal and making the pixel circuit $530G(i,j)$ obtain the image signal can be referred to as "writing", for example.

The pixel circuit $530G(i,j)$ has a function of holding a first state ST1 to a third state ST3, the first level is held in the first state ST1, the second level is held in the second state ST2, and the image signal is held in the third state ST3. The holding period of the second state ST2 is preferably equal to the holding period of the first state ST1. This enables easy processing of a captured image. The holding period of the third state ST3 is preferably longer than the holding period of the first state ST1. This enables high-contrast display of image data.

Structure Example of Element $550G(i,j)$

The element $550G(i,j)$ is electrically connected to the pixel circuit $530G(i,j)$. Note that the element $550G(i,j)$ includes an electrode $551G(i,j)$ electrically connected to the pixel circuit $530G(i,j)$, and an electrode $552$ electrically connected to a conductive film VCOM2 (see FIG. 3 and FIG. 9A).

The element $550G(i,j)$ performs display with first brightness on the basis of the first state ST1, the element $550G(i,j)$ performs display with second brightness on the basis of the second state ST2, and the element $550G(i,j)$ performs display using the image signal on the basis of the third state ST3. Note that the first brightness is darker than the second brightness.

Thus, the pixel 702G(i,j) can be brought into a non-display state in the first state ST1, for example. The pixel 702G(i,j) can be used as a light in the second state ST2. The pixel 702G(i,j) can perform display using the image signal in the third state ST3. In a period where the display of the pixel 702G(i,j) is switched using the first selection signal and the image signal, the pixel 702G(i,j) can be brought into a non-display state or can be used as a light using the second selection signal and the control signal. The period where the pixel 702G(i,j) is brought into a non-display state or the period where the pixel 702G(i,j) is used as a light can be intervened in the period where display is performed using the image signal. Thus, a novel functional panel that is highly convenient, useful, or reliable can be provided.

Structure Example 2 of Functional Panel 700

The functional panel described in this embodiment includes a driver circuit RD (see FIG. 1A).

Structure Example of Driver Circuit RD

The driver circuit RD has a function of supplying a third selection signal to a fifth selection signal (see FIG. 5A and FIG. 6A). For example, the driver circuit RD is electrically connected to a conductive film RS(i) to supply the third selection signal, electrically connected to a conductive film TX(i) to supply the fourth selection signal, and electrically connected to a conductive film SE(i) to supply the fifth selection signal.

Structure Example 2 of Pixel 703(i,j)

The pixel set 703(i,j) includes a pixel 702S(i,j), and the pixel 702S(i,j) includes an element 550S(i,j) and a pixel circuit 530S(i,j) (see FIG. 1B and FIG. 2A).

Structure Example 1 of Element 550S(i,j)

The element 550S(i,j) is electrically connected to the pixel circuit 530S(i)), and the element 550S(i,j) has a function of generating an imaging signal (see FIG. 4).

Structure Example 1 of Pixel Circuit 530S(i,j)

The pixel circuit 530S(i,j) is supplied with the third selection signal to the fifth selection signal (see FIG. 5A and FIG. 6A).

For example, the conductive film RS(i) supplies the third selection signal, and the pixel circuit 530S(i,j) is initialized at a timing t(0) on the basis of the third selection signal (see FIG. 4 and FIG. 5A). The conductive film TX(i) supplies the fourth selection signal, and the pixel circuit 530S(i,j) obtains an imaging signal at a timing t(1) on the basis of the fourth selection signal. The conductive film SE(i) supplies the fifth selection signal, and the pixel circuit 530S(i,j) supplies the imaging signal at a timing t(3) on the basis of the fifth selection signal.

Structure Example 2 of Pixel Circuit 530G(i,j)

The pixel circuit 530G(i,j) holds the first state ST1 or the second state ST2 from the timing t(0) to the timing t(1), and the pixel circuit 530G(i,j) holds the third state ST3 at the timing t(3).

Note that the operation of supplying the fourth selection signal and making the pixel circuit 530S(i,j) obtain an imaging signal can be referred to as "imaging" (see FIG. 5A, FIG. 5B, and FIG. 6B). The operation of reading an imaging signal from the pixel circuit 530S(i,j) can be referred to as "reading". The operation of supplying a predetermined voltage to the element 550S(i,j) can be referred to as "initialization", the operation of exposing the initialized the element 550S(i,j) to light in a predetermined period as "light exposure", and the operation of reflecting a voltage that has been changed along with the light exposure on the pixel circuit 530S(i,j) as "transfer". Moreover, in the figure, SRS corresponds to the operation of supplying a reference signal used in a correlated double sampling method, and "output" corresponds to the operation of supplying an imaging signal.

For example, image data of one frame can be written in 16.7 ms. Specifically, the operation can be performed at a frame rate of 60 Hz. Note that an image signal can be written to the pixel circuit 530G(i,j) in 15.2 µs.

For example, image data of one frame can be held in a period corresponding to 16 frames. Imaging data of one frame can be imaged and read in a period corresponding to 16 frames.

Specifically, it is possible to perform the initialization in 15 µs, the light exposure in a period from 1 ms to 5 ms, and the transfer in 150 ms. Moreover, the reading can be performed in 250 ms.

Figure 10A:
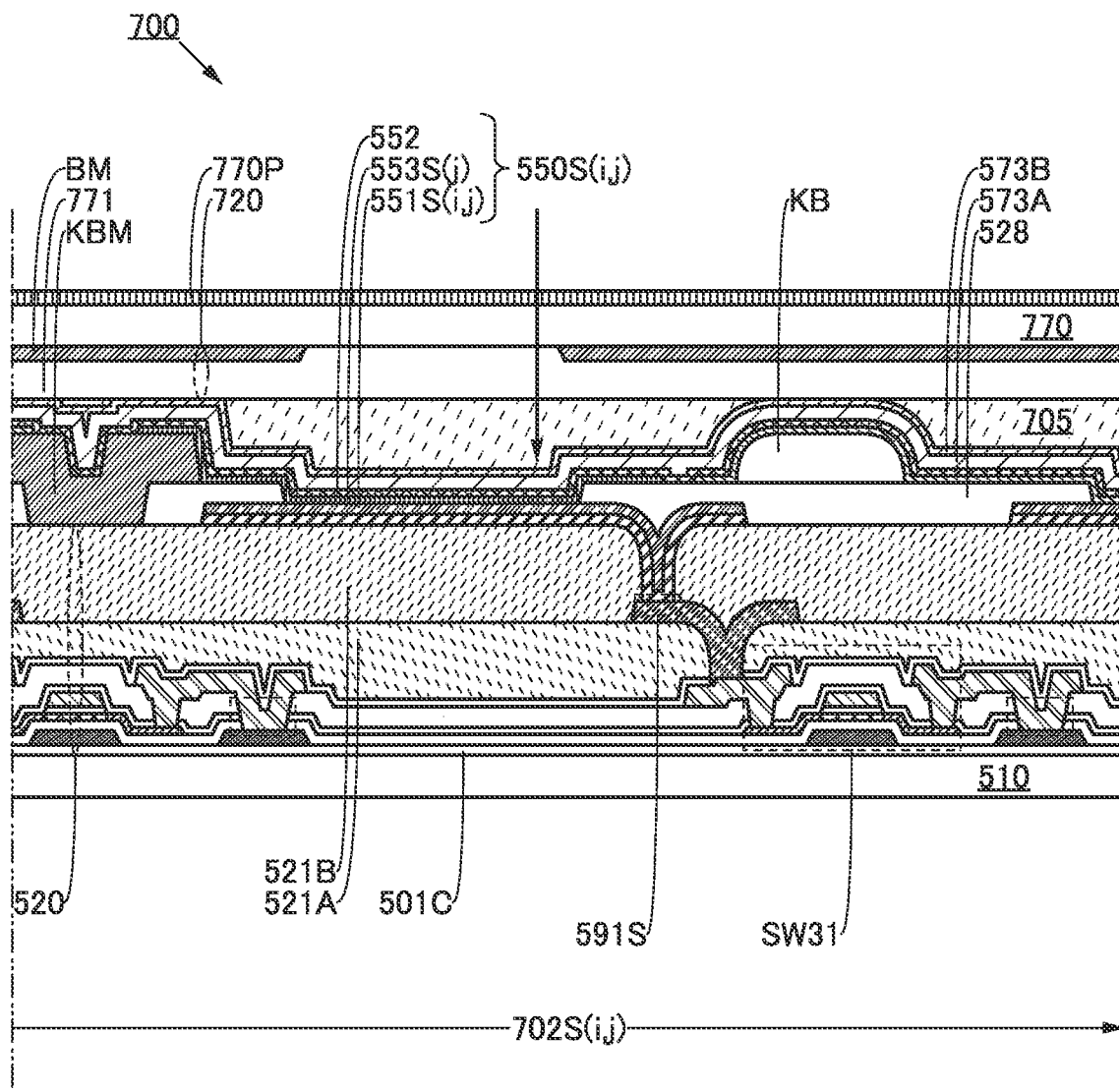
FIG. 10A and FIG. 10B are cross-sectional views illustrating a structure of a functional panel of an embodiment.

The element 550S(i,j) includes an electrode 551S(i,j) electrically connected to the pixel circuit 530S(i,j), and the electrode 552 electrically connected to a conductive film VPD (see FIG. 4 and FIG. 10A). The electrode 552 used in the element 550G(i,j) can be used in the element 550S(i,j). Thus, the structure and the manufacturing process of the functional panel can be simplified.

Thus, imaging can be performed using the second pixel circuit 530S(i,j) in a period where the first pixel circuit 530G(i,j) is in the first state ST1, for example. Alternatively, imaging can be performed using the second pixel circuit 530S(i,j) in a period where the first pixel circuit 530G(i,j) is in the second state ST2, for example. Alternatively, imaging can be performed using the second pixel 702S(i,j) in a period where the first pixel 702G(i,j) is in a non-display state, for example. Alternatively, a finger approaching the first pixel 702G(i,j) can be imaged using the second pixel 702S(i,j) with the use of the first pixel 702G(i,j) as a light, for example. Alternatively, imaging can be performed under different conditions using the second pixel 702S(i,j) in a period where image data displayed with the first pixel 702G(i,j) is switched. Alternatively, data imaged while the first pixel 702G(i,j) is in a non-display state can be subtracted from data imaged using the first pixel 702G(i,j) as a light. Background data can be subtracted from the imaging data. A finger or the like approaching the first pixel 702G(i,j) can be imaged clearly by subtracting the background data, for example. The pixel set 703(i,j) can be used as a proximity sensor. The functional panel 700 can be used for a display device. Thus, a novel functional panel that is highly convenient, useful, or reliable can be provided.

Structure Example 3 of Functional Panel 700

The functional panel described in this embodiment includes the conductive film G1(i), the conductive film G2(i), the conductive film S1g(j), the conductive film S2g(j), and a conductive film ANO (see FIG. 3). The functional panel also includes a conductive film G3(i).

The conductive film G1(i) is supplied with the first selection signal, the conductive film G2(i) is supplied with the second selection signal, the conductive film S1g(j) is supplied with the image signal, and the conductive film S2g(j) is supplied with the control signal (see FIG. 5A or FIG. 6A).

Structure Example 3 of Pixel Circuit 530G(i,j)

The pixel circuit 530G(i,j) includes a node N21, a transistor M21, a switch SW21, and a switch SW22 (see FIG. 3). The pixel circuit 530G(i,j) includes a node N22, a capacitor C22, and a switch SW23.

The transistor M21 includes a gate electrode electrically connected to the node N21, a first electrode electrically connected to the element 550G(i,j), and a second electrode electrically connected to the conductive film ANO.

The switch SW21 includes a first terminal electrically connected to the conductive film S1g(j) and a second terminal electrically connected to the node N21, and has a function of controlling the conduction state or the non-conduction state on the basis of a potential of the conductive film G1(i).

The switch SW22 includes a first terminal electrically connected to the conductive film S2g(j) and a second terminal electrically connected to the node N21, and has a function of controlling the conduction state or the non-conduction state on the basis of a potential of the conductive film G2(i).

The element 550G(i,j) has a function of changing brightness on the basis of a potential of the node N21.

Thus, the potential of the node N21 can be made close to a potential of the conductive film S1g(j) using the switch SW21. The potential of the node N21 can be made close to a potential of the conductive film S2g(j) using the switch SW22. The potential of the node N21 can be made close to the potential of the conductive film S2g(j) using the switch SW22 in a period where the switch SW21 is in a non-conduction state. The potential of the node N21 can be made close to the potential of the conductive film S1g(j) using the switch SW21 in a period where the switch SW22 is in a non-conduction state. The potential of the node N21 can be set to that in the first state ST1 or the second state ST2 using the switch SW22. The potential of the node N21 can be set to that in the third state ST3 using the switch SW21. Thus, a novel functional panel that is highly convenient, useful, or reliable can be provided.

Structure Example 4 of Functional Panel 700

The functional panel described in this embodiment includes the conductive film RS(i), the conductive film TX(i), a conductive film VR, a conductive film VCP, a conductive film VPI, a conductive film WX(j), and the conductive film SE(i) (see FIG. 4).

The conductive film RS(i) is supplied with the third selection signal, the conductive film TX(i) is supplied with the fourth selection signal, and the conductive film SE(i) is supplied with the fifth selection signal (see FIG. 5A and FIG. 6A).

Structure Example 2 of the Pixel Circuit 530S(i,j)

The pixel circuit 530S(i,j) includes a switch SW31, a switch SW32, a switch SW33, a transistor M31, a capacitor C31, and a node FD.

The switch SW31 includes a first terminal electrically connected to the element 550S(i,j) and a second terminal electrically connected to the node FD, and has a function of controlling the conduction state or the non-conduction state on the basis of a potential of the conductive film TX(i).

The switch SW32 includes a first terminal electrically connected to the node FD and a second terminal electrically connected to the conductive film VR, and has a function of controlling the conduction state or the non-conduction state on the basis of a potential of the conductive film RS(i).

The capacitor C31 includes a conductive film electrically connected to the node FD and a conductive film electrically connected to the conductive film VCP.

The transistor M31 includes a gate electrode electrically connected to the node FD and a first electrode electrically connected to the conductive film VPI.

The switch SW33 includes a first terminal electrically connected to a second electrode of the transistor M31 and a second terminal electrically connected to a conductive film WX(j), and has a function of controlling the conduction state or the non-conduction state on the basis of a potential of the conductive film SEW.

Thus, an imaging signal generated by the element 550S can be transferred to the node FD using the switch SW31. The imaging signal generated by the element 550S(i,j) can be stored in the node FD using the switch SW31. Electrical continuity between the pixel circuit 530S and the element 550S can be broken by the switch SW31. A correlated double sampling method can be employed. Noise included in the imaging signal can be reduced. Thus, a novel functional panel that is highly convenient, useful, or reliable can be provided.

Structure Example 5 of Functional Panel 700

The functional panel described in this embodiment includes a reading circuit RC(j), a conductive film VLEN, a conductive film VIV, and a conductive film CLL (see FIG. 1A, FIG. 7A, FIG. 7B, and FIG. 12). The functional panel of one embodiment of the present invention includes a conductive film CAPSEL, a conductive film CDSBIAS, a conductive film CDSVDD, a conductive film CDSVSS, and a conductive film VCL.

Structure Example of Reading Circuit RC(j)

The reading circuit RC(j) includes an amplifier circuit and a sampling circuit SC(j).

Structure Example of Amplifier Circuit

The amplifier circuit includes a transistor M32(j), and the transistor M32(j) includes a gate electrode electrically connected to the conductive film VLEN, a first electrode electrically connected to the conductive film WX(j), and a second electrode electrically connected to the conductive film VIV (see FIG. 7A).

Note that the conductive film WX(j) connects the transistor M31 and the transistor M32(j) when the switch SW33 is in a conduction state (see FIG. 4 and FIG. 7A). Thus, a source follower circuit can be configured with the transistor M31 and the transistor M32(j). A potential of the conductive film WX(j) can be changed on the basis of a potential of the node FD.

The sampling circuit SC(j) includes a first terminal IN(j), a second terminal, and a third terminal OUT(j) (see FIG. 7B). A node NS is also included.

The first terminal IN(j) is electrically connected to the conductive film WX(j), the second terminal is electrically connected to the conductive film CLL, and the third terminal OUT(j) has a function of supplying a signal that changes on the basis of a potential of the first terminal IN(j).

Thus, an imaging signal can be obtained from the pixel circuit 530S(i,j). A correlated double sampling method can be employed, for example. The sampling circuit SC(j) can be provided for each conductive film WX(j). A differential signal of the pixel circuit 530S(i,j) can be obtained by the corresponding conductive film WX(j). The operating frequency of the sampling circuit SC(j) can be low. Noise can be reduced. Thus, a novel functional panel that is highly convenient, useful, or reliable can be provided.

Structure Example 3 of Pixel 703(i,j)

A plurality of pixels can be used in the pixel 703(0. For example, a plurality of pixels capable of displaying colors with different hues can be used. Note that the plurality of pixels can be referred to as subpixels. A set of subpixels can be referred to as a pixel.

This enables additive mixture or subtractive mixture of colors displayed by the plurality of pixels. It is possible to display a color of a hue that an individual pixel cannot display.

Specifically, a pixel 702B(i,j) displaying blue, the pixel 702G(i,j) displaying green, and a pixel 702R(i,j) displaying red can be used in the pixel 703(0. The pixel 702B(i,j), the pixel 702G(i,j), and the pixel 702R(i,j) can each be referred to as a subpixel (see FIG. 1B).

A pixel displaying white or the like can be used in addition to the above set in the pixel 703(i,j), for example. A pixel displaying cyan, a pixel displaying magenta, and a pixel displaying yellow can be used in the pixel 703(0.

A pixel emitting infrared rays can be used in addition to the above set in the pixel 703(i,j), for example. Specifically, a pixel that emits light including light with a wavelength of greater than or equal to 650 nm and less than or equal to 1000 nm can be used in the pixel 703(i,j).

Structure Example 6 of Functional Panel 700

Another structure of the pixel circuit 530G(i,j) of the functional panel described in this embodiment is described with reference to FIG. 27, FIG. 28A, FIG. 28B, FIG. 29A, and FIG. 29B. The difference from the pixel circuit 530G(i,j) described with reference to FIG. 3, FIG. 5A, FIG. 5B, FIG. 6A, and FIG. 6B is that a capacitor C21 is included. Different portions are described in detail here, and the above description is referred to for portions that can use similar structures.

Structure Example 4 of Pixel Circuit 530G(i,j)

Figure 27:
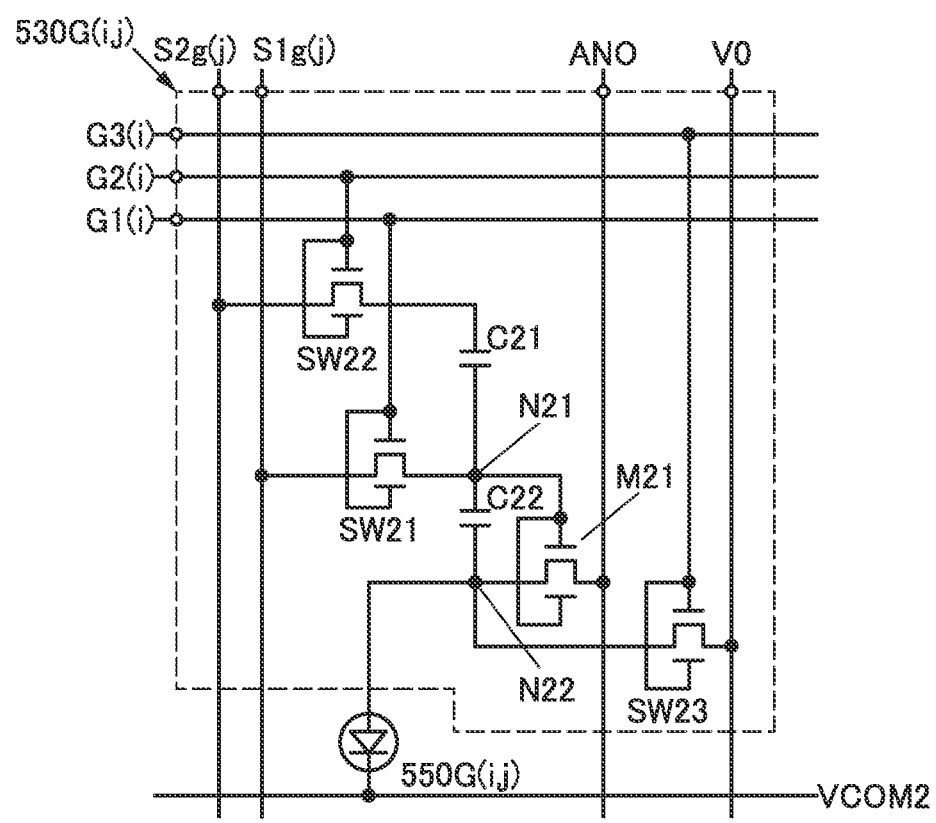
FIG. 27 is a circuit diagram illustrating a structure of a functional panel of an embodiment.
Figure 28A:
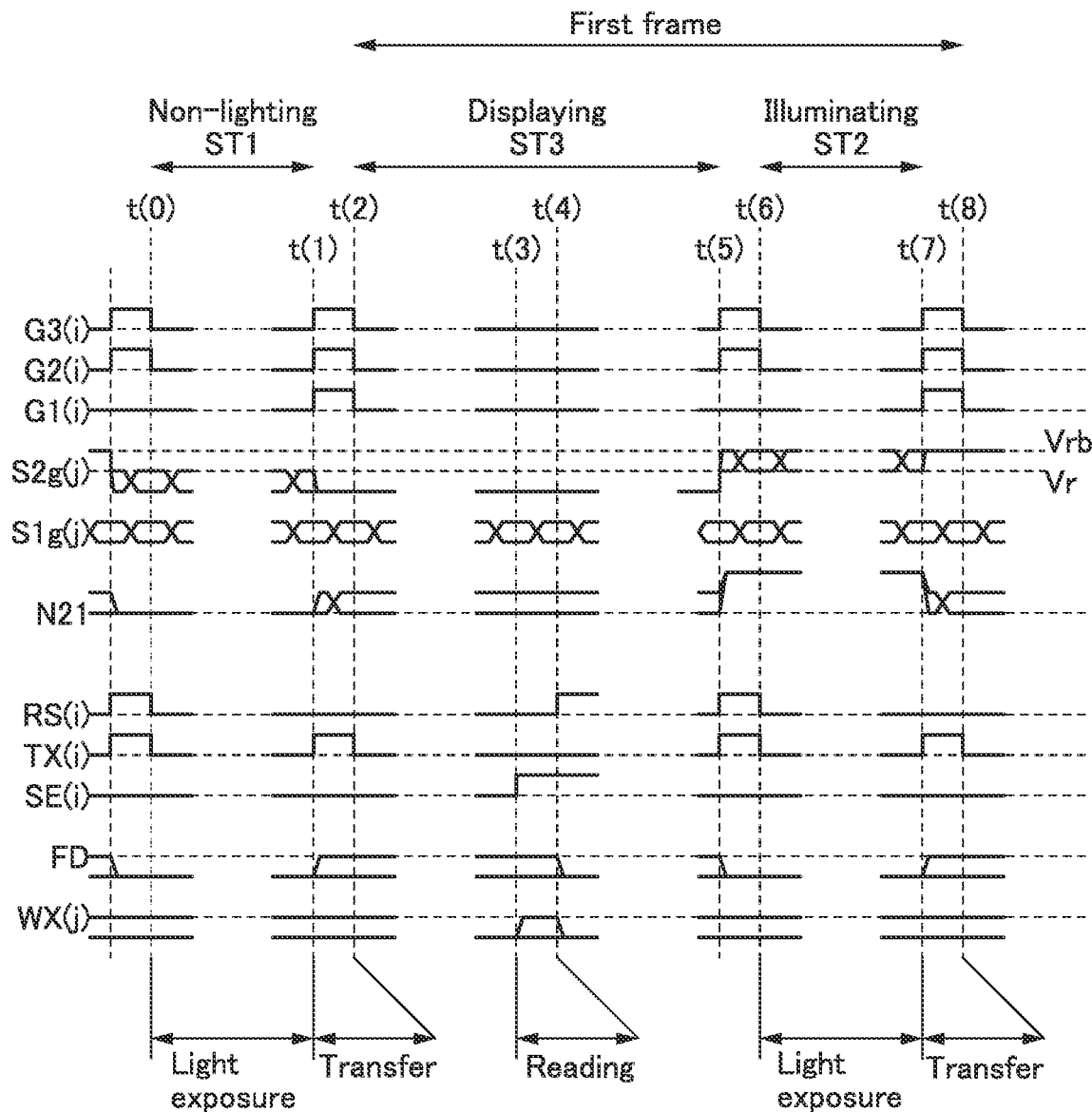
FIG. 28A and FIG. 28B are diagrams showing an operation of a functional panel of an embodiment.
Figure 28B:
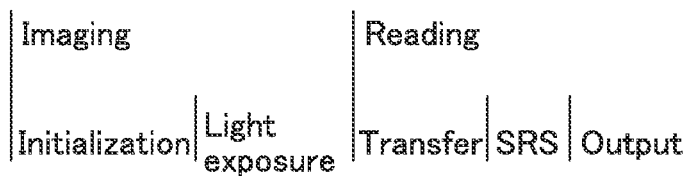
Figure 29A:
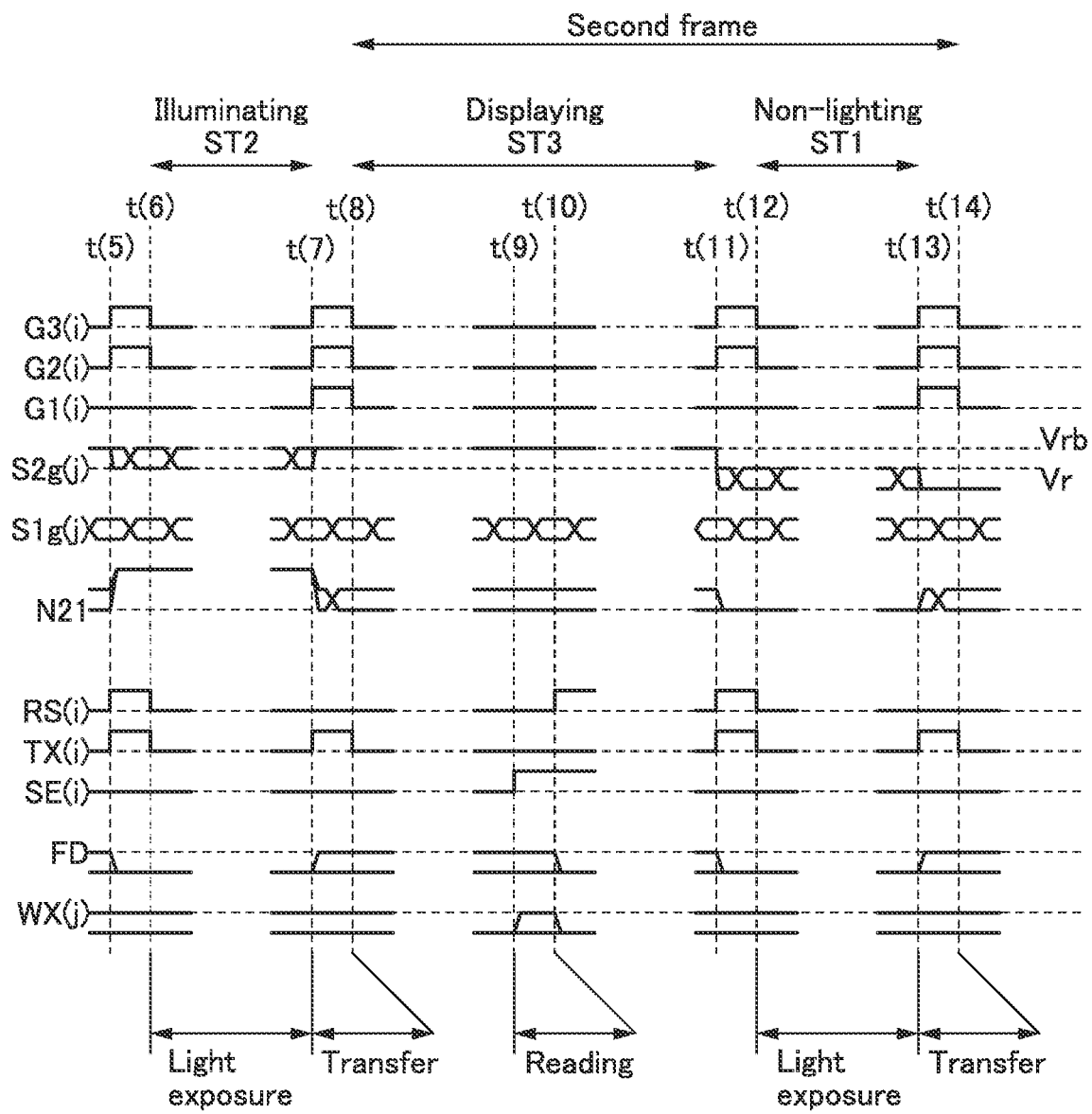
FIG. 29A and FIG. 29B are diagrams showing an operation of a functional panel of an embodiment.
Figure 29B:
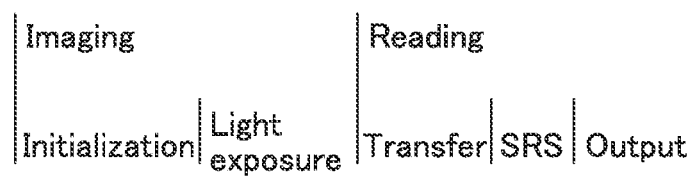

The pixel circuit 530G(i,j) includes the node N21, the transistor M21, the switch SW21, the switch SW22, and the capacitor C21 (see FIG. 27). In addition, the pixel circuit 530G(i,j) includes the node N22, the capacitor C22, and the switch SW23.

The transistor M21 includes the gate electrode electrically connected to the node N21, the first electrode electrically connected to the element 550G(i,j), and the second electrode electrically connected to the conductive film ANO.

The switch SW21 includes the first terminal electrically connected to the conductive film S1g(j) and the second terminal electrically connected to the node N21, and has a function of controlling the conduction state or the non-conduction state on the basis of the potential of the conductive film G1(i).

The capacitor C21 includes a first electrode electrically connected to the node N21.

The switch SW22 includes the first terminal electrically connected to the conductive film S2g(j) and the second terminal electrically connected to a second electrode of the capacitor C21, and has a function of controlling the conduction state or the non-conduction state on the basis of the potential of the conductive film G2(i).

The node N21 holds a first voltage in the first state ST1, the first node N21 holds a second voltage in the second state ST2, and the first node N21 holds an image signal in the third state ST3.

Note that the driver circuit SD supplies a control signal including the first level and the second level, the first level changes the node N21 from the third state ST3 to the first state ST1, and the second level changes the node N21 from the third state ST3 to the second state ST2.

For example, in order that the driver circuit SD changes the node N21 from the third state ST3 to the first state ST1 through the capacitor C21, there is a need to determine the first level in consideration of not only the potential of the node N21 in the first state ST1 but also the voltage held by the capacitor C21 in the third state ST3, and to supply the first level. Similarly, in order that the driver circuit SD changes the node N21 from the third state ST3 to the second state ST2 through the capacitor C21, there is a need to determine the second level in consideration of not only the potential of the node N21 in the second state ST2 but also the voltage held by the capacitor C21 in the third state ST3, and to supply the second level.

Specifically, a voltage (Vr−Vdata) obtained by subtracting a voltage Vdata that has been held by the capacitor C21 in the third state ST3 from a predetermined voltage Vr can be used as the first level. A voltage (Vrb−Vdata) obtained by subtracting the voltage Vdata that has been held by the capacitor C21 in the third state ST3 from a predetermined voltage Vrb can be used as the second level. Note that the voltage Vrb can be used as the second level, and a voltage (Vrb+Vdata) obtained by adding the voltage Vdata that has been held in the third state ST3 to the voltage Vrb can be used in the second state ST2.

Note that the element 550G(i,j) has a function of changing brightness on the basis of the potential of the node N21.

Thus, the pixel 702G(i,j) can be brought into a non-display state in the first state ST1, for example. The pixel 702G(i,j) can be used as a light in the second state ST2, for example. The pixel 702G(i,j) can perform display using the image signal in the third state ST3, for example. In a period where the display of the pixel 702G(i,j) is switched using the first selection signal and the image signal, the pixel 702G(i,j) can be brought into a non-display state or can be used as a light using the second selection signal and control signal. A high voltage can be supplied to the gate electrode of the transistor M21 in the second state ST2. A large amount of current can be supplied to the element 550G(i,j) in the second state ST2. Thus, a novel functional panel that is highly convenient, useful, or reliable can be provided.

Note that this embodiment can be combined with any of the other embodiments in this specification as appropriate.

Embodiment 2

In this embodiment, structures of a functional panel of one embodiment of the present invention are described with reference to FIG. 8 to FIG. 11B.

Figure 8:
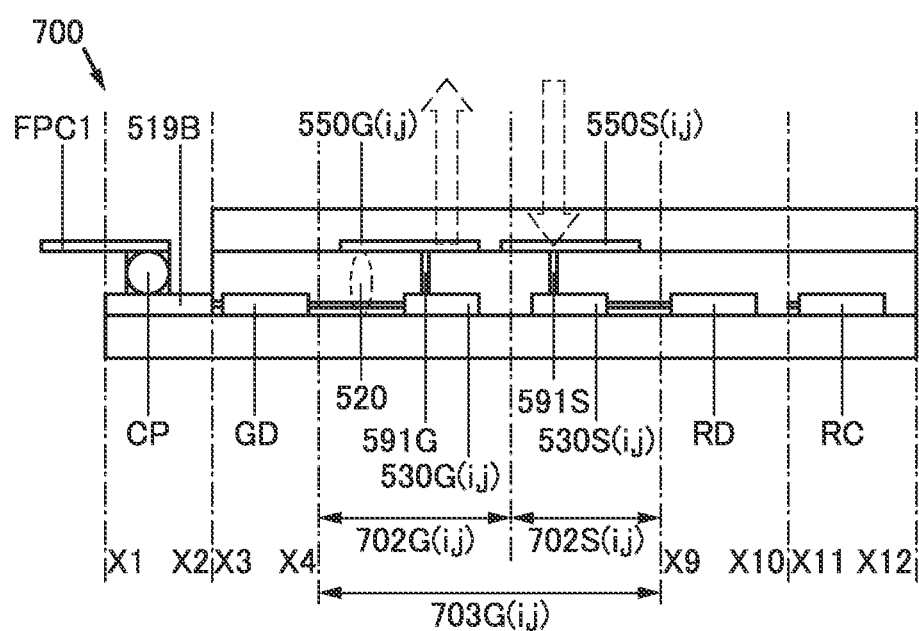
FIG. 8 is a cross-sectional view illustrating a structure of a functional panel of an embodiment.

FIG. 8 is a diagram illustrating the structure of the functional panel of one embodiment of the present invention. FIG. 8 is a cross-sectional view taken along cutting lines X1-X2, X3-X4, X9-X10, and X11-X12 in FIG. 1A and in the pixel set 703(i,j).

Figure 9A:
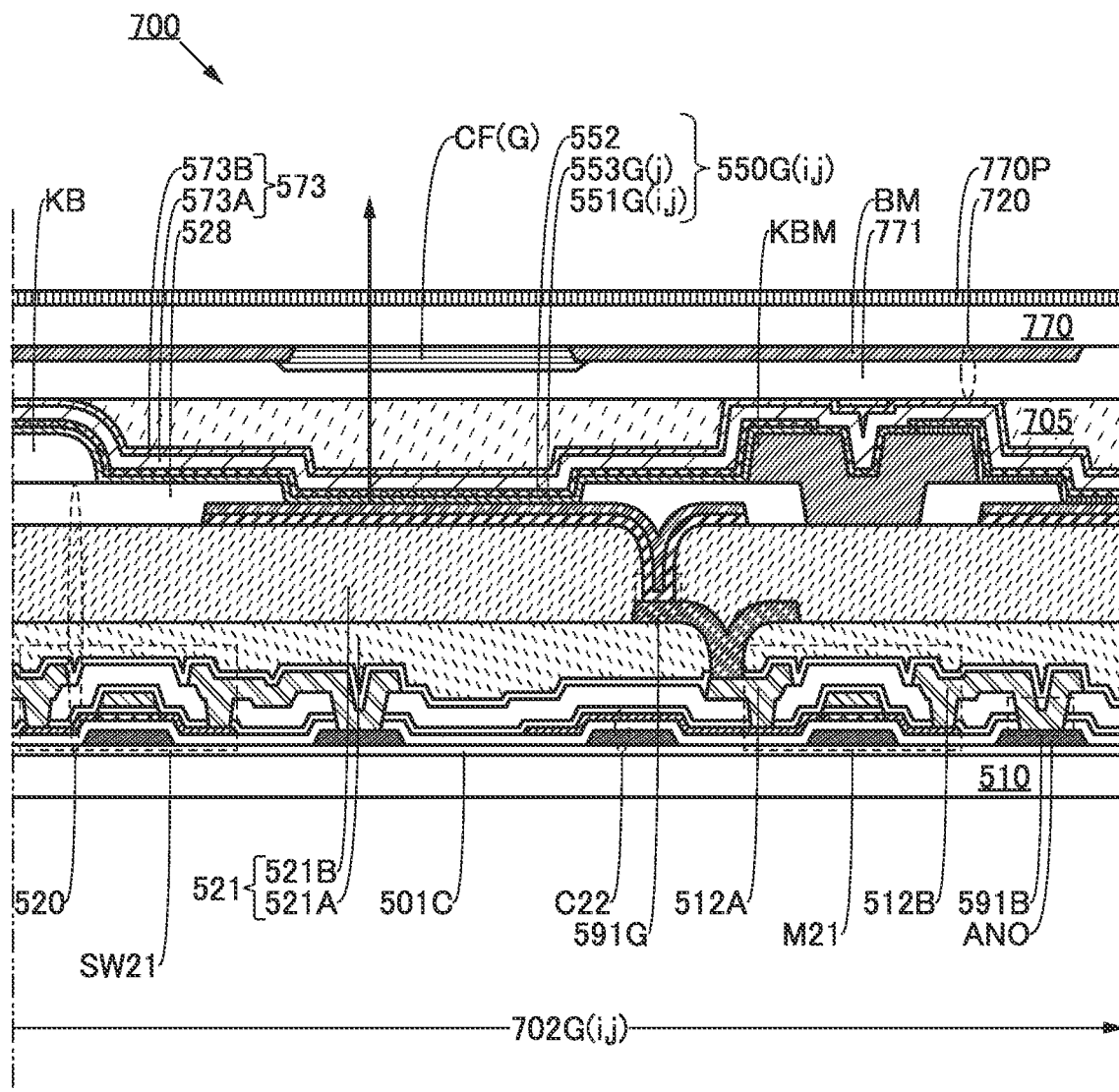
FIG. 9A and FIG. 9B are cross-sectional views illustrating a structure of a functional panel of an embodiment.
Figure 9B:
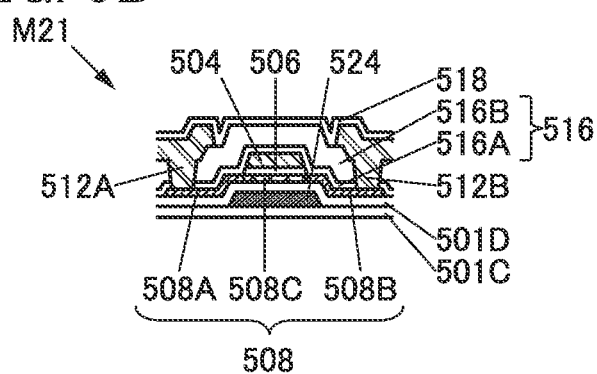

FIGS. 9A and 9B illustrate the structure of the functional panel of one embodiment of the present invention. FIG. 9A is a cross-sectional view of the pixel 702G(i,j) illustrated in FIG. 1B. FIG. 9B is a cross-sectional view illustrating part of FIG. 9A.

Figure 10B:
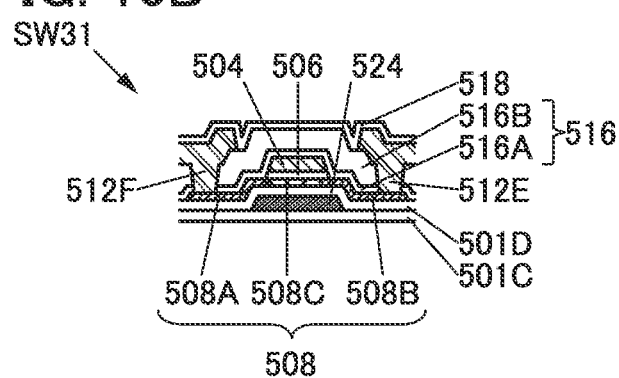

FIGS. 10A and 10B illustrate the structure of the functional panel of one embodiment of the present invention. FIG. 10A is a cross-sectional view of the pixel 702S(i,j) illustrated in FIG. 1B. FIG. 10B is a cross-sectional view illustrating part of FIG. 10A.

Figure 11A:
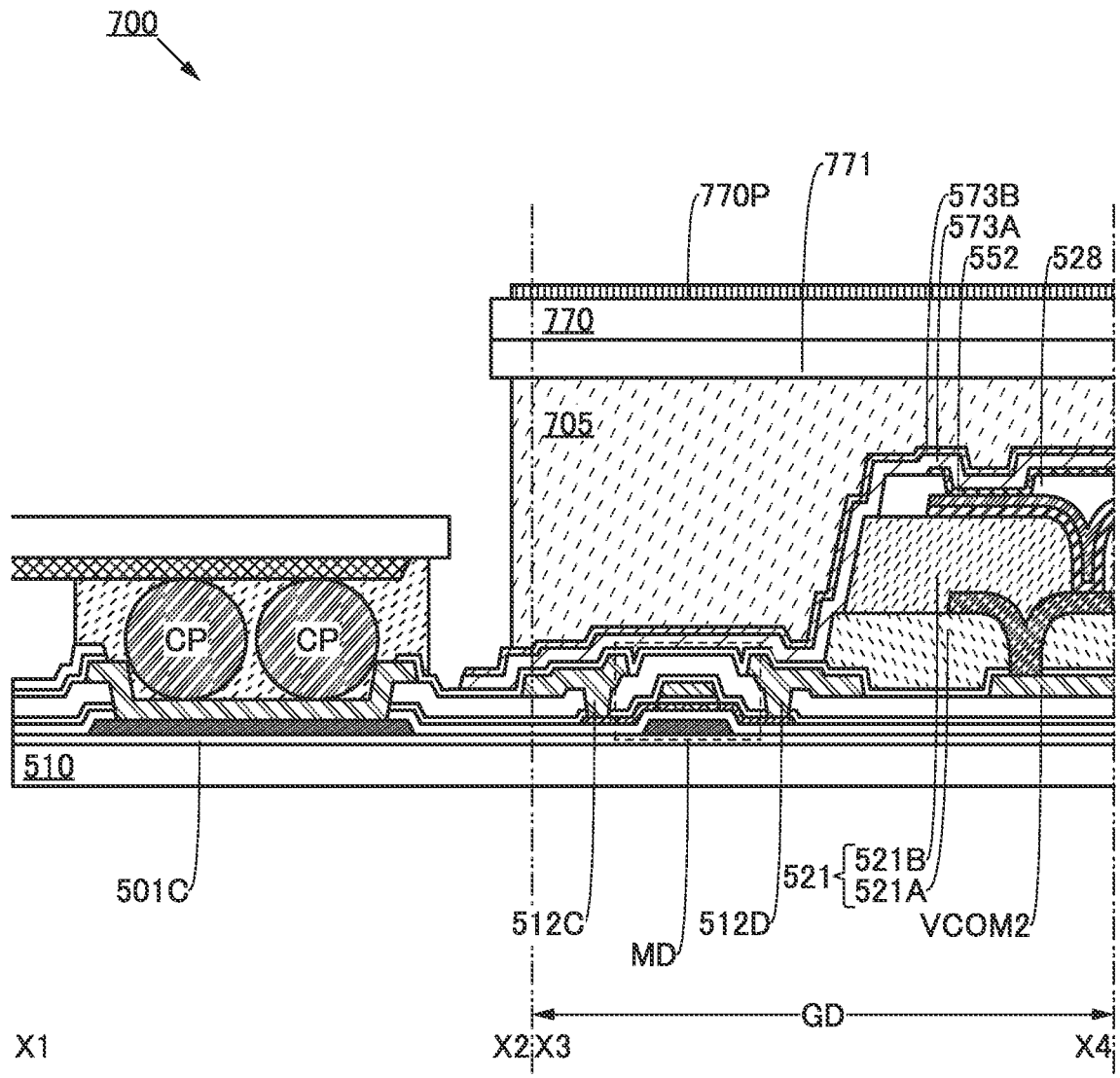
FIG. 11A and FIG. 11B are cross-sectional views illustrating a structure of a functional panel of an embodiment.
Figure 11B:
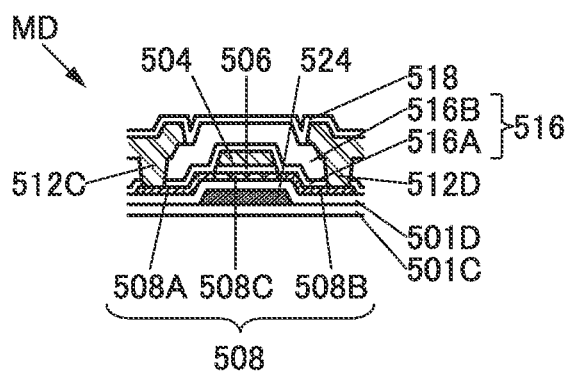

FIGS. 11A and 11B illustrate the structure of the functional panel of one embodiment of the present invention. FIG. 11A is a cross-sectional view taken along the cutting line X1-X2 and the cutting line X3-X4 in FIG. 1A, and FIG. 11B is a diagram illustrating part of FIG. 11A.

Structure Example 1 of Functional Panel 700

The functional panel described in this embodiment includes a functional layer 520 (see FIG. 8).

Structure Example 1 of Functional Layer 520

The functional layer 520 includes the pixel circuit 530G (i,j) (see FIG. 8). The functional layer 520 includes, for example, the transistor M21 used in the pixel circuit 530G (i,j) (see FIG. 3 and FIG. 9A).

The functional layer 520 has an opening portion 591G. The pixel circuit 530G(i,j) is electrically connected to the element 550G(i,j) through the opening portion 591G (see FIG. 8 and FIG. 9A).

Structure Example 2 of Functional Layer 520

The functional layer 520 includes the pixel circuit 530S (i,j) (see FIG. 8). The functional layer 520 includes, for example, the transistor used as the switch SW31 in the pixel circuit 530S(i,j) (see FIG. 8 and FIG. 10A).

The functional layer 520 has an opening portion 591S, and the pixel circuit 530S(i,j) is electrically connected to the element 550S(i,j) through the opening portion 591S (see FIG. 8 and FIG. 10A).

Thus, the pixel circuit 530G(i,j) can be formed in the functional layer 520. The pixel circuit 530S(i,j) can be formed in the functional layer 520. A semiconductor film used in the pixel circuit 530S(i,j) can be formed in a step of forming a semiconductor film used in the pixel circuit 530G(i,j), for example. The manufacturing process can be simplified. Thus, a novel functional panel that is highly convenient, useful, or reliable can be provided.

Structure Example 3 of Functional Layer 520

The functional layer 520 includes a driver circuit GD (see FIG. 1A and FIG. 8). The functional layer 520 includes, for example, a transistor MD used in the driver circuit GD (see FIG. 8 and FIG. 11A).

The functional layer 520 includes a driver circuit RD and a reading circuit RC (see FIG. 8).

Thus, the semiconductor film used in the driver circuit GD can be formed in the step of forming the semiconductor film used in the pixel circuit 530G(i,j), for example. Semiconductor films used in the driver circuit RD and the reading circuit RC can be formed in the step of forming the semiconductor film used in the pixel circuit 530G(i,j), for example. The manufacturing process of the functional panel can be simplified. Thus, a novel functional panel that is highly convenient, useful, or reliable can be provided.

Structure Example of Transistor

A bottom-gate transistor, a top-gate transistor, or the like can be used in the functional layer 520. Specifically, a transistor can be used as a switch.

The transistor includes a semiconductor film 508, a conductive film 504, a conductive film 512A, and a conductive film 512B (see FIG. 9B).

The semiconductor film 508 includes a region 508A electrically connected to the conductive film 512A and a region 508B electrically connected to the conductive film 512B. The semiconductor film 508 includes a region 508C between the region 508A and the region 508B.

The conductive film 504 includes a region overlapping with the region 508C, and the conductive film 504 has a function of a gate electrode.

An insulating film 506 includes a region interposed between the semiconductor film 508 and the conductive film 504. The insulating film 506 has a function of a gate insulating film.

The conductive film 512A has one of a function of a source electrode and a function of a drain electrode, and the conductive film 512B has the other of the function of the source electrode and the function of the drain electrode.

A conductive film 524 can be used for the transistor. The semiconductor film 508 is interposed between a region of the conductive film 524 and the conductive film 504. The conductive film 524 has a function of a second gate electrode.

Note that the semiconductor film used in the transistor of the driver circuit can be formed in the step of forming the semiconductor film used in the transistor of the pixel circuit.

Structure Example 1 of Semiconductor Film 508

A semiconductor containing a Group 14 element can be used for the semiconductor film 508, for example. Specifically, a semiconductor containing silicon can be used for the semiconductor film 508.

[Hydrogenated Amorphous Silicon]

For example, hydrogenated amorphous silicon can be used for the semiconductor film 508. Alternatively, microcrystalline silicon or the like can be used for the semiconductor film 508. Thus, a functional panel having less display unevenness than a functional panel using polysilicon for the semiconductor film 508, for example, can be provided. The size of the functional panel can be easily increased.

[Polysilicon]

For example, polysilicon can be used for the semiconductor film 508. In this case, the field-effect mobility of the transistor can be higher than that of a transistor using hydrogenated amorphous silicon for the semiconductor film 508, for example. The driving capability can be higher than that of a transistor using hydrogenated amorphous silicon for the semiconductor film 508, for example. The aperture ratio of the pixel can be higher than that in the case of using a transistor that uses hydrogenated amorphous silicon for the semiconductor film 508, for example.

The reliability of the transistor can be higher than that of a transistor using hydrogenated amorphous silicon for the semiconductor film 508, for example.

The temperature required for manufacture of the transistor can be lower than that required for a transistor using single crystal silicon, for example.

The semiconductor film used in the transistor of the driver circuit can be formed in the same step as the semiconductor film used in the transistor of the pixel circuit. The driver circuit can be formed over the same substrate where the pixel circuit is formed. The number of components included in an electronic device can be reduced.

[Single Crystal Silicon]

For example, single crystal silicon can be used for the semiconductor film 508. In this case, a functional panel can have higher resolution than a functional panel using hydrogenated amorphous silicon for the semiconductor film 508, for example. A functional panel having less display unevenness than a functional panel using polysilicon for the semiconductor film 508, for example, can be provided. Smart glasses or a head-mounted display can be provided, for example.

Structure Example 2 of Semiconductor Film 508

For example, a metal oxide can be used for the semiconductor film 508. In this case, the pixel circuit can hold an image signal for a longer time than a pixel circuit utilizing a transistor using amorphous silicon for a semiconductor film. Specifically, a selection signal can be supplied at a frequency of lower than 30 Hz, preferably lower than 1 Hz, further preferably less than once per minute with the suppressed occurrence of flickers. Consequently, fatigue accumulation in a user of a data processing device can be reduced. Moreover, power consumption for driving can be reduced.

The pixel circuit can hold the imaging signal for a longer time than a pixel circuit utilizing a transistor using amorphous silicon for a semiconductor film. Specifically, a selection signal can be supplied at a frequency lower than 30 Hz, preferably lower than 1 Hz, further preferably less than once per minute. Accordingly, an image can be taken by a global shutter method. An image of a moving object can be taken while distortion is inhibited.

A transistor using an oxide semiconductor can be used, for example. Specifically, an oxide semiconductor containing indium, an oxide semiconductor containing indium, gallium, and zinc, an oxide semiconductor containing indium, gallium, zinc, and tin can be used for the semiconductor film.

A transistor having a lower leakage current in an off state than a transistor using amorphous silicon for a semiconductor film can be used, for example. Specifically, a transistor using an oxide semiconductor for a semiconductor film can be used as a switch or the like. In that case, a potential of a floating node can be held for a longer time than in a circuit in which a transistor using amorphous silicon is used as a switch.

A 25-nm-thick film containing indium, gallium, and zinc can be used as the semiconductor film 508, for example.

A conductive film in which a 10-nm-thick film containing tantalum and nitrogen and a 300-nm-thick film containing copper are stacked can be used as the conductive film 504, for example. Note that the film containing tantalum and nitrogen is interposed between a region of the film containing copper and the insulating film 506.

A stacked film in which a 400-nm-thick film containing silicon and nitrogen and a 200-nm-thick film containing silicon, oxygen, and nitrogen are stacked can be used as the insulating film 506, for example. Note that the film containing silicon, oxygen, and nitrogen is interposed between a region of the film containing silicon and nitrogen and the semiconductor film 508.

A conductive film in which a 50-nm-thick film containing tungsten, a 400-nm-thick film containing aluminum, and a 100-nm-thick film containing titanium are stacked in this order can be used as the conductive film 512A or the conductive film 512B, for example. Note that the film containing tungsten includes a region in contact with the semiconductor film 508.

A manufacturing line for a bottom-gate transistor using amorphous silicon for a semiconductor can be easily remodeled into a manufacturing line for a bottom-gate transistor using an oxide semiconductor for a semiconductor, for example. Furthermore, a manufacturing line for a top-gate transistor using polysilicon for a semiconductor can be easily remodeled into a manufacturing line for a top-gate transistor using an oxide semiconductor for a semiconductor, for example. In either remodeling, an existing manufacturing line can be effectively utilized.

Accordingly, flickering of a display can be inhibited. Power consumption can be reduced. A moving image with quick movements can be smoothly displayed. A photograph and the like can be displayed with a wide range of grayscale. Thus, a novel functional panel that is highly convenient, useful, or reliable can be provided.

Structure Example 3 of Semiconductor Film 508

For example, a compound semiconductor can be used for the semiconductor of the transistor. Specifically, a semiconductor containing gallium arsenide can be used.

For example, an organic semiconductor can be used for the semiconductor of the transistor. Specifically, an organic semiconductor containing any of polyacenes or graphene can be used for the semiconductor film.

Structure Example of Capacitor

A capacitor includes one conductive film, a different conductive film, and an insulating film. The insulating film includes a region interposed between the one conductive film and the different conductive film.

For example, a conductive film used as the source electrode or the drain electrode of the transistor, a conductive film used as the gate electrode, and an insulating film used as the gate insulating film can be used for the capacitor.

Structure Example 2 of Functional Layer 520

The functional layer 520 includes an insulating film 521, an insulating film 518, an insulating film 516, the insulating film 506, an insulating film 501C, and the like (see FIG. 9A and FIG. 9B).

The insulating film 521 includes a region interposed between the pixel circuit 530G(i,j) and the element 550G(i, j).

The insulating film 518 includes a region interposed between the insulating film 521 and the insulating film 501C.

The insulating film 516 includes a region interposed between the insulating film 518 and the insulating film 501C.

The insulating film 506 includes a region interposed between the insulating film 516 and the insulating film 501C.

[Insulating Film 521]

An insulating inorganic material, an insulating organic material, or an insulating composite material containing an inorganic material and an organic material, for example, can be used for the insulating film 521.

Specifically, an inorganic oxide film, an inorganic nitride film, an inorganic oxynitride film, or the like, or a stacked-layer material in which a plurality of films selected from these films are stacked can be used as the insulating film 521.

For example, a film including a silicon oxide film, a silicon nitride film, a silicon oxynitride film, an aluminum oxide film, or the like, or a film including a stacked-layer material in which a plurality of films selected from these films are stacked can be used as the insulating film 521. Note that the silicon nitride film is a dense film and has an excellent function of inhibiting diffusion of impurities.

For example, for the insulating film 521, polyester, polyolefin, polyamide, polyimide, polycarbonate, polysiloxane, an acrylic resin, or the like, or a stacked-layer material, a composite material, or the like of a plurality of resins selected from these resins can be used. Note that polyimide is excellent in thermal stability, insulating property, toughness, low dielectric constant, low coefficient of thermal expansion, chemical resistance, and other properties compared with other organic materials. Accordingly, in particular, polyimide can be suitably used for the insulating film 521 or the like.

The insulating film 521 may be formed using a photosensitive material. Specifically, a film formed using photosensitive polyimide, a photosensitive acrylic resin, or the like can be used as the insulating film 521.

Thus, the insulating film 521 can eliminate a level difference due to various components overlapping with the insulating film 521, for example.

[Insulating Film 518]

The material that can be used for the insulating film 521, for example, can be used for the insulating film 518.

For example, a material having a function of inhibiting diffusion of oxygen, hydrogen, water, an alkali metal, an alkaline earth metal, and the like can be used for the insulating film 518. Specifically, a nitride insulating film can be used as the insulating film 518. For example, silicon nitride, silicon nitride oxide, aluminum nitride, aluminum nitride oxide, or the like can be used for the insulating film 518. Thus, diffusion of impurities into the semiconductor film of the transistor can be inhibited.

[Insulating Film 516]

The material that can be used for the insulating film 521, for example, can be used for the insulating film 516.

Specifically, a film formed by a manufacturing method different from that of the insulating film 518 can be used as the insulating film 516.

[Insulating Film 506]

The material that can be used for the insulating film 521, for example, can be used for the insulating film 506.

Specifically, a film including a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, or a neodymium oxide film can be used as the insulating film 506.

[Insulating Film 501D]

An insulating film 501D includes a region interposed between the insulating film 501C and the insulating film 516.

The material that can be used for the insulating film 506, for example, can be used for the insulating film 501D.

[Insulating Film 501C]

The material that can be used for the insulating film 521, for example, can be used for the insulating film 501C. Specifically, a material containing silicon and oxygen can be used for the insulating film 501C. Thus, diffusion of impurities into the pixel circuit, the first element, the second element, or the like can be inhibited.

Structure Example 3 of Functional Layer 520

The functional layer 520 includes a conductive film, a wiring, and a terminal. A material having conductivity can be used for the wiring, an electrode, the terminal, the conductive film, and the like.

[Wiring and the Like]

For example, an inorganic conductive material, an organic conductive material, a metal, a conductive ceramic, or the like can be used for the wiring and the like.

Specifically, a metal element selected from aluminum, gold, platinum, silver, copper, chromium, tantalum, titanium, molybdenum, tungsten, nickel, iron, cobalt, palladium, and manganese, or the like can be used for the wiring and the like. Alternatively, an alloy containing the above-described metal element, or the like can be used for the wiring and the like. In particular, an alloy of copper and manganese is suitable for microfabrication using a wet etching method.

Specifically, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure of a titanium film, an aluminum film stacked over the titanium film, and a titanium film further formed thereover, or the like can be used for the wiring and the like.

Specifically, a conductive oxide such as indium oxide, indium tin oxide, indium zinc oxide, zinc oxide, or zinc oxide to which gallium is added can be used for the wiring and the like.

Specifically, a film containing graphene or graphite can be used for the wiring and the like.

For example, a film containing graphene oxide is formed and the film containing graphene oxide is reduced, so that a film containing graphene can be formed. As a reducing method, a method with application of heat, a method using a reducing agent, or the like can be given.

For example, a film including a metal nanowire can be used for the wiring and the like. Specifically, a nanowire containing silver can be used.

Specifically, a conductive polymer can be used for the wiring and the like.

Note that a terminal 519B can be electrically connected to a flexible printed circuit FPC1 using a conductive material, for example (see FIG. 8). Specifically, the terminal 519B can be electrically connected to the flexible printed circuit FPC1 using a conductive material CP.

Structure Example 7 of Functional Panel 700

The functional panel 700 includes a base material 510, a base material 770, and the sealant 705 (see FIG. 9A). In addition, the functional panel 700 includes a structure body KB.

<<Base Material 510 and Base Material 770>>

A material having a light-transmitting property can be used for the base material 510 or the base material 770.

For example, a flexible material can be used for the base material 510 or the base material 770. Thus, a flexible functional panel can be provided.

For example, a material with a thickness less than or equal to 0.7 mm and greater than or equal to 0.1 mm can be used. Specifically, a material polished to a thickness of approximately 0.1 mm can be used. Thus, the weight can be reduced.

A glass substrate of the 6th generation (1500 mm×1850 mm), the 7th generation (1870 mm×2200 mm), the 8th generation (2200 mm×2400 mm), the 9th generation (2400 mm×2800 mm), the 10th generation (2950 mm×3400 mm), or the like can be used as the base material 510 or the base material 770. Thus, a large-sized display device can be manufactured.

For the base material 510 or the base material 770, an organic material, an inorganic material, a composite material of an organic material and an inorganic material, or the like can be used.

For example, an inorganic material such as glass, ceramic, or a metal can be used. Specifically, non-alkali glass, soda-lime glass, potash glass, crystal glass, aluminosilicate glass, tempered glass, chemically tempered glass, quartz, sapphire, or the like can be used for the base material 510 or the base material 770. Aluminosilicate glass, tempered glass, chemically tempered glass, sapphire, or the like can be suitably used for the base material 510 or the base material 770 that is provided on the side close to a user of the functional panel. Thus, the functional panel can be prevented from being broken or damaged by the use thereof.

Specifically, an inorganic oxide film, an inorganic nitride film, an inorganic oxynitride film, or the like can be used. For example, a silicon oxide film, a silicon nitride film, a silicon oxynitride film, an aluminum oxide film, or the like can be used. Stainless steel, aluminum, or the like can be used for the base material 510 or the base material 770.

For example, a single crystal semiconductor substrate or a polycrystalline semiconductor substrate of silicon or silicon carbide, a compound semiconductor substrate of silicon germanium or the like, an SOI substrate, or the like can be used as the base material 510 or the base material 770. Thus, a semiconductor element can be formed on the base material 510 or the base material 770.

For example, an organic material such as a resin, a resin film, or plastic can be used for the base material 510 or the base material 770. Specifically, a material containing polyester, polyolefin, polyamide (e.g., nylon or aramid), polyimide, polycarbonate, polyurethane, an acrylic resin, an epoxy resin, or a resin having a siloxane bond, such as silicone, can be used for the base material 510 or the base material 770. For example, a resin film, a resin plate, a stacked-layer material, or the like containing any of these materials can be used. Thus, the weight can be reduced. The frequency of occurrence of breakage or the like due to dropping can be reduced, for example.

Specifically, polyethylene terephthalate (PET), polyethylene naphthalate (PEN), polyethersulfone (PES), a cycloolefin polymer (COP), a cycloolefin copolymer (COC), or the like can be used for the base material 510 or the base material 770.

For example, a composite material formed by attaching a metal plate, a thin glass plate, or a film of an inorganic material or the like and a resin film or the like to each other can be used for the base material 510 or the base material 770. For example, a composite material formed by dispersing a fibrous or particulate metal, glass, an inorganic material, or the like into a resin can be used for the base material 510 or the base material 770. For example, a composite material formed by dispersing a fibrous or particulate resin, an organic material, or the like into an inorganic material can be used for the base material 510 or the base material 770.

Furthermore, a single-layer material or a material in which a plurality of layers are stacked can be used for the base material 510 or the base material 770. For example, a material in which insulating films and the like are stacked can be used. Specifically, a material in which one or a plurality of films selected from a silicon oxide layer, a silicon nitride layer, a silicon oxynitride layer, and the like are stacked can be used. Thus, diffusion of impurities contained in the base materials can be prevented, for example. Diffusion of impurities contained in glass or a resin can be prevented. Diffusion of impurities that pass through a resin can be prevented.

Furthermore, paper, wood, or the like can be used for the base material 510 or the base material 770.

For example, a material having heat resistance high enough to withstand heat treatment in the manufacturing process can be used for the base material 510 or the base material 770. Specifically, a material having heat resistance to heat applied in the formation process of directly forming the transistor, the capacitor, or the like can be used for the base material 510 or the base material 770.

For example, a method in which an insulating film, a transistor, a capacitor, or the like is formed on a process substrate having heat resistance to heat applied in the manufacturing process, and the formed insulating film, transistor, capacitor, or the like is transferred to the base material 510 or the base material 770 can be used. Accordingly, an insulating film, a transistor, a capacitor, or the like can be formed on a flexible substrate, for example.

<<Sealant 705>>

The sealant 705 includes a region interposed between the functional layer 520 and the base material 770 and has a function of bonding the functional layer 520 and the base material 770 together (see FIG. 9A).

An inorganic material, an organic material, a composite material of an inorganic material and an organic material, or the like can be used for the sealant 705.

For example, an organic material such as a thermally fusible resin or a curable resin can be used for the sealant 705.

For example, an organic material such as a reactive curable adhesive, a photocurable adhesive, a thermosetting adhesive, and/or an anaerobic adhesive can be used for the sealant 705.

Specifically, an adhesive containing an epoxy resin, an acrylic resin, a silicone resin, a phenol resin, a polyimide resin, an imide resin, a PVC (polyvinyl chloride) resin, a PVB (polyvinyl butyral) resin, an EVA (ethylene vinyl acetate) resin, or the like can be used for the sealant 705.

<<Structure Body KB>>

The structure body KB includes a region interposed between the functional layer 520 and the base material 770. The structure body KB has a function of providing a predetermined space between the functional layer 520 and the base material 770.

Note that this embodiment can be combined with any of the other embodiments in this specification as appropriate.

Embodiment 3

In this embodiment, structures of a functional panel of one embodiment of the present invention are described with reference to FIG. 9A to FIG. 11B.

Structure Example 1 of Functional Panel 700

The functional panel 700 includes the element 550G(i,j) (see FIG. 9A).

Structure Example 2 of Element 550G(i,j)

The electrode 551G(i,j), the electrode 552, and the layer 553G(j) containing a light-emitting material can be used in the element 550G(i,j). The layer 553G(j) containing a light-emitting material includes a region interposed between the electrode 551G(i,j) and the electrode 552.

Structure Example 1 of Layer 553G(j) Containing Light-Emitting Material

A stacked-layer material can be used for the layer 553G(j) containing a light-emitting material, for example.

For example, a material emitting blue light, a material emitting green light, a material emitting red light, a material emitting infrared rays, or a material emitting ultraviolet rays can be used for the layer 553G(j) containing a light-emitting material.

Structure Example 2 of Layer 553G(j) Containing Light-Emitting Material

A stacked-layer material stacked to emit white light can be used for the layer 553G(j) containing a light-emitting material, for example.

Specifically, a plurality of materials emitting light with different hues can be used for the layer 553G(j) containing a light-emitting material.

For example, a stacked-layer material in which a layer containing a light-emitting material containing a fluorescent material that emits blue light and a layer containing materials that are other than fluorescent materials and emit green light and red light are stacked can be used for the layer 553G(j) containing a light-emitting material. A stacked-layer material in which a layer containing a light-emitting material containing a fluorescent material that emits blue light and a layer containing a material that is other than a fluorescent material and emits yellow light are stacked can be used for the layer 553G(j) containing a light-emitting material.

Note that the layer 553G(j) containing a light-emitting material can be used with a coloring film CF(G) overlapping, for example. Thus, light of a predetermined hue can be extracted from white light.

Structure Example 3 of Layer 553G(j) Containing Light-Emitting Material

A stacked-layer material stacked to emit blue light or ultraviolet rays can be used for the layer 553G(j) containing a light-emitting material, for example. Although not illustrated in the drawings, a color conversion layer can be used to overlap with the layer 553G(j) containing a light-emitting material, for example.

Structure Example 4 of Layer 553G(j) Containing Light-Emitting Material

The layer 553G(j) containing a light-emitting material includes a light-emitting unit. The light-emitting unit includes one region where electrons injected from one side are recombined with holes injected from the other side. The light-emitting unit contains a light-emitting material, and the light-emitting material releases energy generated by recombination of electrons and holes as light. Note that a hole-transport layer and an electron-transport layer can be used in the light-emitting unit. The hole-transport layer is placed closer to the positive electrode than the electron-transport layer is, and has higher hole mobility than the electron-transport layer.

A plurality of light-emitting units and an intermediate layer can be used for the layer 553G(j) containing a light-emitting material, for example. The intermediate layer includes a region interposed between two light-emitting units. The intermediate layer includes a charge-generation region, and the intermediate layer has functions of supplying holes to the light-emitting unit placed on the cathode side and supplying electrons to the light-emitting unit placed on the anode side. Furthermore, a structure including a plurality of light-emitting units and an intermediate layer is referred to as a tandem light-emitting element in some cases.

Accordingly, the current efficiency of light emission can be increased. The density of current flowing through the light-emitting element at the same luminance can be reduced. The reliability of the light-emitting element can be increased.

For example, a light-emitting unit containing a material emitting light with one hue and a light-emitting unit containing a material emitting light with a different hue can be stacked and used for the layer 553G(j) containing a light-emitting material. A light-emitting unit containing a material emitting light with one hue and a light-emitting unit containing a material emitting light with the same hue can be stacked and used for the layer 553G(j) containing a light-emitting material. Specifically, two light-emitting units each containing a material emitting blue light can be stacked and used.

For the layer 553G(j) containing a light-emitting material, a high molecular compound (e.g., an oligomer, a dendrimer, or a polymer), a middle molecular compound (a compound between a low molecular compound and a high molecular compound with a molecular weight greater than or equal to 400 and less than or equal to 4000), or the like can be used.

[Electrode 551G(i,j) and Electrode 552]

The material that can be used for the wiring or the like, for example, can be used for the electrode 551G(i,j) or the electrode 552. Specifically, a material having a visible-light-transmitting property can be used for the electrode 551G(i,j) or the electrode 552.

For example, a conductive oxide, a conductive oxide containing indium, indium oxide, indium tin oxide, indium zinc oxide, zinc oxide, zinc oxide to which gallium is added, or the like can be used. Alternatively, a metal film thin enough to transmit light can be used. Alternatively, a material having a visible-light-transmitting property can be used.

For example, a metal film that transmits part of light and reflects another part of the light can be used for the electrode 551G(i,j) or the electrode 552. The distance between the electrode 551G(i,j) and the electrode 552 is adjusted using the layer 553G(j) containing a light-emitting material, for example.

Thus, a microcavity structure can be provided in the element 550G(i,j). Light of a predetermined wavelength can be extracted more efficiently than other light. Light with a narrow half width of a spectrum can be extracted. Light of a bright color can be extracted.

A film that efficiently reflects light, for example, can be used for the electrode 551G(i,j) or the electrode 552. Specifically, a material containing silver, palladium, and the like or a material containing silver, copper, and the like can be used for the metal film.

The electrode 551G(i,j) is electrically connected to the pixel circuit 530G(i,j) through the opening portion 591G (see FIG. 10A). For example, the electrode 551G(i,j) overlaps with the opening portion formed in the insulating film 528, and the insulating film 528 is at the periphery of the electrode 551G(i,j).

Thus, a short circuit between the electrode 551G(i,j) and the electrode 552 can be prevented.

Structure Example 2 of Element 550S(i,j)

The element 550S(i,j) includes an electrode 551S(i,j), the electrode 552, and a layer 553S(j) containing a photoelectric conversion material (see FIG. 10A).

For example, a heterojunction photoelectric conversion element, a bulk heterojunction photoelectric conversion element, or the like can be used as the element 550S(i,j).

Structure Example 1 of Layer 553S(j) Containing Photoelectric Conversion Material For example, a stacked-layer film in which a p-type semiconductor film and an n-type semiconductor film are stacked in contact with each other can be used as the layer 553S(j) containing a photoelectric conversion material. Note that the element 550S(i,j) in which a stacked-layer film with such a structure is used as the layer 553S(j) containing a photoelectric conversion material can be referred to as a PN photodiode.

For example, a stacked-layer film in which a p-type semiconductor film, an i-type semiconductor film, and an n-type semiconductor film are stacked such that the i-type semiconductor film is interposed between the p-type semiconductor film and the n-type semiconductor film can be used as the layer 553S(j) containing a photoelectric conversion material. Note that the element 550S(i,j) in which a stacked-layer film with such a structure is used as the layer 553S(j) containing a photoelectric conversion material can be referred to as a PIN photodiode.

For example, a stacked-layer film in which a p+-type semiconductor film, a p--type semiconductor film, a p-type semiconductor film, and an n-type semiconductor film are stacked such that the p--type semiconductor film is interposed between the p+-type semiconductor film and the n-type semiconductor film and the p-type semiconductor film is interposed between the p--type semiconductor film and the n-type semiconductor film can be used as the layer 553S(j) containing a photoelectric conversion material. Note that the element 550S(i,j) in which a stacked-layer film with such a structure is used as the layer 553S(j) containing a photoelectric conversion material can be referred to as an avalanche photodiode.

Structure Example 2 of Layer 553S(j) Containing Photoelectric Conversion Material For example, a semiconductor containing a Group 14 element can be used for the layer 553S(j) containing a photoelectric conversion material. Specifically, a semiconductor containing silicon can be used for the layer 553S(j) containing a photoelectric conversion material. For example, hydrogenated amorphous silicon, microcrystalline silicon, polysilicon, single crystal silicon, or the like can be used for the layer 553S(j) containing a photoelectric conversion material.

For example, an organic semiconductor can be used for the layer 553S(j) containing a photoelectric conversion material. Specifically, part of the layer used as the layer 553G(j) containing a light-emitting material can be used as part of the layer 553S(j) containing a photoelectric conversion material.

Specifically, a hole-transport layer used in the layer 553G(j) containing a light-emitting material can be used in the layer 553S(j) containing a photoelectric conversion material. An electron-transport layer used in the layer 553G(j) containing a light-emitting material can be used in the layer 553S(j) containing a photoelectric conversion material. The hole-transport layer and the electron-transport layer can be used in the layer 553S(j) containing a photoelectric conversion material.

Thus, in a step of forming the hole-transport layer used in the layer 553G(j) containing a light-emitting material, the hole-transport layer used in the layer 553S(j) containing a photoelectric conversion material can be formed. In a step of forming the electron-transport layer used in the layer 553G(j) containing a light-emitting material, the electron-transport layer used in the layer 553S(j) containing a photoelectric conversion material can be formed. The manufacturing process can be simplified.

For example, an electron-accepting organic semiconductor material such as fullerene (e.g., $C_{60}$ or $C_{70}$) or the derivative thereof can be used for the n-type semiconductor film.

For example, a fullerene derivative dissolved or dispersed in a first solvent can be used for the layer 553S(i,j) containing a photoelectric conversion material. Specifically, [6,6]-Phenyl-C71-butyric acid methyl ester (abbreviation: PC70BM), [6,6]-Phenyl-C61-butyric acid methyl ester (abbreviation: PC60BM), 1',1'',4',4''-Tetrahydro-di[1,4]methanonaphthaleno[1,2:2',3',56,60:2'',3''][5,6]fullerene-C60 (abbreviation: ICBA), or the like can be used for the layer 553S(i,j) containing a photoelectric conversion material.

For example, an electron-donating organic semiconductor material such as copper(II) phthalocyanine (CuPc) or tetraphenyldibenzoperiflanthene (DBP) can be used for the p-type semiconductor film.

For example, a π-conjugated organic high molecular material, an oligomer, or a low molecular material dissolved or dispersed in the first solvent can be used for the layer 553S(i,j) containing a photoelectric conversion material. Specifically, a polyphenylene-vinylene-based material, a polythiophene-based material, or the like can be used for the layer 553S(i,j) containing a photoelectric conversion material. Specifically, Poly ([2,6'-4,8-di(5-ethylhexylthienyl)benzo[1,2-b;3,3-b]dithiophene]{3-fluoro-2 [(2-ethylhexyl)carbonyl]thieno[3,4-b]thiophenediyl}) (abbreviation: PTB7-Th), Poly({4,8-bis[(2-ethylhexyl)oxy]benzo[1,2-b:4,5-b']dithiophene-2,6-diyl}{3-fluoro-2-[(2-ethylhexyl)carbonyl]thieno[3,4-b]thiophenediyl}) (abbreviation: PYB7), Poly(3-hexylthiophene-2,5-diyl) (abbreviation: P3HT), or the like can be used for the layer 553S(i,j) containing a photoelectric conversion material.

For example, a film obtained by co-evaporation of an electron-accepting semiconductor material and an electron-donating semiconductor material can be used as the i-type semiconductor film.

Structure Example 2 of Functional Panel 700

The functional panel 700 includes the insulating film 528 and an insulating film 573 (see FIG. 9A).

<<Insulating Film 528>>

The insulating film 528 includes a region interposed between the functional layer 520 and the base material 770, and the insulating film 528 has an opening portion in a region overlapping with the element 550G(i,j) (see FIG. 9A).

The material that can be used for the insulating film 521, for example, can be used for the insulating film 528. Specifically, a silicon oxide film, a film containing an acrylic resin, a film containing polyimide, or the like can be used as the insulating film 528.

<<Insulating Film 573>>

The element 550G(i,j) is interposed between a region of the insulating film 573 and the functional layer 520 (see FIG. 9A).

For example, a single film or a stacked film in which a plurality of films are stacked can be used as the insulating film 573. Specifically, a stacked film, in which an insulating film 573A which can be formed by a method that hardly damages the element 550G(i,j) and a dense insulating film 573B with a few defects are stacked, can be used as the insulating film 573.

Thus, diffusion of impurities into the element 550G(i,j) can be inhibited. The reliability of the element 550G(ii) can be increased.

Structure Example 3 of Functional Panel 700

The functional panel 700 includes a functional layer 720 (see FIG. 9A).

<<Functional Layer 720>>

The functional layer 720 includes a light-blocking film BM, the coloring film CF(G), and an insulating film 771. A color conversion layer can also be used.

<<Light-Blocking Film BM>>

The light-blocking film BM has an opening portion in a region overlapping with the pixel 702G(i,j). The light-blocking film BM has an opening portion in a region overlapping with the pixel 702S(i,j).

A material of a dark color can be used for the light-blocking film BM, for example. Thus, the display contrast can be increased.

<<Coloring Film CF(G)>>

The coloring film CF(G) includes a region interposed between the base material 770 and the element 550G(i,j). A material that selectively transmits light of a predetermined color, for example, can be used for the coloring film CF(G). Specifically, a material that transmits red light, green light, or blue light can be used for the coloring film CF(G).

Structure Example of Insulating Film 771

The insulating film 771 includes a region interposed between the base material 770 and the element 550G(i,j).

The light-blocking film BM, the coloring layer CF(G), or color conversion are interposed between a region of the insulating film 771 and the base material 770. Thus, unevenness due to the thicknesses of the light-blocking film BM, the coloring film CF(G), or the color conversion layer can be reduced.

<<Color Conversion Layer>>

The color conversion layer includes a region interposed between the base material 770 and the element 550G(i,j).

For example, a material that emits light with a wavelength longer than a wavelength of incident light can be used for the color conversion layer. For example, a material that absorbs blue light or ultraviolet rays, converts it into green light, and emits the green light, a material that absorbs blue light or ultraviolet rays, converts it into red light, and emits the red light, or a material that absorbs ultraviolet rays, converts it into blue light, and emits the blue light can be used for the color conversion layer. Specifically, a quantum dot with a diameter of several nanometers can be used for the color conversion layer. Thus, light having a spectrum with a narrow half width can be emitted. Light with high saturation can be emitted.

Structure Example 4 of Functional Panel 700

The functional panel 700 includes a light-blocking film KBM (see FIG. 9A).

<<Light-Blocking Film KBM>>

The light-blocking film KBM has an opening portion in a region overlapping with the pixel 702S(i,j). Moreover, the light-blocking film KBM includes a region interposed between the functional layer 520 and the base material 770, and has a function of providing a predetermined space between the functional layer 520 and the base material 770. A material of a dark color can be used for the light-blocking film KBM, for example. Thus, stray light that would enter the pixel 702S(i,j) can be reduced.

Structure Example 5 of Functional Panel 700

The functional panel 700 includes a functional film 770P or the like (see FIG. 9A).

<<Functional Film 770P and the Like>>

The functional film 770P includes a region overlapping with the element 550G(i,j).

An anti-reflection film, a polarizing film, a retardation film, a light diffusion film, a condensing film, or the like can be used as the functional film 770P, for example.

For example, an anti-reflection film with a thickness less than or equal to 1 µm can be used as the functional film 770P. Specifically, a stacked film in which three or more layers, preferably five or more layers, further preferably 15 or more layers of dielectrics are stacked can be used as the functional film 770P. This allows the reflectance to be as low as 0.5% or less, preferably 0.08% or less.

For example, a circularly polarizing film can be used as the functional film 770P.

Furthermore, an antistatic film inhibiting the attachment of a dust, a water repellent film inhibiting the attachment of a stain, an oil repellent film inhibiting the attachment of a stain, an antireflective film (anti-reflection film), a non-glare film (anti-glare film), a hard coat film inhibiting generation of a scratch in use, a self-healing film that self-heals from generated scratches, or the like can be used as the functional film 770P.

Note that this embodiment can be combined with any of the other embodiments in this specification as appropriate.

Embodiment 4

In this embodiment, structures of a functional panel of one embodiment of the present invention are described with reference to FIG. 12 to FIG. 14D.

Figure 12:
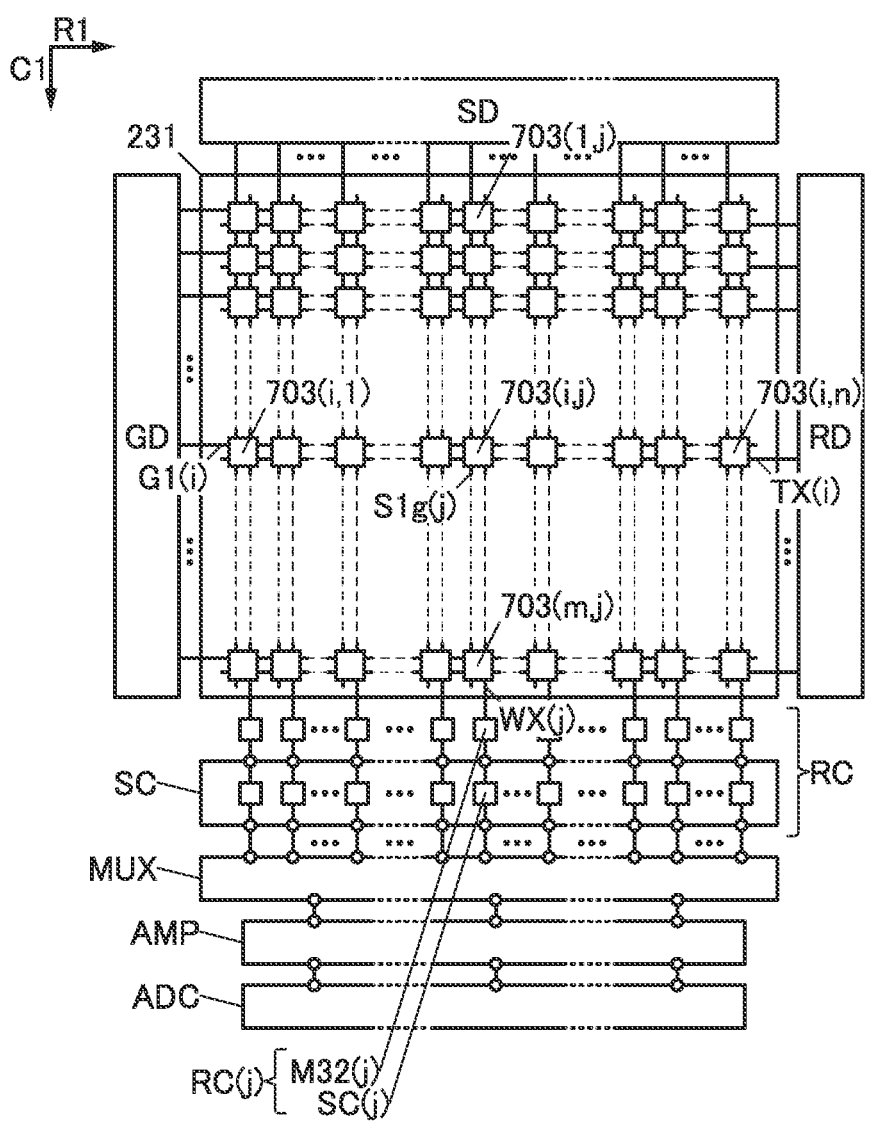
FIG. 12 is a diagram illustrating a structure of a functional panel of an embodiment.

FIG. 12 is a diagram illustrating the structure of the functional panel of one embodiment of the present invention.

Figure 13A:
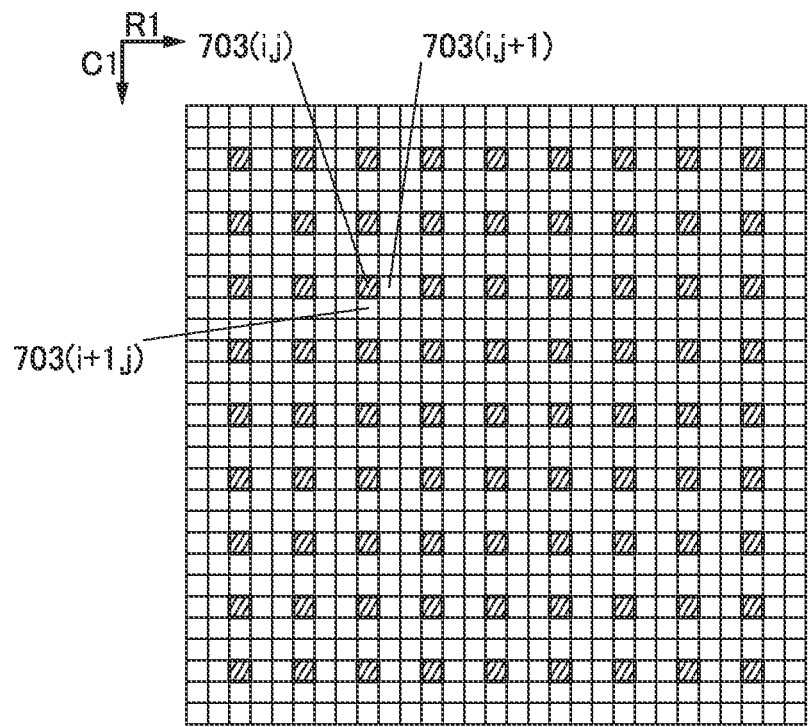
FIG. 13A and FIG. 13B are diagrams illustrating a structure of a functional panel of an embodiment.
Figure 13B:
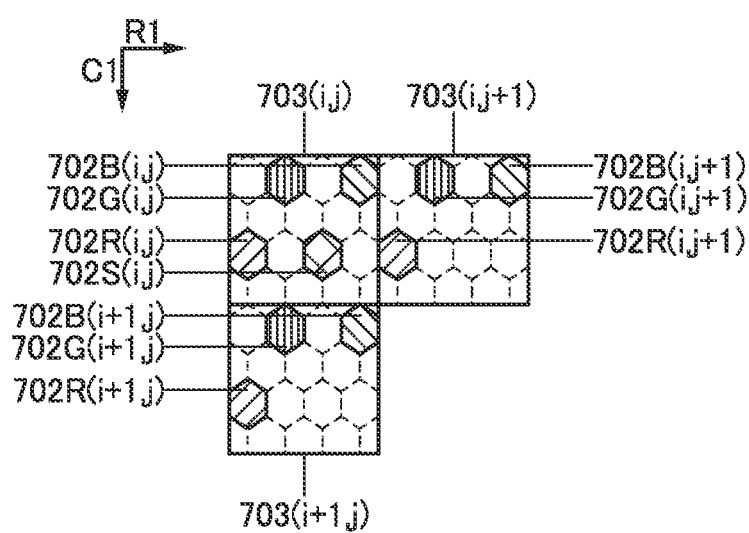

FIGS. 13A and 13B illustrate the structure of the functional panel of one embodiment of the present invention. FIG. 13A is a schematic view illustrating arrangement of pixels included in the functional panel of one embodiment of the present invention, and FIG. 13B is a diagram illustrating part of FIG. 13A.

Figure 14A:
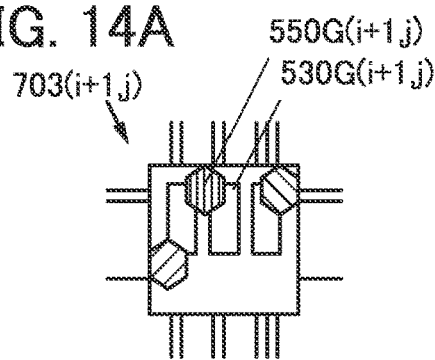
FIG. 14A to FIG. 14C are schematic views illustrating a structure of a functional panel of an embodiment.
Figure 14B:
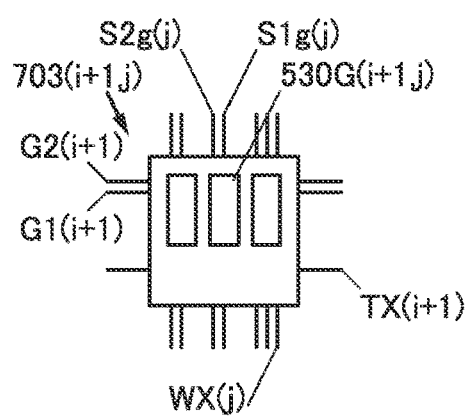
Figure 14C:
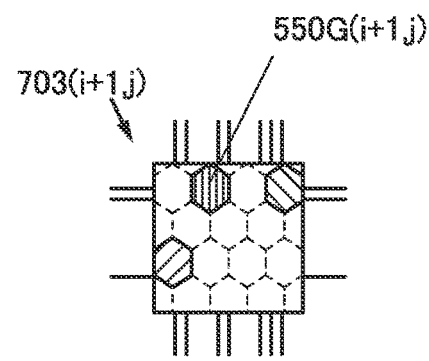
Figure 14D:
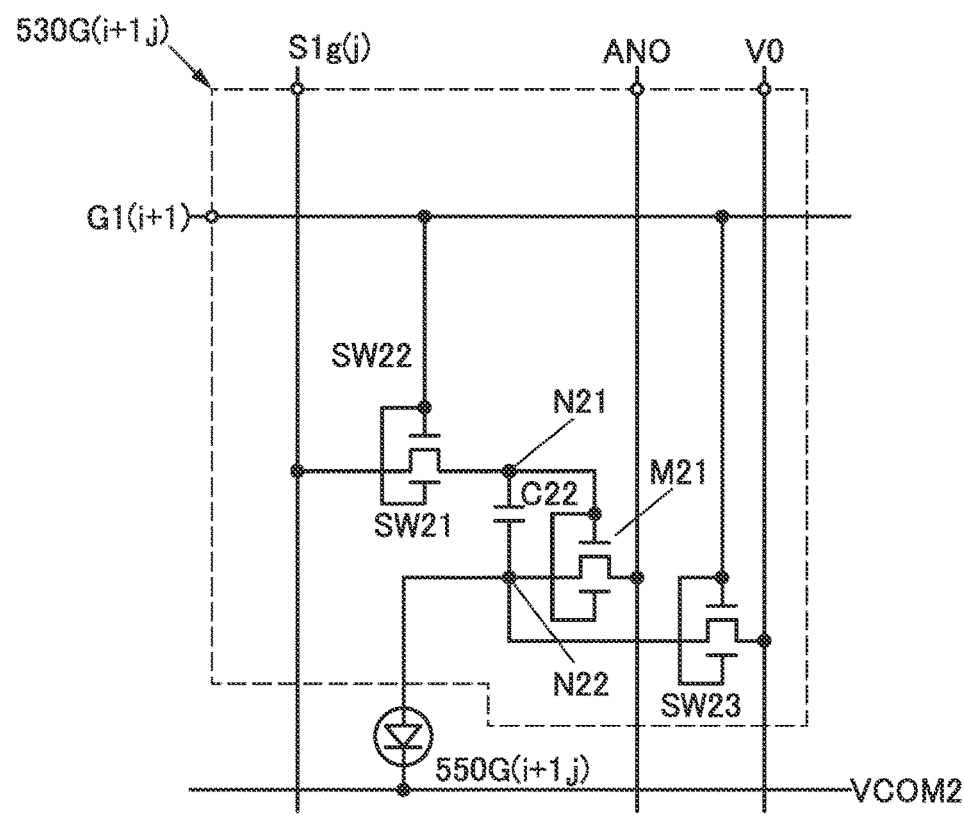
FIG. 14D is a circuit diagram illustrating a structure of the functional panel of an embodiment.

FIGS. 14A to 14C illustrate a structure of the functional panel of one embodiment of the present invention. FIG. 14A is a diagram illustrating part of FIG. 13A, FIG. 14B is a diagram illustrating part of FIG. 14A, and FIG. 14C is a diagram illustrating another part of FIG. 14A. FIG. 14D is a circuit diagram illustrating a structure example of a pixel circuit.

Structure Example 1 of Functional Panel 700

The functional panel 700 described in this embodiment includes a region 231 (see FIG. 12).

Structure Example 1 of Region 231

The region 231 includes a group of pixel sets 703($i$,1) to 703($i$,$n$) and a different group of pixel sets 703($i$,$j$) to 703($m$,$j$).

The group of pixel sets 703($i$,1) to 703($i$,$n$) is provided in the row direction (the direction indicated by an arrow R1 in the drawing), and the group of pixel sets 703($i$,1) to 703($i$,$n$) includes the pixel set 703($i$,$j$).

Furthermore, the group of pixel sets 703($i$,1) to 703($i$,$n$) is electrically connected to the conductive film G1($i$).

The different group of pixel sets 703(1,$j$) to 703($m$,$j$) is provided in the column direction (the direction indicated by an arrow C1 in the drawing) intersecting the row direction, and the different group of pixel sets 703(1,$j$) to 703($m$,$j$) includes the pixel set 703($i$,$j$).

The different group of pixel sets 703(1,$j$) to 703($m$,$j$) is electrically connected to the conductive film S1$g$($j$).

Thus, imaging data can be obtained from a plurality of pixels. In addition, image data can be supplied to a plurality of pixels. Thus, a novel functional panel that is highly convenient, useful, or reliable can be provided.

Structure Example 2 of Region 231

Another structure of the region 231 of the functional panel of one embodiment of the present invention is described with reference to FIG. 12 to FIG. 14D. Note that the difference from Structure example 1 of the region 231 is that a pixel 703($i$+1,$j$) has a structure different from that of the pixel 703($i$,$j$). Specifically, a pixel circuit 530G($i$+1$j$) has a structure different from that of the pixel circuit 530G($i$,$j$). Different portions are described in detail here, and the above description is referred to for portions that can use similar structures.

The region 231 includes the group of pixel sets 703($i$,1) to 703($i$,$n$) and the different group of pixel sets 703(1,$j$) to 703($m$,$j$) (see FIG. 12).

The group of pixel sets 703($i$,1) to 703 ($i$,$n$) includes the pixel set 703($i$,$j$) and a pixel set 703($i$,$j$+1) (see FIG. 13A and FIG. 13B).

The different group of pixel sets 703(1,$j$) to 703($m$,$j$) includes the pixel set 703($i$,$j$) and the pixel set 703($i$+1,$j$) (see FIG. 13A and FIG. 13B).

The pixel set 703($i$+1,$j$) includes a pixel 702G($i$+1$j$), and the pixel 702G($i$+1,$j$) includes the pixel circuit 530G($i$+1$j$) (see FIG. 13B and FIG. 14A). For example, a circuit illustrated in FIG. 14D can be used as the pixel circuit 530G($i$+1,$j$).

Thus, the pixel circuit 530G($i$+1$j$) can hold the third state ST3 regardless of the second selection signal. The potential of the node N21 of the pixel circuit 530G($i$+1,$j$) is not affected by the second selection signal, for example. A pixel that is not affected by the second selection signal can be placed between pixels each obtaining a control signal on the basis of the second selection signal. Pixels each obtaining a control signal can be arranged in the region 231 with appropriate intervals.

Structure Example 2 of Functional Panel 700

The functional panel 700 of one embodiment of the present invention includes a multiplexer MUX, an amplifier circuit AMP, and an analog-digital converter circuit ADC (see FIG. 12).

Structure Example of Multiplexer MUX

The multiplexer MUX has a function of obtaining an imaging signal from one selected from the plurality of sampling circuits SC and supplying the imaging signal to the amplifier circuit AMP, for example.

For example, the multiplexer MUX is electrically connected to the third terminal OUT(j) of the sampling circuit SC(j) (see FIG. 7B). Specifically, the multiplexer MUX, which is electrically connected to a sampling circuit SC(1) to a sampling circuit SC(9), can obtain an imaging signal from a predetermined sampling circuit and supply the imaging signal to the amplifier circuit AMP.

Thus, imaging data can be obtained by selecting a predetermined pixel from a plurality of pixels arranged in the row direction. The number of imaging signals obtained at the same time can be limited to a predetermined number. It is possible to use the analog-digital converter circuit ADC in which the number of input channels is smaller than the number of pixels arranged in the row direction. Thus, a novel functional panel that is highly convenient, useful, or reliable can be provided.

Structure Example of Amplifier Circuit AMP

The amplifier circuit AMP can amplify the imaging signal and supply the amplified signal to the analog-digital converter circuit ADC.

Note that the functional layer 520 includes the multiplexer MUX and the amplifier circuit AMP.

Accordingly, for example, in the step of forming the semiconductor film used in the pixel circuit 530G($i$,$j$), semiconductor films used in the multiplexer MUX and the amplifier circuit AMP can be formed. The manufacturing process of the functional panel can be simplified. Thus, a novel functional panel that is highly convenient, useful, or reliable can be provided.

Structure Example of Analog-Digital Converter Circuit ADC

The analog-digital converter circuit ADC has a function of converting an analog imaging signal to a digital signal. This can suppress deterioration of an imaging signal due to transmission.

Note that this embodiment can be combined with any of the other embodiments in this specification as appropriate.

Embodiment 5

In this embodiment, structures of display devices of one embodiment of the present invention are described with reference to FIG. 15A to FIG. 15D.

Figure 15A:
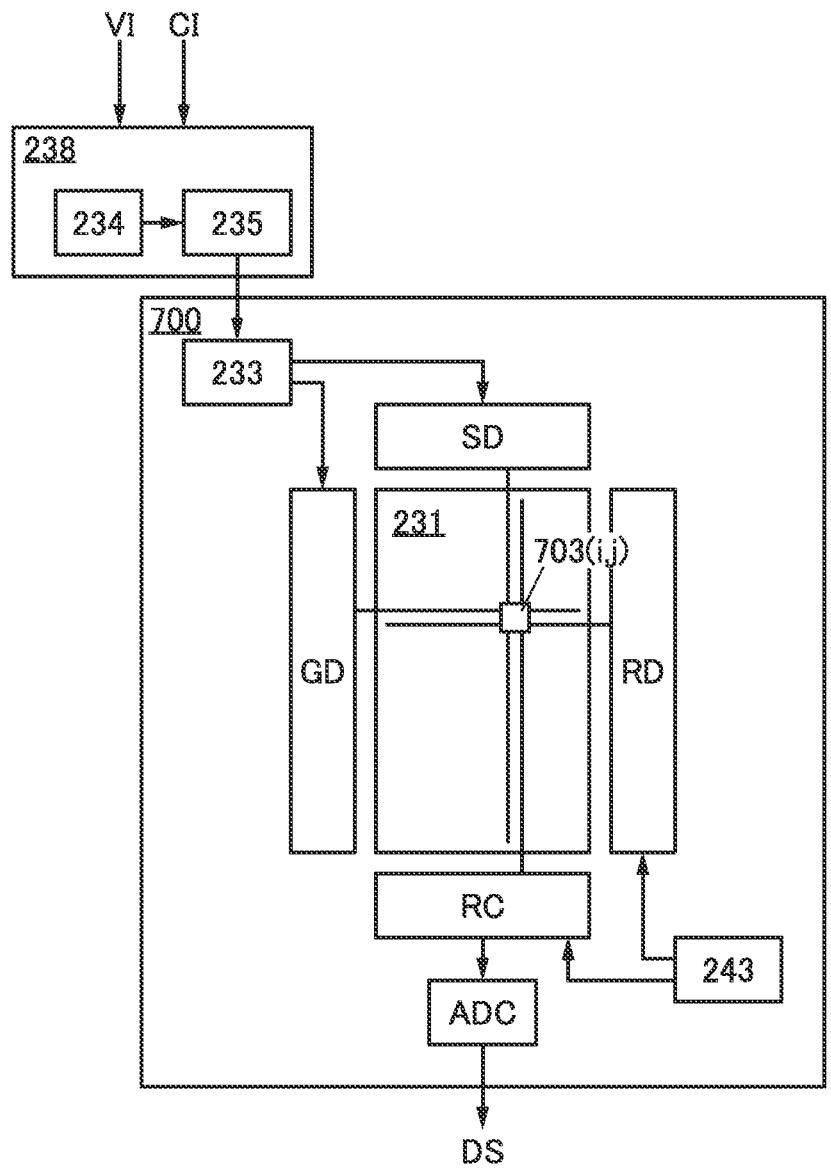
FIG. 15A to FIG. 15D are diagrams illustrating structures of display devices of an embodiment.
Figure 15B:
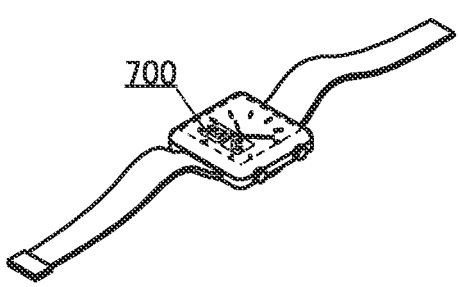
Figure 15C:
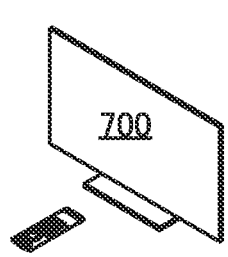
Figure 15D:
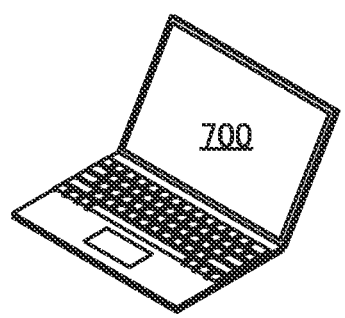

FIGS. 15A to 15D illustrate the structures of the display devices of one embodiment of the present invention. FIG. 15A is a block diagram of the display device of one embodiment of the present invention, and FIG. 15B to FIG. 15D are projection views illustrating appearances of the display devices of one embodiment of the present invention.

Structure Example of Display Device

The display device described in this embodiment includes the functional panel 700 and a control portion 238 (see FIG. 15A).

Structure Example 1 of Control Portion 238

The control portion 238 is supplied with image data VI and control data CI. For example, a clock signal, a timing signal, or the like can be used as the control data CI.

The control portion 238 generates data on the basis of the image data VI and the control portion 238 generates a control signal on the basis of the control data CI. Furthermore, the control portion 238 supplies the data and the control signal.

The data includes a grayscale of 8 bits or more, preferably 12 bits or more, for example. In addition, a clock signal, a start pulse, or the like of a shift register used for a driver circuit can be used as the control signal, for example.

Structure Example 2 of Control Portion 238

For example, a decompression circuit 234 and an image processing circuit 235 can be used in the control portion 238.

<<Decompression Circuit 234>>

The decompression circuit 234 has a function of decompressing the image data VI supplied in a compressed state. The decompression circuit 234 includes a memory portion. The memory portion has a function of storing decompressed image data, for example.

<<Image Processing Circuit 235>>

The image processing circuit 235 includes a memory region, for example. The memory region has a function of storing data included in the image data VI, for example.

The image processing circuit 235 has a function of generating the data by correcting the image data VI on the basis of a predetermined characteristic curve and a function of supplying the data, for example.

Structure Example 1 of Functional Panel

The functional panel 700 is supplied with the data and the control signal. For example, the functional panel 700 described in any one of Embodiment 1 to Embodiment 4 can be used.

Structure Example 3 of Pixel 703(i,j)

The pixel 703(i,j) performs display on the basis of the data.

Thus, the image data VI can be displayed using the first element 550G(i,j). Thus, a novel display device that is highly convenient, useful, or reliable can be provided. For example, an information terminal (see FIG. 15B), a video display system (see FIG. 15C), a computer (see FIG. 15D), or the like can be provided.

Structure Example 2 of Functional Panel

The functional panel 700 includes a driver circuit and a control circuit, for example.

<<Driver Circuit>>

The driver circuit operates on the basis of the control signal. Using the control signal enables a synchronized operation of a plurality of driver circuits (see FIG. 15A).

For example, the driver circuit GD can be used in the functional panel 700. The driver circuit GD is supplied with the control signal and has a function of supplying the first selection signal.

For example, the driver circuit SD can be used in the functional panel 700. The driver circuit SD is supplied with the control signal and the data and can supply an image signal.

For example, the driver circuit RD can be used in the functional panel 700. The driver circuit RD is supplied with the control signal and can supply the third selection signal to the fifth selection signal.

For example, the reading circuit RC can be used in the functional panel 700. The reading circuit RC is supplied with the control signal, and can read an imaging signal by a correlated double sampling method, for example.

<<Control Circuit>>

The control circuit has a function of generating and supplying the control signal. For example, a clock signal or a timing signal can be used as the control signal.

Specifically, the control circuit formed over a rigid substrate can be used in the functional panel. The control circuit formed over the rigid substrate and the control portion 238 can be electrically connected to each other using a flexible printed circuit.

<<Control Circuit 233>>

A timing controller can be used as a control circuit 233, for example. With the use of a control circuit 243, operation of the driver circuit RD can be synchronized with operation of the reading circuit RC.

Note that this embodiment can be combined with any of the other embodiments in this specification as appropriate.

Embodiment 6

In this embodiment, a structure of an input/output device of one embodiment of the present invention is described with reference to FIG. 16 to FIG. 18D.

Figure 16:
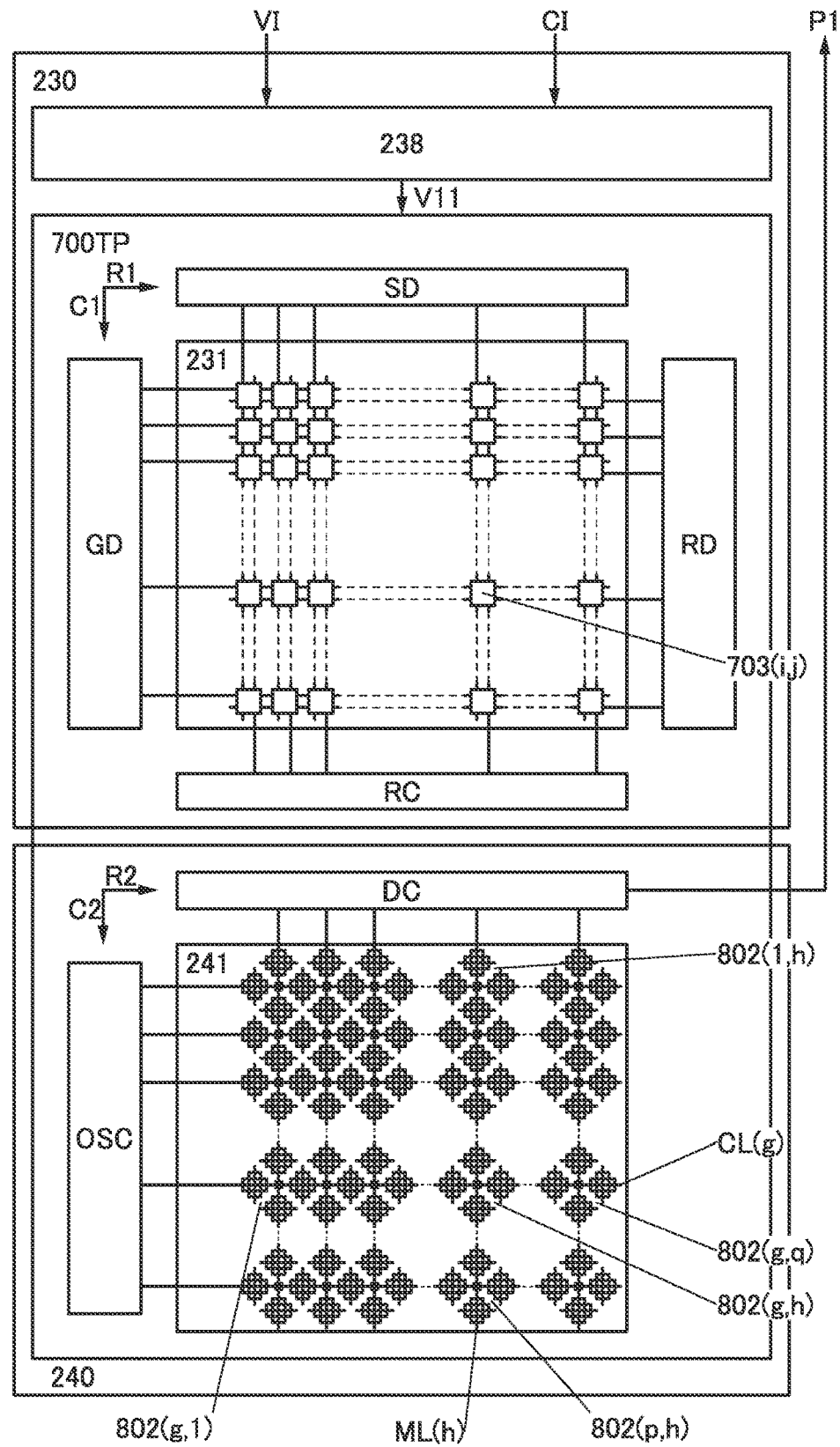
FIG. 16 is a block diagram illustrating a structure of an input/output device of an embodiment.

FIG. 16 is a block diagram illustrating the structure of the input/output device of one embodiment of the present invention.

Figure 17A:
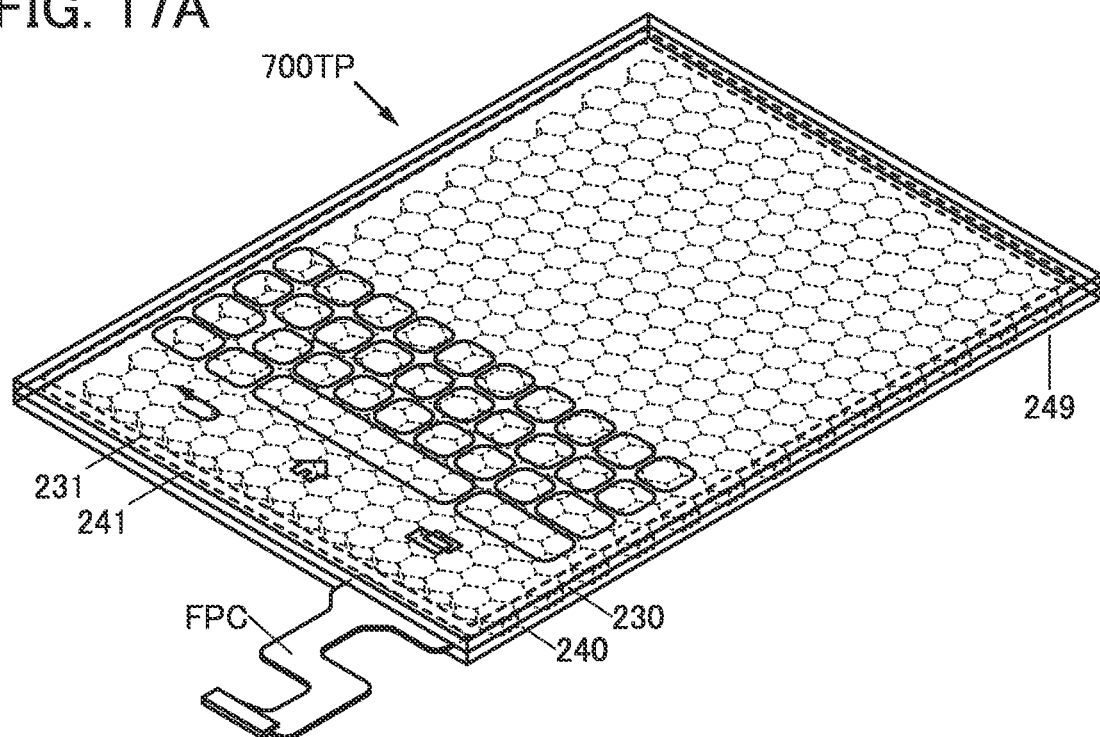
FIG. 17A to FIG. 17D are diagrams illustrating a structure of an input/output device of one embodiment.
Figure 17B:
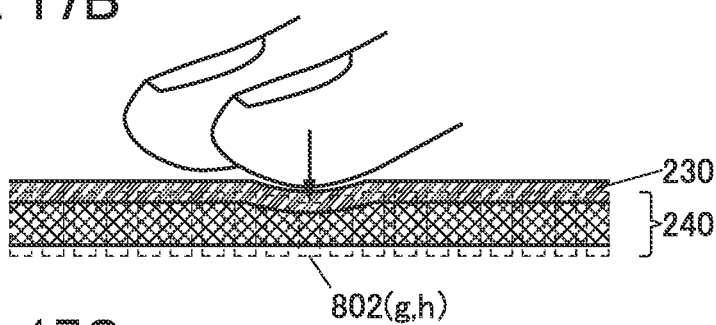
Figure 17C:
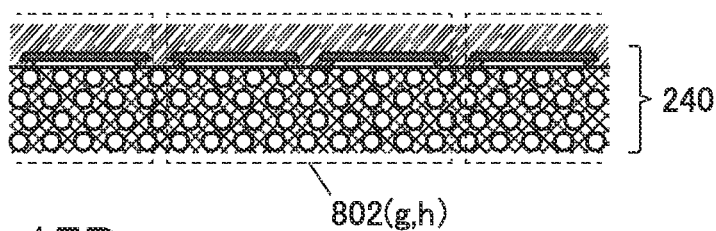
Figure 17D:
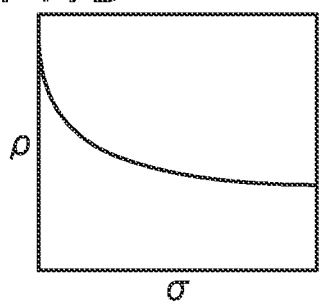

FIGS. 17A to 17C illustrate the structure of the input/output device of one embodiment of the present invention. FIG. 17A is a perspective view of the input/output device of one embodiment of the present invention, FIG. 17B and FIG. 17C are cross-sectional views illustrating part of FIG. 17A, and FIG. 17D shows an electric resistance-stress curve which schematically shows characteristics of a sensor.

Figure 18A:
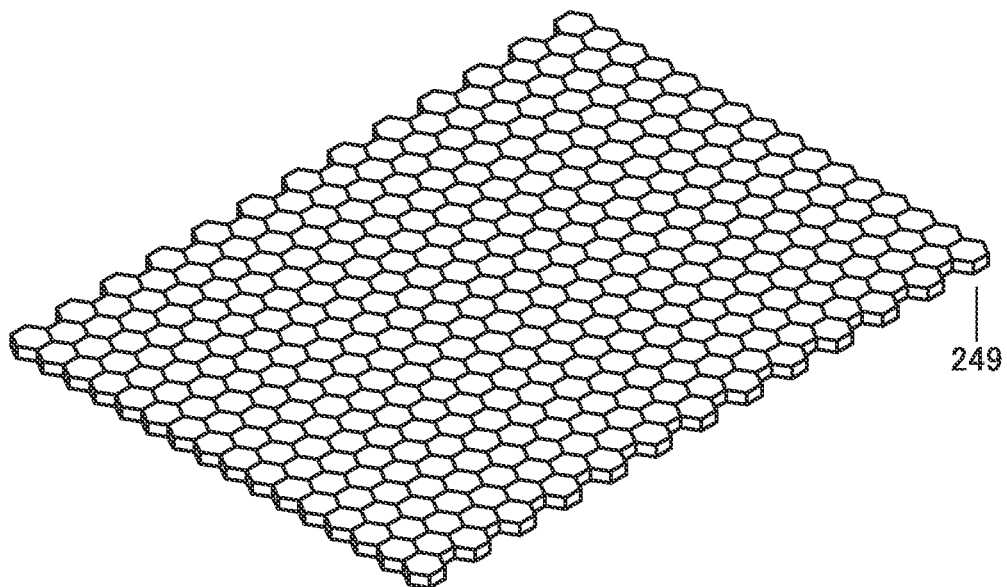
FIG. 18A to FIG. 18D are diagrams illustrating an input/output device of an embodiment.
Figure 18B:
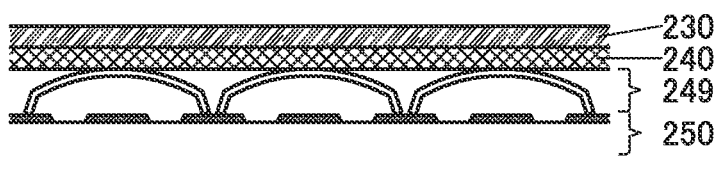
Figure 18C:
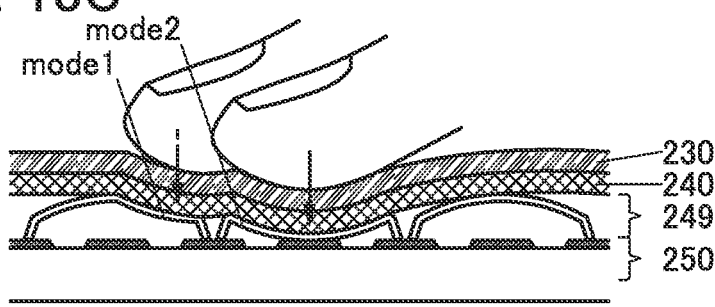
Figure 18D:
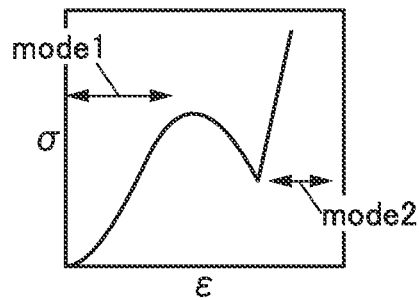

FIGS. 18A to 18C illustrate the structure of the input/output device of one embodiment of the present invention. FIG. 18A is a perspective view of a component used for the input/output device of one embodiment of the present invention, FIG. 18B and FIG. 18C are cross-sectional views illustrating part of FIG. 17A, and FIG. 18D shows stress-distortion curve which schematically shows characteristics of a component in which snap-through buckling occurs.

Structure Example 1 of Input/Output Device

The input/output device described in this embodiment includes an input portion 240 and a display portion 230 (see FIG. 16).

Structure Example 1 of Display Portion 230

The display portion 230 includes the functional panel 700. For example, the functional panel 700 described in any one of Embodiment 1 to Embodiment 4 can be used for the display portion 230. Note that a panel including the input portion 240 and the display portion 230 can be referred to as a functional panel 700TP.

Structure Example 1 of Input Portion 240

The input portion 240 includes a sensing region 241, the input portion 240 senses an object approaching the sensing region 241, and the sensing region 241 includes a region overlapping with the pixel 703(*i,j*).

Thus, an object approaching the region overlapping with the display portion 230 can be sensed while image data is displayed using the display portion 230. A finger or the like approaching the display portion 230 can be used as a pointer to input position data. Position data can be associated with image data displayed on the display portion 230. Thus, a novel input/output device that is highly convenient, useful, or reliable can be provided.

Structure Example 1 of Sensing Region 241

The sensing region 241 includes one or a plurality of sensors, for example.

The sensing region 241 includes a group of sensors 802(*g,1*) to 802(*g,q*) and a different group of sensors 802(*1,h*) to 802(*p,h*). Note that g is an integer greater than or equal to 1 and less than or equal to p, h is an integer greater than or equal to 1 and less than or equal to q, and p and q are each an integer greater than or equal to 1.

The group of sensors 802(*g,1*) to 802(*g,q*) includes a sensor 802(*g,h*), is provided in a row direction (the direction indicated by an arrow R2 in the drawing), and is electrically connected to a conductive film CL(g). Note that the direction indicated by the arrow R2 may be the same as or different from the direction indicated by the arrow R1.

The different group of sensors 802(*1,h*) to 802(*p,h*) includes the sensor 802(*g,h*), is provided in a column direction (the direction indicated by an arrow C2 in the drawing) intersecting the row direction, and is electrically connected to a wiring ML(h).

<<Sensor>>

The sensor has a function of sensing an approaching pointer. For example, a finger or a stylus pen can be used as the pointer. For example, a piece of metal or a coil can be used for the stylus pen.

Specifically, a capacitive proximity sensor, an electromagnetic inductive proximity sensor, an optical proximity sensor, a resistive proximity sensor, or the like can be used as the sensor.

A plurality of types of sensors can be used in combination. For example, a sensor that senses a finger and a senor that senses a stylus pen can be used in combination.

This allows determination of the kind of a pointer. Different instructions can be associated with sensing data depending on the kind of a pointer that has been determined. Specifically, in the case where it is determined that a finger is used as a pointer, sensing data can be associated with a gesture. In the case where it is determined that a stylus pen is used as a pointer, sensing data can be associated with drawing processing.

Specifically, a finger can be sensed using a capacitive, pressure-sensitive, or optical proximity sensor. A stylus pen can be sensed using an electromagnetic inductive or optical proximity sensor.

Structure Example 2 of Input Portion 240

The input portion 240 includes an oscillation circuit OSC and a sensing circuit DC (see FIG. 16).

The oscillation circuit OSC supplies a search signal to the sensor 802(*g,h*). For example, a rectangular wave, a sawtooth wave, a triangular wave, or a sine wave can be used as the search signal.

The sensor 802(*g,h*) generates and supplies a sensing signal that changes on the basis of the search signal and the distance to a pointer approaching the sensor 802(*g,h*).

The sensing circuit DC supplies input data on the basis of the sensing signal.

Accordingly, the distance from an approaching pointer to the sensing region 241 can be sensed. The position in the sensing region 241 where the pointer comes the closest can be sensed.

Structure Example 1 of Sensor

The region 231 is provided closer to the side where the pointer approaches than the sensing region 241 is, and the region 231 has flexibility (see FIG. 17A and FIG. 17B). For example, an image indicating a keyboard can be displayed on the region 231 (see FIG. 17A).

Structure Example 2 of Sensor

The sensor 802(*g,h*) has a function of sensing the pushing depth, and the sensor 802(*g,h*) senses a pointer through the region 231 (see FIG. 17B).

For example, the sensor 802(*g,h*) senses the pushing depth toward the sensor 802(*g,h*) with the pointer. Specifically, the sensor 802(*g,h*) senses the pushing depth from a plane including the region 231 to a plane including the sensing region 241 with a finger or a stylus pen (see FIG. 17C).

For example, a pressure sensor can be used as the sensor 802(*g,h*). Specifically, an element whose electric resistance changes in accordance with a pressure can be used as the sensor 802(*g,h*) (see FIG. 17D). Thus, the sensor 802(*g,h*) can sense the pushing depth.

Structure Example 2 of Input/Output Device

The input/output device described in this embodiment includes a component 249 (see FIG. 17A and FIG. 18A to FIG. 18C).

Structure Example of Component 249

The component 249 overlaps with the sensing region 241 and has elasticity.

For example, an elastic body can be used for the component 249. Specifically, a spring, a plate spring, a rubber, a sponge, or the like can be used.

Thus, the sensor $802(g,h)$ can sense the pushing depth. Alternatively, a user can feel the force corresponding to the pushing depth with the pointer.

For example, the component in which snap-through buckling occurs can be used for the component 249. Specifically, as the component 249, a dome-shaped component can be used, for example (see FIG. 18B).

The component 249 has a mode 1 in which the component 249 is stable in a region with small distortion ε and a mode 2 in which the component 249 is stable in a region with large distortion ε (see FIG. 18C and FIG. 18D). The component 249 changes from the mode 1 to the mode 2 at the buckling point (see FIG. 18D). Furthermore, the component 249 reversibly changes from the mode 2 to the mode 1 when the distortion is eliminated.

Thus, the sensor $802(g,h)$ can sense the force corresponding to the pushing depth up to the buckling point. A user can obtain a sense of the force. When the force exceeds the buckling point, the user can have a click feeling. What is called a tactile switch can be provided. When the user releases the pushed pointer, the component in which snap-through buckling occurs can return to the original mode.

Note that the sensing region 241 can be provided to overlap with the component in which snap-through buckling occurs, the region 231 can be provided to overlap with the sensing region 241, and an image used for operation can be displayed at a position overlapping with the component in which snap-through buckling occurs. For example, a layout that is suitably used for a keyboard can be employed for the layout of the components in which snap-through buckling occurs. Alternatively, a layout that is suitably used for a home button can be employed for the layout of the components in which snap-through buckling occurs.

Thus, the displayed images used for operation can be pressed. The user can have a click feeling when pressing the images.

Furthermore, it is possible to use the component 249 including a region where a plurality of components in which snap-through buckling occurs are provided on the whole area. The sensing region 241 can be provided to overlap with the region, the region 231 can be provided to overlap with the sensing region 241, and the image used for operation can be displayed at a position overlapping with the region, the whole area of which is provided with the components.

Thus, images which are used for operation and can provide a click feeling by being pressed can be freely laid out.

Note that a sensing portion 250 may be provided to overlap with the input/output device described in this embodiment. For example, a pressure-sensitive switch can be used for the sensing portion 250. Specifically, a conductive material is used for a dome-shaped component in which snap-through buckling occurs, and the dome-shaped component can be used at a contact point with the pressure-sensitive switch. Thus, what is called a membrane switch can be provided. Alternatively, a switch that provides a click feeling can be provided. What is called a tactile switch can be provided.

Note that this embodiment can be combined with any of the other embodiments in this specification as appropriate.

Embodiment 7

In this embodiment, structures of data processing devices of one embodiment of the present invention are described with reference to FIG. 19A to FIG. 23D.

Figure 19A:
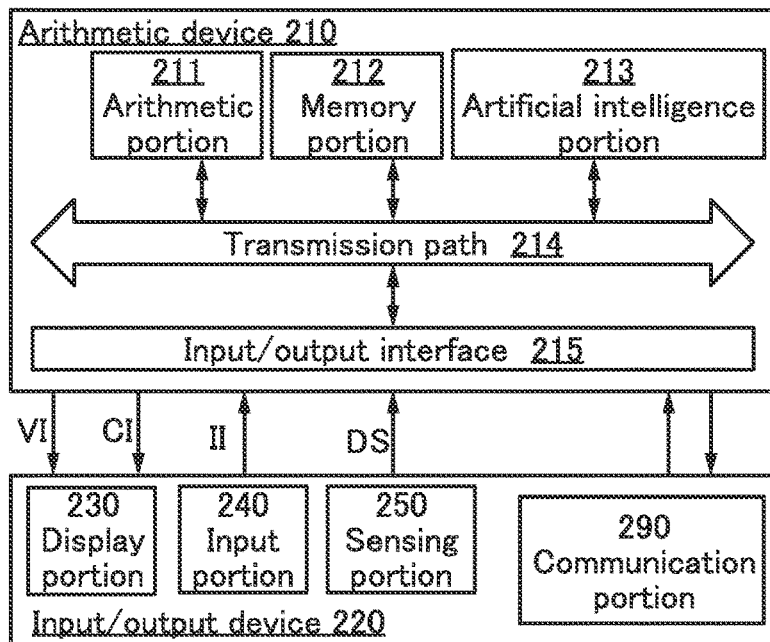
FIG. 19A to FIG. 19C are diagrams illustrating structures of data processing devices of an embodiment.
Figure 19B:
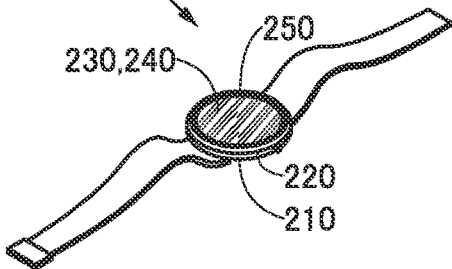
Figure 19C:
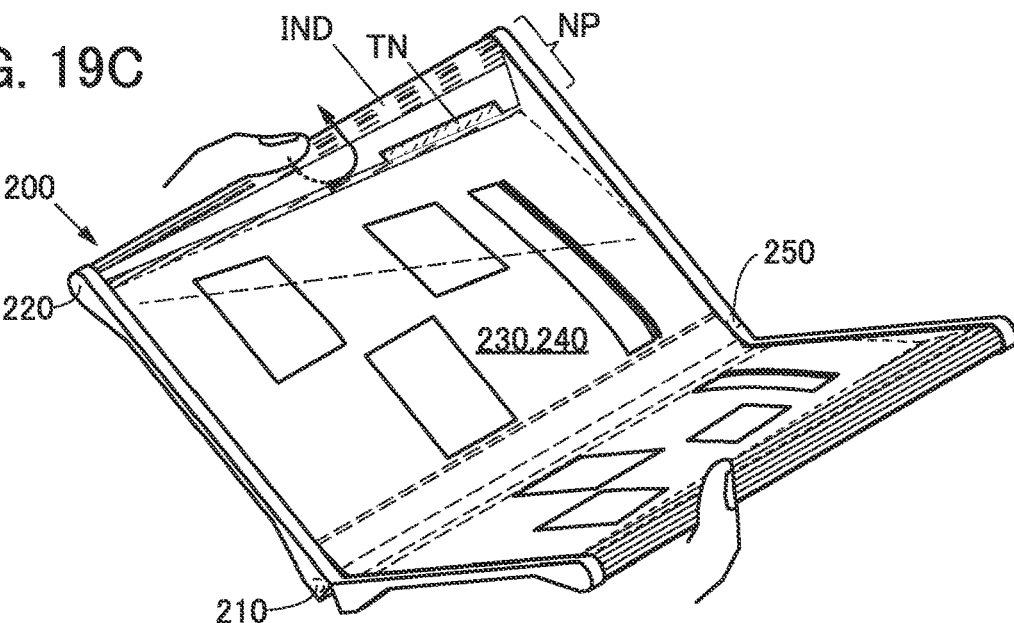

FIG. 19A is a block diagram illustrating the structure of the data processing device of one embodiment of the present invention. FIG. 19B and FIG. 19C are perspective views illustrating examples of appearances of the data processing devices.

Figure 20A:
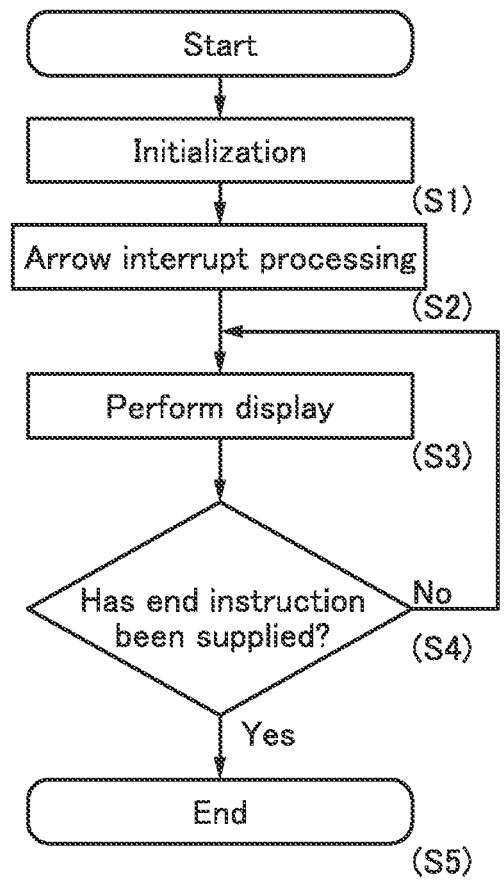
FIG. 20A and FIG. 20B are flow charts showing a driving method of a data processing device of an embodiment.
Figure 20B:
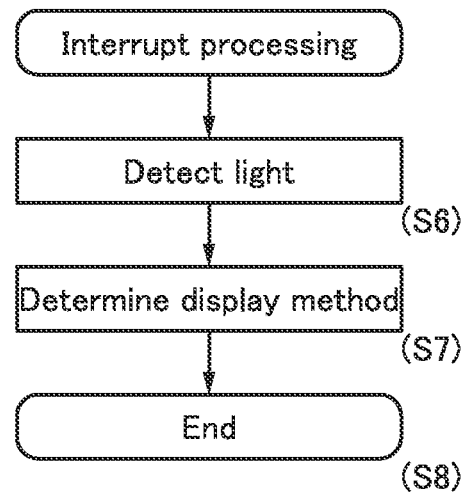

FIGS. 20A and 20B show flow charts showing a program of one embodiment of the present invention. FIG. 20A is a flow chart showing main processing of the program of one embodiment of the present invention, and FIG. 20B is a flow chart showing interrupt processing.

Figure 21A:
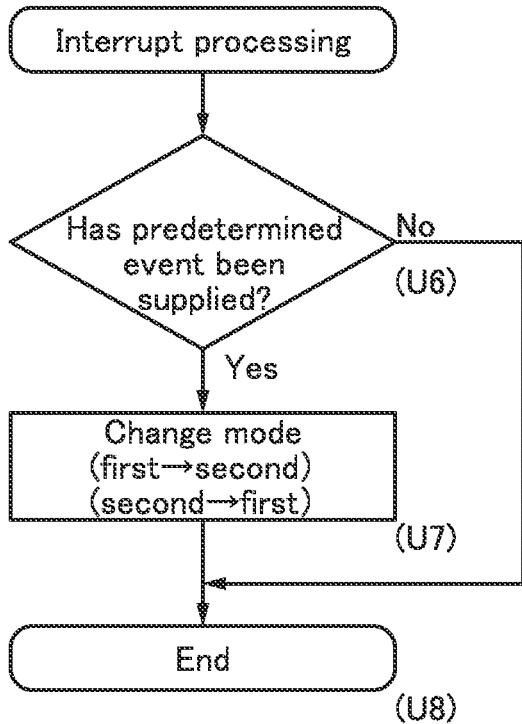
FIG. 21A to FIG. 21C are diagrams showing a driving method of a data processing device of an embodiment.
Figure 21B:
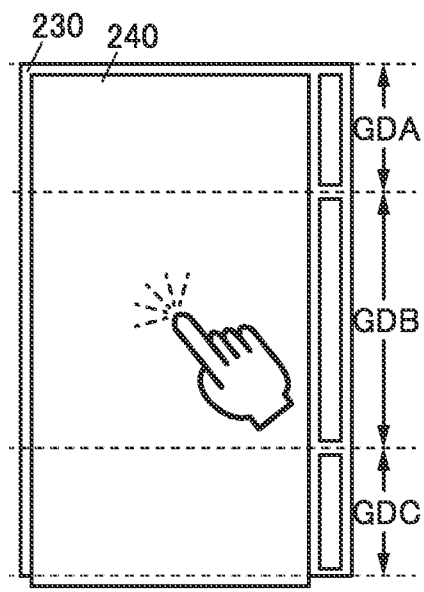
Figure 21C:
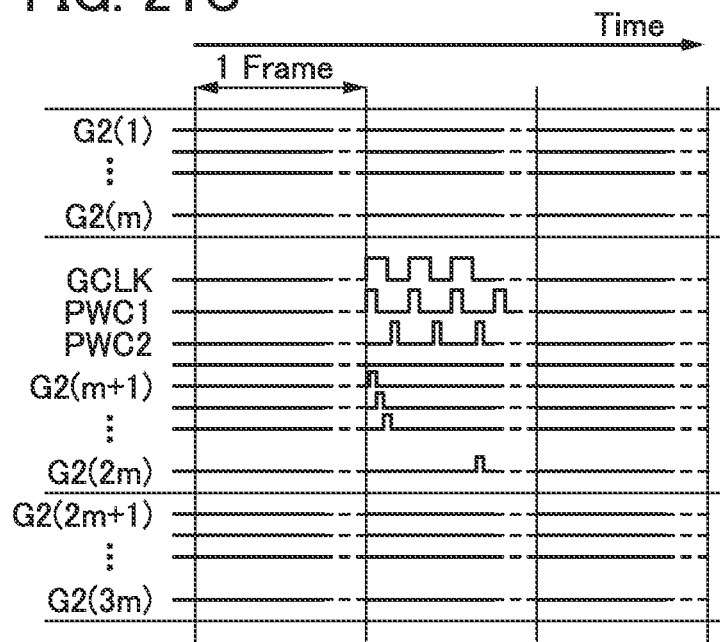

FIGS. 21A to 21C show the program of one embodiment of the present invention. FIG. 21A is a flow chart showing interrupt processing of the program of one embodiment of the present invention. FIG. 21B is a schematic view illustrating handling of the data processing device of one embodiment of the present invention, and FIG. 21C is a timing chart showing the operation of the data processing device of one embodiment of the present invention.

Figure 22A:
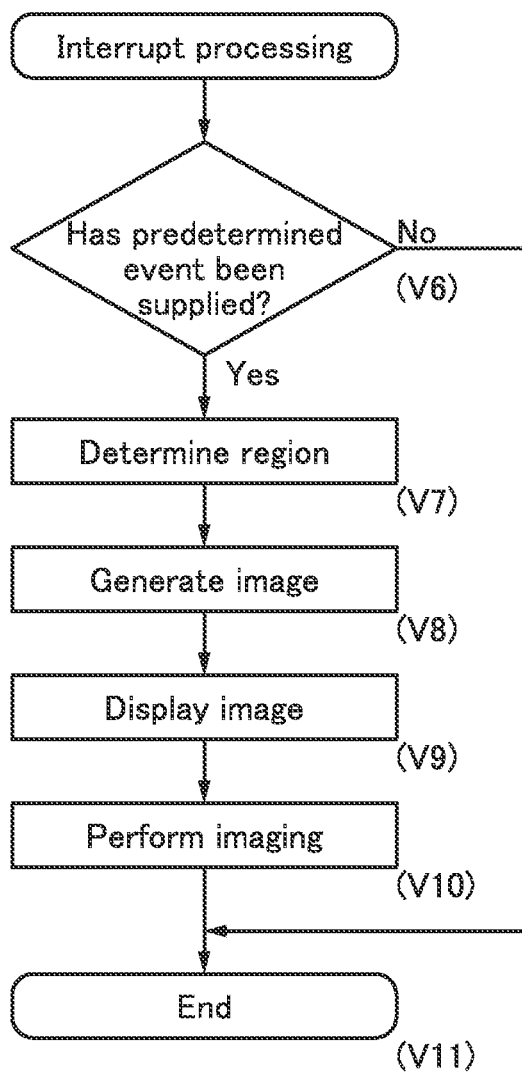
FIG. 22A to FIG. 22C are diagrams showing a driving method of a data processing device of an embodiment.
Figure 22B:
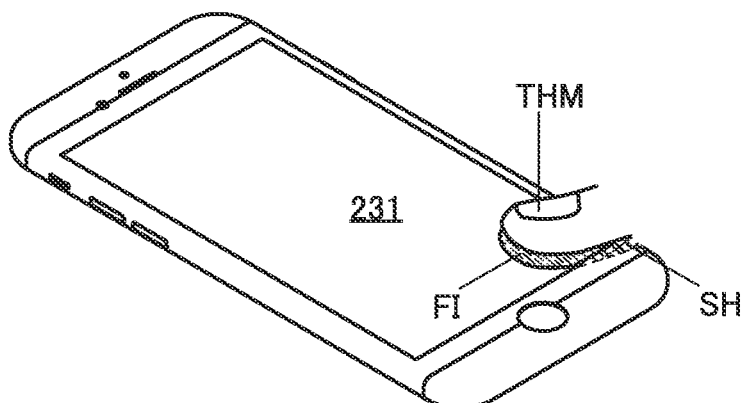
Figure 22C:

FIGS. 22A to 22C show a program of one embodiment of the present invention. FIG. 22A is a flow chart showing interrupt processing different from the interrupt processing shown in FIG. 20B. FIG. 22B is a schematic view illustrating operation of the program shown in FIG. 22A, and FIG. 22C is a schematic view of a taken image of a fingerprint.

Figure 23A:
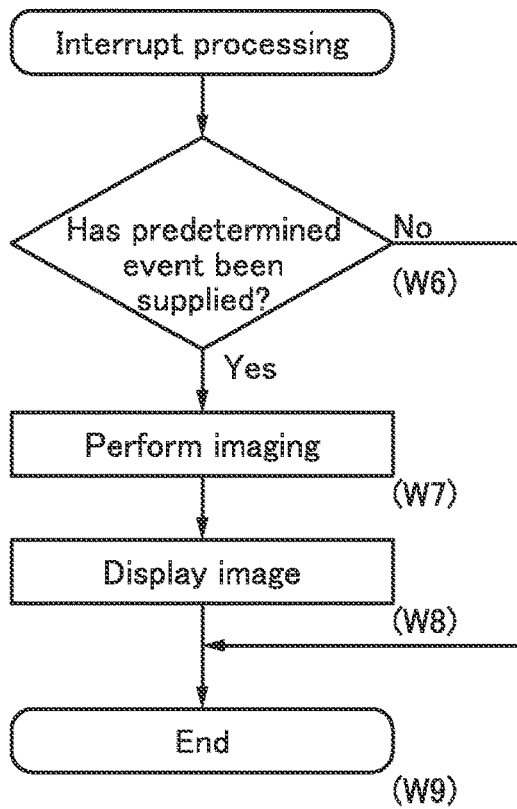
FIG. 23A to FIG. 23D are diagrams showing a driving method of a data processing device of an embodiment.
Figure 23B:
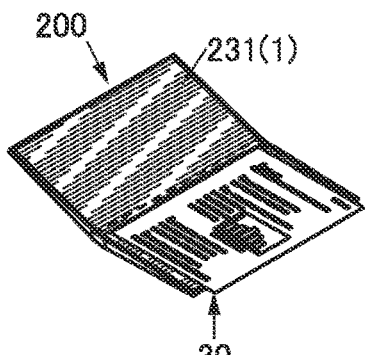
Figure 23C:
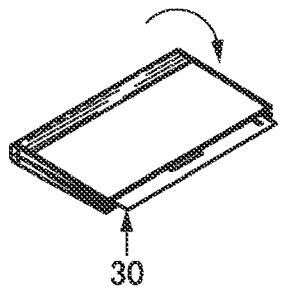
Figure 23D:
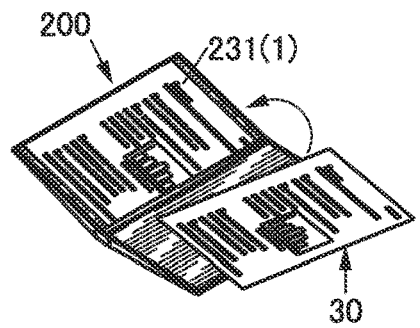

FIGS. 23A to 23D show a program of one embodiment of the present invention. FIG. 23A is a flow chart showing interrupt processing different from the interrupt processing shown in FIG. 20B. FIG. 23B to FIG. 23D are schematic views illustrating operation of the program shown in FIG. 23A.

Structure Example 1 of Data Processing Device

The data processing device described in this embodiment includes an arithmetic device 210 and an input/output device 220 (see FIG. 19A). Note that the input/output device 220 is electrically connected to the arithmetic device 210. A data processing device 200 can include a housing (see FIG. 19B and FIG. 19C).

Structure Example 1 of Arithmetic Device 210

The arithmetic device 210 is supplied with input data II or sensing data DS. The arithmetic device 210 generates the control data CI and the image data VI on the basis of the input data II or the sensing data DS, and supplies the control data CI and the image data VI.

The arithmetic device 210 includes an arithmetic portion 211 and a memory portion 212. The arithmetic device 210 also includes a transmission path 214 and an input/output interface 215.

The transmission path 214 is electrically connected to the arithmetic portion 211, the memory portion 212, and the input/output interface 215.

<<Arithmetic Portion 211>>

The arithmetic portion 211 has a function of executing a program, for example.

<<Memory Portion 212>>

The memory portion 212 has a function of storing, for example, the program executed by the arithmetic portion 211, initial data, setting data, an image, or the like.

Specifically, a hard disk, a flash memory, a memory using a transistor including an oxide semiconductor, or the like can be used.

<<Input/Output Interface 215 and Transmission Path 214>>

The input/output interface 215 includes a terminal or a wiring and has a function of supplying data and being supplied with data. The input/output interface 215 can be electrically connected to the transmission path 214, for example. The input/output interface 215 can also be electrically connected to the input/output device 220.

The transmission path 214 includes a wiring and has a function of supplying data and being supplied with data. The transmission path 214 can be electrically connected to the input/output interface 215, for example. The transmission path 214 can also be electrically connected to the arithmetic portion 211, the memory portion 212, or the input/output interface 215.

Structure Example of Input/Output Device 220

The input/output device 220 supplies the input data II and the sensing data DS, and the input/output device 220 is supplied with the control data CI and the image data VI (see FIG. 19A).

As the input data II, for example, a scan code of a keyboard, position data, data on button handling, sound data, or image data can be used. As the sensing data DS, for example, illuminance data, attitude data, acceleration data, bearing data, pressure data, temperature data, humidity data, or the like of the environment where the data processing device 200 is used, or the like can be used.

As the control data CI, for example, a signal controlling the luminance of display of the image data VI, a signal controlling the color saturation, or a signal controlling the hue can be used. A signal that changes display of part of the image data VI can be used as the control data CI.

The input/output device 220 includes the display portion 230, the input portion 240, and the sensing portion 250. For example, the input/output device described in Embodiment 6 can be used as the input/output device 220. The input/output device 220 can include a communication portion 290.

Structure Example of Display Portion 230

The display portion 230 displays the image data VI on the basis of the control data CI. For example, the display device described in Embodiment 5 can be used for the display portion 230.

Structure Example of Input Portion 240

The input portion 240 generates the input data II. For example, the input portion 240 has a function of supplying position data P1.

For example, a human interface or the like can be used as the input portion 240 (see FIG. 19A). Specifically, a keyboard, a mouse, a touch sensor, a microphone, a camera, or the like can be used as the input portion 240.

A touch sensor including a region overlapping with the display portion 230 can be used. Note that an input/output device including the display portion 230 and a touch sensor including a region overlapping with the display portion 230 can be referred to as a touch panel or a touch screen.

A user can make various gestures (tap, drag, swipe, pinch in, and the like) using his/her finger touching the touch panel as a pointer, for example.

The arithmetic device 210, for example, analyzes data on the position, path, or the like of a finger in contact with the touch panel and can determine that a predetermined gesture is supplied when the analysis results meet predetermined conditions. Thus, the user can supply a predetermined operation instruction associated with a predetermined gesture in advance by using the gesture.

For instance, the user can supply a "scroll instruction" for changing the display position of image data by using a gesture of moving a finger in contact with the touch panel along the touch panel.

The user can supply a "dragging instruction" for pulling out and displaying a navigation panel NP at an edge portion of the display region of the display portion 230 by using a gesture of moving a finger in contact with the edge portion of the display region (see FIG. 19C). Moreover, the user can supply a "leafing through instruction" for displaying index images IND, some parts of other pages, or thumbnail images TN of other pages in a predetermined order on the navigation panel NP so that the user can flip through these images, by using a gesture of moving the position where a finger presses hard. The instruction can be supplied by using the finger press pressure. Consequently, the user can turn the pages of an e-book reader like flipping through the pages of a paper book. The user can search a certain page with the aid of the thumbnail images TN or the index images IND.

Structure Example of Sensing Portion 250

The sensing portion 250 generates the sensing data DS. The sensing portion 250 has a function of sensing the illuminance of the environment where the data processing device 200 is used and a function of supplying illuminance data, for example.

The sensing portion 250 has a function of sensing the ambient conditions and supplying the sensing data. Specifically, illuminance data, attitude data, acceleration data, bearing data, pressure data, temperature data, humidity data, or the like can be supplied.

For example, a photosensor, an attitude sensor, an acceleration sensor, a direction sensor, a GPS (Global positioning System) signal receiving circuit, a pressure-sensitive switch, a pressure sensor, a temperature sensor, a humidity sensor, a camera, or the like can be used as the sensing portion 250.

<<Communication Portion 290>>

The communication portion 290 has a function of supplying data to a network and obtaining data from the network.

<<Housing>>

Note that the housing has a function of storing the input/output device 220 or the arithmetic device 210. The housing has a function of supporting the display portion 230 or the arithmetic device 210.

Thus, the control data CI can be generated on the basis of the input data II or the sensing data DS. The image data VI can be displayed on the basis of the input data II or the sensing data DS. The data processing device is capable of operating with knowledge of the intensity of light that the housing of the data processing device receives in the environment where the data processing device is used. The user of the data processing device can select a display method. Thus, a novel data processing device that is highly convenient, useful, or reliable can be provided.

Note that in some cases, these components cannot be clearly distinguished from each other and one component may also serve as another component or may include part of another component. For example, a touch panel in which a touch sensor overlaps with a functional panel is an input portion as well as a display portion.

Structure Example 2 of Arithmetic Device 210

The arithmetic device 210 includes an artificial intelligence portion 213 (see FIG. 19A).

The artificial intelligence portion 213 is supplied with the input data II or the sensing data DS, and the artificial intelligence portion 213 infers the control data CI on the basis of the input data II or the sensing data DS. Moreover, the artificial intelligence portion 213 supplies the control data CI.

In this manner, the control data CI for display that can be felt suitable can be generated. Display that can be felt suitable is possible. The control data CI for display that can be felt comfortable can be generated. Display that can be felt comfortable is possible. Thus, a novel data processing device that is highly convenient, useful, or reliable can be provided.

[Natural Language Processing on Input Data II]

Specifically, the artificial intelligence portion 213 can perform natural language processing on the input data II to extract one feature from the whole input data II. For example, the artificial intelligence portion 213 can infer emotion or the like put in the input data II, which can be a feature. The artificial intelligence portion 213 can infer the color, design, font, or the like empirically felt suitable for the feature. The artificial intelligence portion 213 can generate data specifying the color, design, or font of a letter or data specifying the color or design of the background, and the data can be used as the control data CI.

Specifically, the artificial intelligence portion 213 can perform natural language processing on the input data II to extract some words included in the input data II. For example, the artificial intelligence portion 213 can extract expressions including a grammatical error, a factual error, emotion, and the like. The artificial intelligence portion 213 can generate and use the control data CI for displaying extracted part in the color, design, font, or the like different from those of another part, and the data.

[Image Processing on Input Data II]

Specifically, the artificial intelligence portion 213 can perform image processing on the input data II to extract one feature from the input data II. For example, the artificial intelligence portion 213 can infer the age where an image of the input data II is taken, whether the image is taken indoors or outdoors, whether the image is taken in the daytime or at night, or the like, which can be a feature. The artificial intelligence portion 213 can infer the color tone empirically felt suitable for the feature and generate the control data CI for use of the color tone for display. Specifically, data specifying color (e.g., full color, monochrome, or sepia) used for expression of a gradation can be used as the control data CI.

Specifically, the artificial intelligence portion 213 can perform image processing on the input data II to extract some images included in the input data II. For example, the artificial intelligence portion 213 can generate the control data CI for displaying a boundary between extracted part of the image and another part. Specifically, the artificial intelligence portion 213 can generate the control data CI for displaying a rectangle surrounding the extracted part of the image.

[Inference Using Sensing Data DS]

Specifically, the artificial intelligence portion 213 can generate an inference RI using the sensing data DS. The artificial intelligence portion 213 can generate the control data CI on the basis of the inference RI so that the user of the data processing device 200 can feel comfortable.

Specifically, the artificial intelligence portion 213 can generate the control data CI for adjustment of display brightness on the basis of the ambient illuminance or the like so that the display brightness can be felt comfortable. The artificial intelligence portion 213 can generate the control data CI for adjustment of volume on the basis of the ambient noise or the like so that the volume can be felt comfortable.

As the control data CI, a clock signal, a timing signal, or the like that is supplied to the control portion 238 included in the display portion 230 can be used. A clock signal, a timing signal, or the like that is supplied to a control portion included in the input portion 240 can be used as the control data CI.

Structure Example 2 of Data Processing Device

Another structure of the data processing device of one embodiment of the present invention is described with reference to FIG. 20A and FIG. 20B.

<<Program>>

The program of one embodiment of the present invention includes the following steps (see FIG. 20A).

[First Step]

In a first step, setting is initialized (see (S1) in FIG. 20A).

For example, predetermined image data that is to be displayed on start-up, a predetermined mode for displaying the image data, and data for determining a predetermined display method for displaying the image data are obtained from the memory portion 212. Specifically, one still image data or another moving image data can be used as the predetermined image data. Furthermore, a first mode or a second mode can be used as the predetermined mode.

[Second Step]

In a second step, interrupt processing is allowed (see (S2) in FIG. 20A). Note that an arithmetic device allowed to execute the interrupt processing can perform the interrupt processing in parallel with the main processing. The arithmetic device that has returned from the interrupt processing to the main processing can reflect the results obtained through the interrupt processing in the main processing.

The arithmetic device may execute the interrupt processing when a counter has an initial value, and the counter may be set at a value other than the initial value when the arithmetic device returns from the interrupt processing. Thus, the interrupt processing can be executed any time after the program is started up.

[Third Step]

In a third step, image data is displayed by a predetermined mode or a predetermined display method selected in the first step or the interrupt processing (see (S3) in FIG. 20A). Note that the predetermined mode determines a mode for displaying the image data, and the predetermined display method determines a method for displaying the image data. For example, the image data VI can be used as data to be displayed.

One method for displaying the image data VI can be associated with the first mode, for example. Another method for displaying the image data VI can be associated with the second mode. Thus, a display method can be selected on the basis of the selected mode.

<<First Mode>>

Specifically, a method for supplying selection signals to a scan line at a frequency of 30 Hz or higher, preferably 60 Hz or higher, to perform display on the basis of the selection signals can be associated with the first mode.

For example, when selection signals are supplied at a frequency of 30 Hz or higher, preferably 60 Hz or higher, the movement of a displayed moving image can be smooth.

For example, when an image is refreshed at a frequency of 30 Hz or higher, preferably 60 Hz or higher, an image that changes so as to smoothly follow the user's operation can be displayed on the data processing device 200 which is being operated by the user.

<<Second Mode>>

Specifically, a method for supplying selection signals to a scan line at a frequency lower than 30 Hz, preferably lower than 1 Hz, further preferably less than once a minute, to perform display on the basis of the selection signals can be associated with the second mode.

The supply of selection signals at a frequency lower than 30 Hz, preferably lower than 1 Hz, further preferably less than once a minute enables display with a flicker or flickering inhibited. Furthermore, the power consumption can be reduced.

For example, in the case where the data processing device 200 is used for a clock, the display can be refreshed at a frequency of once a second, once a minute, or the like.

In the case where a light-emitting element is used as a display element, for example, the light-emitting element can be made to emit light in a pulsed manner so that the image data is displayed. Specifically, an organic EL element can be made to emit light in a pulsed manner, and its afterglow can be used for display. The organic EL element has excellent frequency characteristics; thus, time for driving the light-emitting element can be shortened and the power consumption can be reduced in some cases. Heat generation is inhibited; thus, the deterioration of the light-emitting element can be suppressed in some cases.

[Fourth Step]

In a fourth step, selection is performed such that the program proceeds to a fifth step when an end instruction has been supplied, whereas the program proceeds to the third step when the end instruction has not been supplied (see (S4) in FIG. 20A).

For example, the end instruction supplied in the interrupt processing may be used for the determination.

[Fifth Step]

In the fifth step, the program ends (see (S5) in FIG. 20A).

<<Interrupt Processing>>

The interrupt processing includes a sixth step to an eighth step described below (see FIG. 20B).

[Sixth Step]

In the sixth step, the illuminance of the environment where the data processing device 200 is used is sensed using the sensing portion 250, for example (see (S6) in FIG. 20B). Note that color temperature or chromaticity of ambient light may be sensed instead of the illuminance of the environment.

[Seventh Step]

In the seventh step, a display method is determined on the basis of the sensed illuminance data (see (S7) in FIG. 20B). For example, a display method is determined such that the brightness of display is not too dark or too bright.

Note that in the case where the color temperature of the ambient light or the chromaticity of the ambient light is sensed in the sixth step, the color of display may be adjusted.

[Eighth Step]

In the eighth step, the interrupt processing ends (see (S8) in FIG. 20B).

Structure Example 3 of Data Processing Device

Another structure of the data processing device of one embodiment of the present invention is described with reference to FIGS. 21A to 21C.

FIG. 21A is a flow chart showing a program of one embodiment of the present invention. FIG. 21A is a flow chart showing interrupt processing different from the interrupt processing shown in FIG. 20B.

Note that the structure example 3 of the data processing device is different from the interrupt processing described with reference to FIG. 20B in that the interrupt processing includes a step of changing a mode on the basis of a supplied predetermined event. Different portions are described in detail here, and the above description is referred to for portions that can use similar structures.

<<Interrupt Processing>>

The interrupt processing includes a sixth step to an eighth step described below (see FIG. 21A).

[Sixth Step]

In the sixth step, the program proceeds to the seventh step when a predetermined event has been supplied, whereas the program proceeds to the eighth step when the predetermined event has not been supplied (see (U6) in FIG. 21A). For example, whether the predetermined event is supplied in a predetermined period or not can be used as a condition. Specifically, the predetermined period can be longer than 0 seconds, and shorter than or equal to 5 seconds, shorter than or equal to 1 second, or shorter than or equal to 0.5 seconds, preferably shorter than or equal to 0.1 seconds.

[Seventh Step]

In the seventh step, the mode is changed (see (U7) in FIG. 21A). Specifically, the second mode is selected in the case where the first mode has been selected, and the first mode is selected in the case where the second mode has been selected.

For example, it is possible to change the display mode of a region that is part of the display portion 230. Specifically, the display mode of a region where one driver circuit in the display portion 230 including a driver circuit GDA, a driver circuit GDB, and a driver circuit GDC supplies a selection signal can be changed (see FIG. 21B).

For example, the display mode of the region where a selection signal is supplied from the driver circuit GDB can be changed when a predetermined event is supplied to the input portion 240 in a region overlapping with the region where a selection signal is supplied from the driver circuit GDB (see FIG. 21B and FIG. 21C). Specifically, the frequency of supply of the selection signal from the driver circuit GDB can be changed in accordance with a "tap" event supplied to a touch panel with a finger or the like.

A signal GCLK is a clock signal controlling the operation of the driver circuit GDB, and a signal PWC1 and a signal PWC2 are pulse width control signals controlling the operation of the driver circuit GDB. The driver circuit GDB supplies selection signals to a conductive film G2($m$+1) to a conductive film G2(2$m$) on the basis of the signal GCLK, the signal PWC1, the signal PWC2, and the like.

Thus, for example, the driver circuit GDB can supply a selection signal without supply of selection signals from the driver circuit GDA and the driver circuit GDC. The display of the region where a selection signal is supplied from the driver circuit GDB can be refreshed without any change in the display of regions where selection signals are supplied from the driver circuit GDA and the driver circuit GDC. Power consumed by the driver circuits can be reduced.

[Eighth Step]

In the eighth step, the interrupt processing ends (see (U8) in FIG. 21A). Note that in a period during which the main processing is executed, the interrupt processing may be repeatedly executed.

<<Predetermined Event>>

For example, it is possible to use events supplied using a pointing device such as a mouse, such as "click" and "drag", and events supplied to a touch panel with a finger or the like used as a pointer, such as "tap", "drag", and "swipe".

For example, the position of a slide bar pointed by a pointer, the swipe speed, and the drag speed can be used to assign arguments to an instruction associated with a predetermined event.

For example, data sensed by the sensing portion 250 is compared with a predetermined threshold value, and the compared results can be used for the event.

Specifically, a pressure sensor or the like in contact with a button or the like that is arranged so as to be pushed in a housing can be used for the sensing portion 250.

<<Instruction Associated with Predetermined Event>>

For example, the end instruction can be associated with a predetermined event.

For example, "page-turning instruction" for switching display from one displayed image data to another image data can be associated with a predetermined event. Note that an argument determining the page-turning speed or the like, which is used when the "page-turning instruction" is executed, can be supplied using the predetermined event.

For example, "scroll instruction" for moving the display position of displayed part of image data and displaying another part continuing from that part, or the like can be associated with a predetermined event. Note that an argument determining the moving speed of display, or the like, which is used when the "scroll instruction" is executed, can be supplied using the predetermined event.

For example, an instruction for setting the display method, an instruction for generating image data, or the like can be associated with a predetermined event. Note that an argument determining the brightness of a generated image can be associated with a predetermined event. An argument determining the brightness of a generated image may be determined on the basis of ambient brightness sensed by the sensing portion 250.

For example, an instruction for acquiring data distributed via a push service using the communication portion 290 or the like can be associated with a predetermined event.

Note that position data sensed by the sensing portion 250 may be used for the determination of the presence or absence of a qualification for acquiring data. Specifically, it may be determined that there is a qualification for acquiring data in the case of presence in a predetermined class room, school, conference room, company, building, or the like or in a predetermined region. Thus, for example, educational materials distributed in a classroom of a school, a university, or the like can be received, so that the data processing device 200 can be used as a schoolbook or the like (see FIG. 19C). Materials distributed in a conference room in, for example, a company can be received and used for a conference material.

Structure Example 4 of Data Processing Device

Another structure of the data processing device of one embodiment of the present invention is described with reference to FIG. 22A to FIG. 22C.

Note that the structure example 4 of the data processing device described with reference to FIG. 22A is different from the structure example described with reference to FIG. 20B in the interrupt processing. Specifically, the interrupt processing includes the step of determining a region, the step of generating an image, the step of displaying the image, and the step of imaging on the basis of a supplied predetermined event. Different portions are described in detail here, and the above description is referred to for portions that can use similar structures.

<<Interrupt Processing>>

The interrupt processing includes a sixth step to an eleventh step (see FIG. 22A).

[Sixth Step]

In the sixth step, the program proceeds to the seventh step when a predetermined event has been supplied, whereas the program proceeds to the eleventh step when the predetermined event has not been supplied (see (V6) in FIG. 22A).

The predetermined event can be supplied using the sensing portion 250, for example. Specifically, a motion such as lifting of the data processing device can be used as the predetermined event. For example, a motion of the data processing device can be sensed using an angular sensor or an acceleration sensor. Touch of a finger or approach of an object can be sensed using a touch sensor.

[Seventh Step]

In the seventh step, a first region SH is determined (see (V7) in FIG. 22A).

For example, a region where an object such as a finger touches or approaches the input/output device 220 of one embodiment of the present invention can be the first region SH. A region that is set in advance by the user or the like can be used as the first region SH.

Specifically, an image of a finger THM or the like that touches or approaches the functional panel of one embodiment of the present invention is taken using the pixel $703(i,j)$ and subjected to image processing, whereby the first region SH can be determined (see FIG. 22B).

For example, an image of a shadow caused when external light is blocked by touch or approach of an object such as the finger THM is taken using the pixel $703(i,j)$ in the functional panel of one embodiment of the present invention and subjected to image processing, whereby the first region SH can be determined.

With the use of the pixel $703(i,j)$ in the functional panel of one embodiment of the present invention, an object such as the finger THM that touches or approaches the functional panel is irradiated with light, and an image of light reflected by the object is taken using the pixel $703(i,j)$ and subjected to image processing, whereby the first region SH can be determined.

A region where an object such as the finger THM touches can be determined as the first region SH by a touch sensor.

[Eighth Step]

In the eighth step, an image FI including a second region and a third region is generated on the basis of the first region SH (see (V8) in FIG. 22A and FIG. 22B). For example, the shape of the first region SH is used as the shape of the second region, and a region excluding the first region SH is used as the third region.

[Ninth Step]

In the ninth step, the image FI is displayed such that the second region overlaps with the first region SH (see (V9) in FIG. 22A and FIG. 22B).

For example, an image signal is generated from the image FI and supplied to the region 231, and light is emitted from the pixel $703(i,j)$. In a period during which the first selection signal is supplied to the conductive film G1 (*i*), the generated image signal is supplied to the conductive film S1g(*j*), and the image signal can be written to the pixel 703(*i,j*). The generated image signal is supplied to the conductive film S1g(*j*) and the conductive film S2g(*j*), and an enhanced image signal can be written to the pixel 703(*i,j*). The use of an enhanced image signal enables display with higher luminance.

Thus, the image FI can be displayed to overlap with the first region SH where the object such as a finger touches or approaches the region 231. The region where the object such as a finger touches can be irradiated with light using the pixel 703(*i,j*). The touching or approaching object such as the finger THM can be illuminated with a light. The object such as a finger can be led to touch or approach the region that is determined in advance by the user or the like.

[Tenth Step]

In the tenth step, the object that touches or approaches the first region SH is imaged while the image FI is displayed (see (V10) in FIG. 22A and FIG. 22B).

For example, an image of the finger THM or the like approaching the region 231 is taken while the finger or the like is irradiated with light. Specifically, an image of a fingerprint FP of the finger THM touching the region 231 can be taken (see FIG. 22C).

For example, the supply of the first selection signal can be stopped while an image is displayed with the pixel 703(*i,j*). For example, imaging can be performed using the pixel 703(*i,j*) while the supply of the first selection signal to the pixel circuit 530G(i,j) is stopped.

Accordingly, the touching or approaching object such as a finger can be imaged while the object is illuminated. Imaging can be performed in a period during which the first selection signal is not supplied. Noise in imaging can be inhibited. A clear image of a fingerprint can be obtained. An image that can be used for the authentication of the user can be obtained. In any area of the region 231, an image of the fingerprint of the finger touching the region 231 can be taken clearly. Thus, a novel data processing device that is highly convenient, useful, or reliable can be provided.

[Eleventh Step]

In the eleventh step, the interrupt processing ends (see (V11) in FIG. 22A).

Structure Example 5 of Data Processing Device

Another structure of the data processing device of one embodiment of the present invention is described with reference to FIG. 23A to FIG. 23D.

<<Interrupt Processing>>

The interrupt processing includes a sixth step to a ninth step (see FIG. 23A).

[Sixth Step]

In the sixth step, the program proceeds to the seventh step when a predetermined event has been supplied, whereas the program proceeds to the ninth step when the predetermined event has not been supplied (see (W6) in FIG. 23A).

The predetermined event can be supplied using the input portion 240, for example. Specifically, with the use of a touch sensor, touch or approach of a finger or the like can be used as the predetermined event. For example, a touch sensor placed to overlap with a portion where an image associated with the interrupt processing is displayed can be used. Specifically, an image associated with the interrupt processing can be displayed in a region 231(1), and the input portion 240 placed to overlap with the region 231(1) can be used.

[Seventh Step]

In the seventh step, imaging is performed using the region 231(1) (see (W7) in FIG. 23A).

For example, when an object 30 approaches or adheres closely to the region 231, a still image is captured (see FIG. 23C). Specifically, a still image is captured when the intensity of external light entering the region 231 becomes smaller than a predetermined value. Alternatively, a still image is captured when an image taken in the region 231 does not show a change exceeding a predetermined level for a predetermined period. Alternatively, a still image is captured after the housing of the data processing device 200 is closed.

[Eighth Step]

In the eighth step, display is performed using the region 231(1) (see (W8) in FIG. 23A).

For example, the still image captured in the seventh step is displayed in the region 231(1) (see FIG. 23D). Specifically, display is performed after the obtained mirror image is laterally inverted to generate a normal image.

[Ninth Step]

In the ninth step, the interrupt processing ends (see (W9) in FIG. 23A).

Accordingly, the touching or approaching object such as a finger can be imaged while being illuminated. A clear image with reduced distortion can be obtained. Information printed on a print or the like can be duplicated to electronic data. The data processing device can be utilized as a flat head scanner. Thus, a novel data processing device that is highly convenient, useful, or reliable can be provided.

Note that this embodiment can be combined with any of the other embodiments in this specification as appropriate.

Embodiment 8

In this embodiment, structures of data processing devices of one embodiment of the present invention are described with reference to FIG. 24A to FIG. 26B.

Figure 24A:
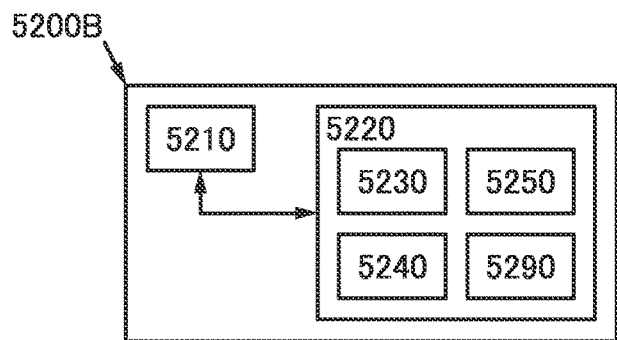
FIG. 24A to FIG. 24E are diagrams illustrating structures of data processing devices of an embodiment.
Figure 24B:
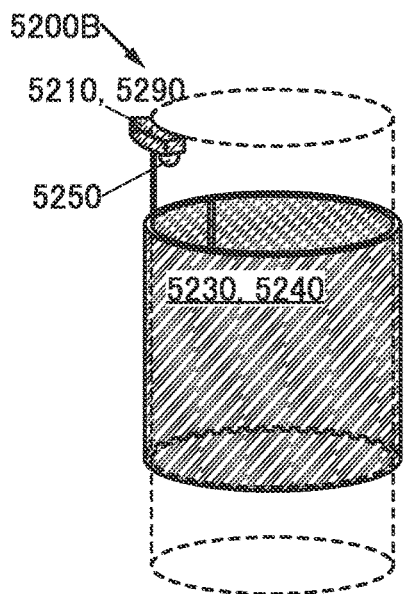
Figure 24C:
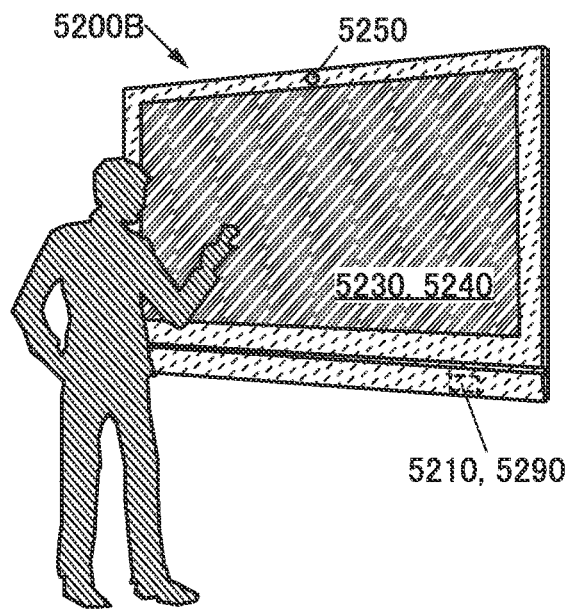
Figure 24D:
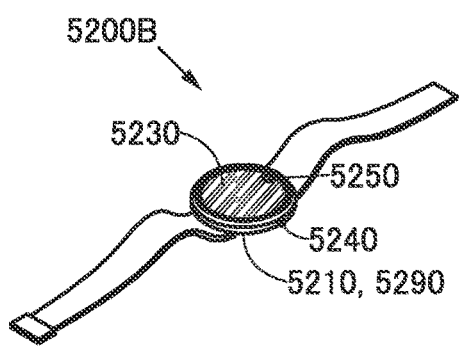
Figure 24E:
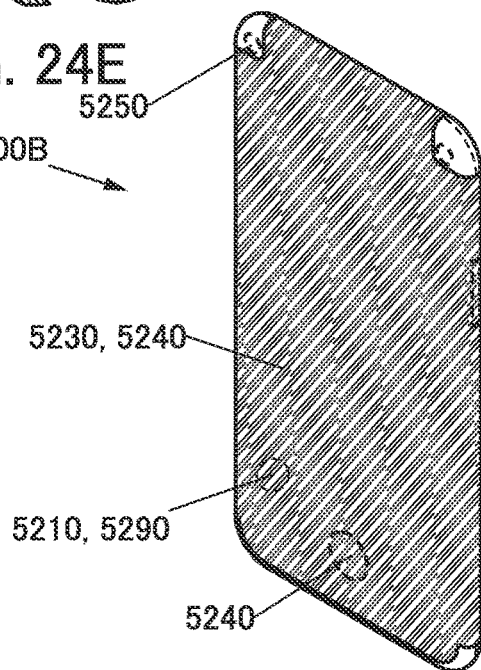
Figure 25A:
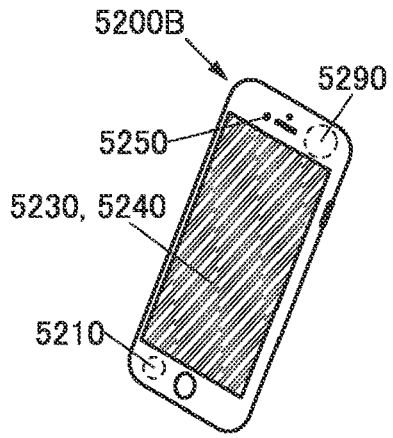
FIG. 25A to FIG. 25E are diagrams illustrating structures of data processing devices of an embodiment.
Figure 25B:
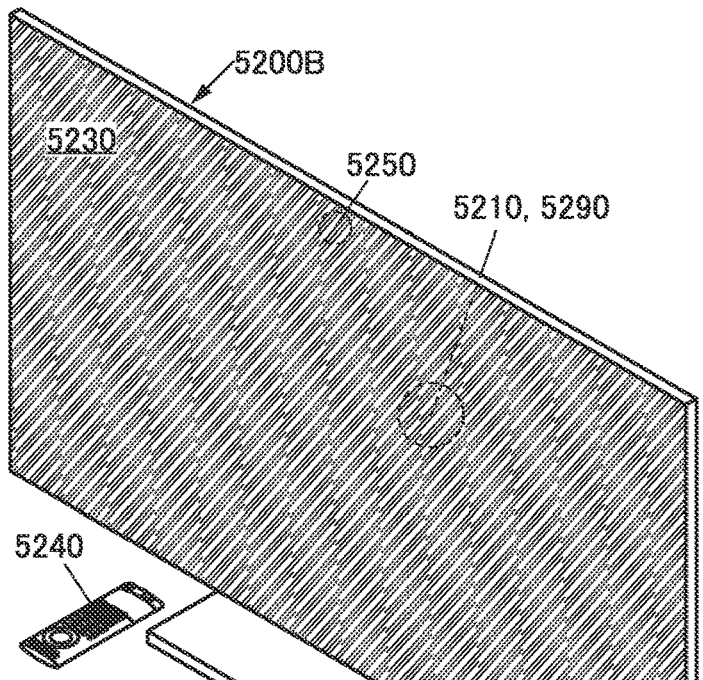
Figure 25C:
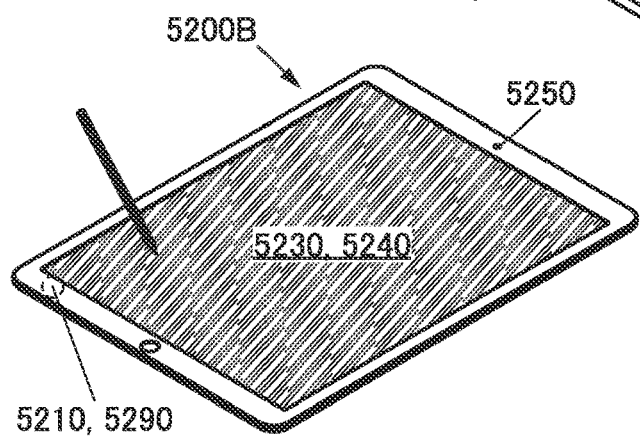
Figure 25D:
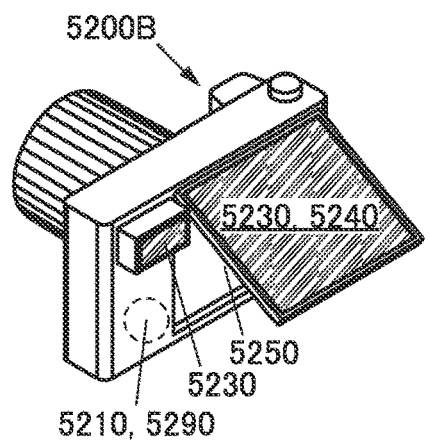
Figure 25E:
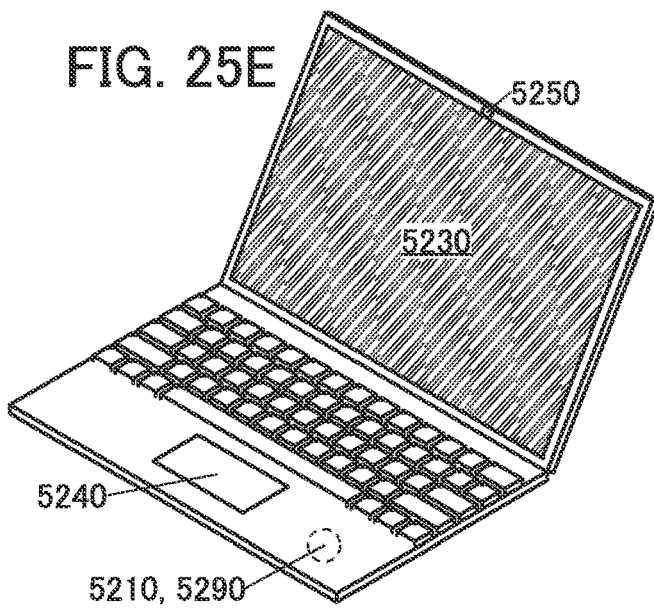
Figure 26A:
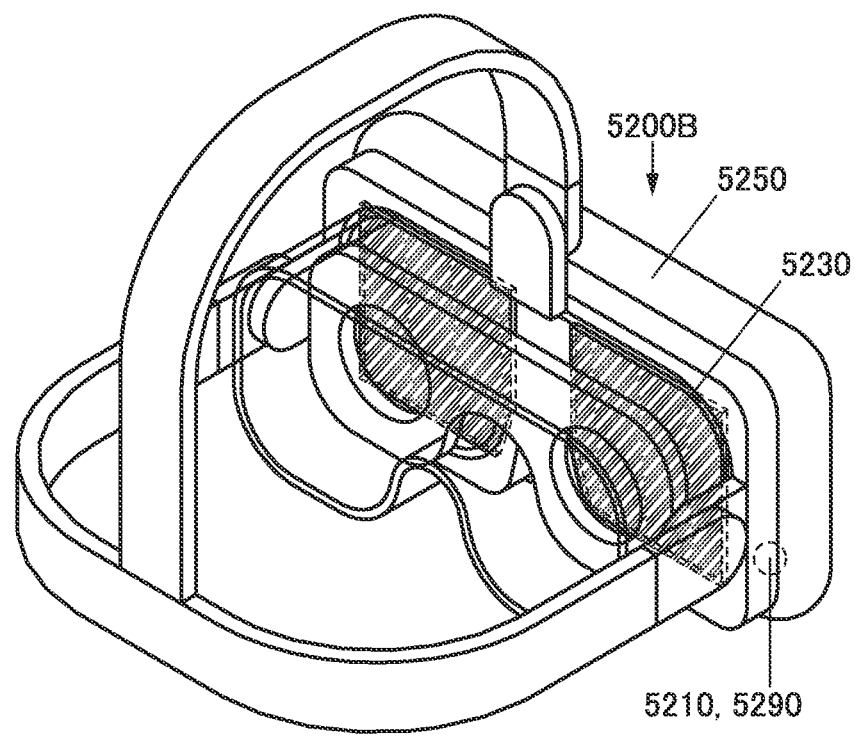
FIG. 26A and FIG. 26B are diagrams illustrating structures of data processing devices of an embodiment.
Figure 26B:
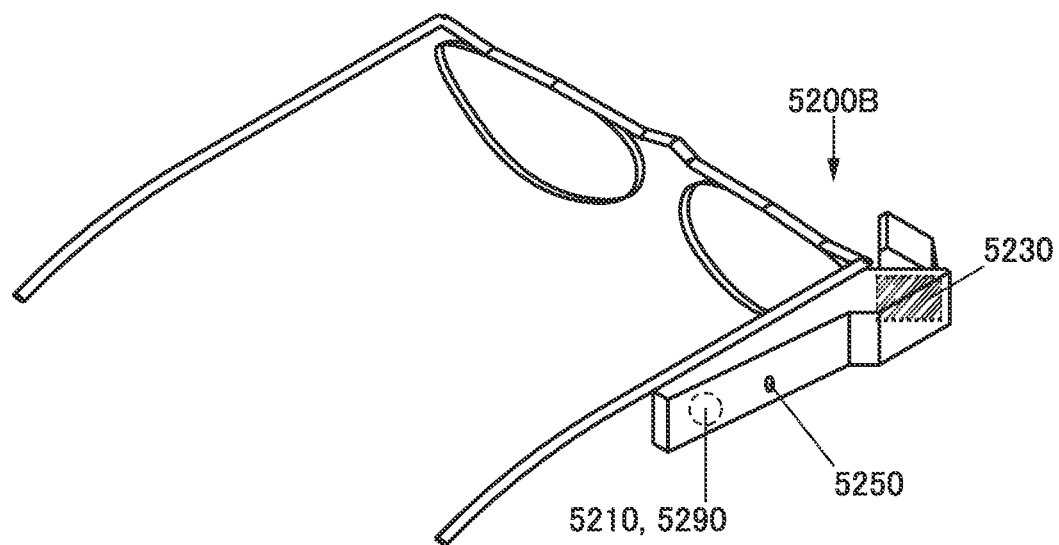

FIG. 24A to FIG. 26B are diagrams illustrating the structures of the data processing devices of one embodiment of the present invention. FIG. 24A is a block diagram of the data processing device, and FIG. 24B to FIG. 24E are perspective views illustrating structures of the data processing devices. In addition, FIG. 25A to FIG. 25E are perspective views illustrating structures of the data processing devices. FIG. 26A and FIG. 26B are perspective views illustrating structures of the data processing devices.

<Data Processing Device>

A data processing device 5200B described in this embodiment includes an arithmetic device 5210 and an input/output device 5220 (see FIG. 24A).

The arithmetic device 5210 has a function of being supplied with operation data and has a function of supplying image data on the basis of the operation data.

The input/output device 5220 includes a display portion 5230, an input portion 5240, a sensing portion 5250, and a communication portion 5290 and has a function of supplying operation data and a function of being supplied with image data. The input/output device 5220 also has a function of supplying sensing data, a function of supplying communication data, and a function of being supplied with communication data.

The input portion 5240 has a function of supplying operation data. For example, the input portion 5240 supplies operation data on the basis of operation by a user of the data processing device 5200B.

Specifically, a keyboard, a hardware button, a pointing device, a touch sensor, an illuminance sensor, an imaging device, an audio input device, an eye-gaze input device, an attitude detection device, or the like can be used as the input portion 5240.

The display portion 5230 includes a functional panel and has a function of displaying image data. For example, the functional panel described in any one of Embodiment 1 to Embodiment 4 can be used for the display portion 5230.

The sensing portion 5250 has a function of supplying sensing data. For example, the sensing portion 5250 has a function of sensing a surrounding environment where the data processing device is used and supplying sensing data.

Specifically, an illuminance sensor, an imaging device, an attitude detection device, a pressure sensor, a human motion sensor, or the like can be used as the sensing portion 5250.

The communication portion 5290 has a function of being supplied with communication data and a function of supplying communication data. For example, the communication portion 5290 has a function of being connected to another electronic device or a communication network through wireless communication or wired communication. Specifically, the communication portion 5290 has a function of wireless local area network communication, telephone communication, near field communication, or the like.

Structure Example 1 of Data Processing Device

For example, the display portion 5230 can have an outer shape along a cylindrical column or the like (see FIG. 24B). In addition, the data processing device has a function of changing its display method in accordance with the illuminance of a usage environment. Furthermore, the data processing device has a function of changing displayed content in response to sensed existence of a person. This allows the data processing device to be provided on a column of a building, for example. The data processing device can display advertising, guidance, or the like. The data processing device can be used for digital signage or the like.

Structure Example 2 of Data Processing Device

For example, the data processing device has a function of generating image data on the basis of the path of a pointer used by a user (see FIG. 24C). Specifically, the functional panel with a diagonal size of 20 inches or longer, preferably 40 inches or longer, further preferably 55 inches or longer can be used. Alternatively, a plurality of functional panels can be arranged and used as one display region. Alternatively, a plurality of functional panels can be arranged and used as a multiscreen. Thus, the data processing device can be used for an electronic blackboard, an electronic bulletin board, digital signage, or the like.

Structure Example 3 of Data Processing Device

The data processing device can receive data from another device and display the data on the display portion 5230 (see FIG. 24D). Several options can be displayed. The user can choose some from the options and send a reply to a transmitter of the data. For example, the data processing device has a function of changing its display method in accordance with the illuminance of a usage environment. Thus, the power consumption of a smartwatch can be reduced, for example. A smartwatch can display an image to be suitably used even in an environment under strong external light, e.g., outdoors in fine weather, for example.

Structure Example 4 of Data Processing Device

For example, the display portion 5230 has a surface gently curved along a side surface of a housing (see FIG. 24E). The display portion 5230 includes a functional panel, and the functional panel has a function of performing display on the front surface, the side surfaces, the top surface, and the rear surface, for example. Thus, for example, a mobile phone can display data not only on its front surface but also on its side surfaces, its top surface, and its rear surface.

Structure Example 5 of Data Processing Device

For example, the data processing device can receive data via the Internet and display the data on the display portion 5230 (see FIG. 25A). A created message can be checked on the display portion 5230. The created message can be sent to another device. The data processing device has a function of changing its display method in accordance with the illuminance of a usage environment, for example. Thus, the power consumption of a smartphone can be reduced. A smartphone can display an image to be suitably used even in an environment under strong external light, e.g., outdoors in fine weather, for example.

Structure Example 6 of Data Processing Device

A remote controller can be used as the input portion 5240 (see FIG. 25B). For example, the data processing device can receive data from a broadcast station or via the Internet and display the data on the display portion 5230. An image of a user can be taken using the sensing portion 5250. The image of the user can be transmitted. The data processing device can obtain a viewing history of the user and provide it to a cloud service. The data processing device can obtain recommendation data from a cloud service and display the data on the display portion 5230. A program or a moving image can be displayed on the basis of the recommendation data. The data processing device has a function of changing its display method in accordance with the illuminance of a usage environment, for example. Accordingly, for example, a television system can display an image to be suitably used even when irradiated with strong external light that enters a room in fine weather.

Structure Example 7 of Data Processing Device

For example, the data processing device can receive educational materials via the Internet and display them on the display portion 5230 (see FIG. 25C). An assignment can be input with the input portion 5240 and sent via the Internet. A corrected assignment or the evaluation of the assignment can be obtained from a cloud service and displayed on the display portion 5230. Suitable educational materials can be selected on the basis of the evaluation and displayed.

For example, the display portion 5230 can perform display using an image signal received from another data processing device. When the data processing device is placed on a stand or the like, the display portion 5230 can be used as a sub-display. Thus, for example, a tablet computer can display an image to be suitably used even in an environment under strong external light, e.g., outdoors in fine weather.

Structure Example 8 of Data Processing Device

The data processing device includes, for example, a plurality of display portions 5230 (see FIG. 25D). For example, the display portion 5230 can display an image that the sensing portion 5250 is capturing. A captured image can be displayed on the display portion. A captured image can be decorated using the input portion 5240. A message can be attached to a captured image. A captured image can be transmitted via the Internet. The data processing device has a function of changing its shooting conditions in accordance with the illuminance of a usage environment. Accordingly, for example, a digital camera can display an object in such a manner that an image is favorably viewed even in an environment under strong external light, e.g., outdoors in fine weather.

Structure Example 9 of Data Processing Device

For example, the data processing device of this embodiment is used as a master and another data processing device is used as a slave, whereby the other data processing device can be controlled (see FIG. 25E). As another example, part of image data can be displayed on the display portion 5230 and another part of the image data can be displayed on a display portion of another data processing device. An image signal can be supplied to another data processing device. With the communication portion 5290, data to be written can be obtained from an input portion of another data processing device. Thus, a large display region can be utilized by using a portable personal computer, for example.

Structure Example 10 of Data Processing Device

The data processing device includes, for example, the sensing portion 5250 that senses an acceleration or a direction (see FIG. 26A). The sensing portion 5250 can supply data on the position of the user or the direction in which the user faces. The data processing device can generate image data for the right eye and image data for the left eye in accordance with the position of the user or the direction in which the user faces. The display portion 5230 includes a display region for the right eye and a display region for the left eye. Thus, a virtual reality image that gives the user a sense of immersion can be displayed on a goggles-type data processing device, for example.

Structure Example 11 of Data Processing Device

The data processing device includes, for example, an imaging device and the sensing portion 5250 that senses an acceleration or a direction (see FIG. 26B). The sensing portion 5250 can supply data on the position of the user or the direction in which the user faces. The data processing device can generate image data in accordance with the position of the user or the direction in which the user faces. Accordingly, the data can be shown together with a real-world scene, for example. An augmented reality image can be displayed on a glasses-type data processing device.

Note that this embodiment can be combined with any of the other embodiments in this specification as appropriate.

In the case where there is an explicit description, X and Y are connected, in this specification and the like, for example, the case where X and Y are electrically connected, the case where X and Y are functionally connected, and the case where X and Y are directly connected are disclosed in this specification and the like. Accordingly, without being limited to a predetermined connection relationship, for example, a connection relationship shown in drawings or texts, a connection relationship other than one shown in drawings or texts is regarded as being disclosed in the drawings or the texts.

Here, X and Y each denote an object (e.g., a device, an element, a circuit, a wiring, an electrode, a terminal, a conductive film, or a layer).

Examples of the case where X and Y are directly connected include the case where an element that allows an electrical connection between X and Y (e.g., a switch, a transistor, a capacitor, an inductor, a resistor, a diode, a display element, a light-emitting element, and a load) is not connected between X and Y, and the case where X and Y are connected without the element that allows the electrical connection between X and Y (e.g., a switch, a transistor, a capacitor, an inductor, a resistor, a diode, a display element, a light-emitting element, and a load).

For example, in the case where X and Y are electrically connected, one or more elements that allow an electrical connection between X and Y (e.g., a switch, a transistor, a capacitor, an inductor, a resistor, a diode, a display element, a light-emitting element, and a load) can be connected between X and Y. Note that a switch has a function of being controlled to be turned on or off. That is, a switch has a function of being in a conduction state (on state) or a non-conduction state (off state) to control whether or not current flows. Alternatively, the switch has a function of selecting and changing a current path. Note that the case where X and Y are electrically connected includes the case where X and Y are directly connected.

An example of the case where X and Y are functionally connected is the case where one or more circuits that allow functional connection between X and Y (for example, a logic circuit (an inverter, a NAND circuit, a NOR circuit, or the like), a signal converter circuit (a DA converter circuit, an AD converter circuit, a gamma correction circuit, or the like), a potential level converter circuit (a power supply circuit (for example, a step-up circuit, a step-down circuit, or the like), a level shifter circuit for changing the potential level of a signal, or the like), a voltage source, a current source, a switching circuit, an amplifier circuit (a circuit capable of increasing signal amplitude, the amount of current, or the like, an operational amplifier, a differential amplifier circuit, a source follower circuit, a buffer circuit, or the like), a signal generator circuit, a memory circuit, a control circuit, or the like) can be connected between X and Y. For example, even when another circuit is interposed between X and Y, X and Y are functionally connected when a signal output from X is transmitted to Y. Note that the case where X and Y are functionally connected includes the case where X and Y are directly connected and the case where X and Y are electrically connected.

Note that in the case where there is an explicit description, X and Y are electrically connected, the case where X and Y are electrically connected (i.e., the case where X and Y are connected with another element or another circuit provided therebetween), the case where X and Y are functionally connected (i.e., the case where X and Y are connected with another circuit provided therebetween), and the case where X and Y are directly connected (i.e., the case where X and Y are connected without another element or another circuit provided therebetween) are disclosed in this specification and the like. That is, in the case where there is an explicit description, being electrically connected, the same contents as the case where there is only an explicit description, being connected, are disclosed in this specification and the like.

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y can be expressed as follows.

It can be expressed as, for example, "X Y, a source (or a first terminal or the like) of a transistor, and a drain (or a second terminal or the like) of the transistor are electrically connected to each other, and X the source (or the first terminal or the like) of the transistor, the drain (or the second terminal or the like) of the transistor, and Y are electrically connected to each other in this order". Alternatively, it can be expressed as "a source (or a first terminal or the like) of a transistor is electrically connected to X a drain (or a second terminal or the like) of the transistor is electrically connected to Y, and X, the source (or the first terminal or the like) of the transistor, the drain (or the second terminal or the like) of the transistor, and Y are electrically connected to each other in this order". Alternatively, it can be expressed as "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided in this connection order". When the connection order in a circuit configuration is defined by an expression similar to the above examples, a source (or a first terminal or the like) and a drain (or a second terminal or the like) of a transistor can be distinguished from each other to specify the technical scope.

As another expression, it can be expressed as "a source (or a first terminal or the like) of a transistor is electrically connected to X through at least a first connection path, the first connection path does not include a second connection path, the second connection path is a path through the transistor and between the source (or the first terminal or the like) of the transistor and a drain (or a second terminal or the like) of the transistor, the first connection path is a path through Z1, the drain (or the second terminal or the like) of the transistor is electrically connected to Y through at least a third connection path, the third connection path does not include the second connection path, and the third connection path is a path through Z2". Alternatively, it can be expressed as "a source (or a first terminal or the like) of a transistor is electrically connected to X through Z1 by at least a first connection path, the first connection path does not include a second connection path, the second connection path includes a connection path through the transistor, a drain (or a second terminal or the like) of the transistor is electrically connected to Y through Z2 by at least a third connection path, and the third connection path does not include the second connection path". Alternatively, it can be expressed as "a source (or a first terminal or the like) of a transistor is electrically connected to X by at least a first electrical path through Z1, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y by at least a third electrical path through Z2, the third electrical path does not include a fourth electrical path, and the fourth electrical path is an electrical path from the drain (or the second terminal or the like) of the transistor to the source (or the first terminal or the like) of the transistor". When the connection path in a circuit configuration is defined by an expression similar to the above examples, a source (or a first terminal or the like) and a drain (or a second terminal or the like) of a transistor can be distinguished from each other to specify the technical scope.

Note that these expressions are examples and the expression is not limited to these expressions. Here, X, Y, Z1, and Z2 denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film has functions of both components: a function of the wiring and a function of the electrode. Thus, "electrical connection" in this specification includes in its category such a case where one conductive film has functions of a plurality of components.

REFERENCE NUMERALS

ANO: conductive film, C21: capacitor, C22: capacitor, C31: capacitor, CAPSEL: conductive film, CDSBIAS: conductive film, CDSVDD: conductive film, CDSVSS: conductive film, CI: control data, CL: conductive film, CLL: conductive film, CP: conductive material, DS: sensing data, FD: node, G1: conductive film, G2: conductive film, G3: conductive film, GCLK: signal, II: input data, IN: terminal, MD: transistor, M21: transistor, M31: transistor, M32: transistor, N21: node, N22: node, NS: node, OUT: terminal, P1: position data, PWC1: signal, PWC2: signal, RS: conductive film, S1$g$: conductive film, S2$g$: conductive film, SE: conductive film, SH: region, SW21: switch, SW22: switch, SW23: switch, SW31: switch, SW32: switch, SW33: switch, TX: conductive film, VCOM2: conductive film, VCL: conductive film, VCP: conductive film, VI: image data, VIV: conductive film, VLEN: conductive film, VPD: conductive film, VPI: conductive film, VR: conductive film, WX: conductive film, FPC1: flexible printed circuit board, 200: data processing device, 210: arithmetic device, 211: arithmetic portion, 212: memory portion, 213: artificial intelligence portion, 214: transmission path, 215: input/output interface, 220: input/output device, 230: display portion, 231: region, 233: control circuit, 234: decompression circuit, 235: image processing circuit, 238: control portion, 240: input portion, 241: sensing region, 243: control circuit, 248: control portion, 250: sensing portion, 290: communication portion, 501C: insulating film, 501D: insulating film, 504: conductive film, 506: insulating film, 508: semiconductor film, 508A: region, 508B: region, 508C: region, 510: base material, 512A: conductive film, 512B: conductive film, 516: insulating film, 518: insulating film, 519B: terminal, 520: functional layer, 521: insulating film, 524: conductive film, 528: insulating film, 530G: pixel circuit, 530S: pixel circuit, 550G: element, 550S: element, 551G: electrode, 551S: electrode, 552: electrode, 553G: layer containing light-emitting material, 553S: layer containing photoelectric conversion material, 573: insulating film, 573A: insulating film, 573B: insulating film, 591G: opening portion, 591S: opening portion, 700: functional panel, 700TP: functional panel, 702B: pixel, 702G: pixel, 702R: pixel, 702S: pixel, 703: pixel, 705: sealant, 720: functional layer, 770: base material, 770P: functional film, 771: insulating film, 802: sensor, 5200B: data processing device, 5210: arithmetic device, 5220: input/output device, 5230: display portion, 5240: input portion, 5250: sensing portion, 5290: communication portion

The invention claimed is:
1. A functional panel comprising:
a first driver circuit;
a second driver circuit; and
a pixel set,
wherein the first driver circuit is configured to supply a first selection signal and a second selection signal,
wherein the second driver circuit is configured to supply an image signal and a control signal,
wherein the control signal comprises a first level and a second level,
wherein the pixel set comprises a first pixel,
wherein the first pixel comprises a first element and a first pixel circuit,
wherein the first pixel circuit is supplied with the first selection signal, the second selection signal, the image signal, and the control signal,
wherein the first pixel circuit obtains the image signal on the basis of the first selection signal,
wherein the first pixel circuit obtains the control signal on the basis of the second selection signal,
wherein the first pixel circuit is configured to hold a first state to a third state,
wherein the first level is held in the first state,
wherein the second level is held in the second state,
wherein the image signal is held in the third state,
wherein the first element is electrically connected to the first pixel circuit,
wherein the first element performs display with first brightness on the basis of the first state,
wherein the first element performs display with second brightness on the basis of the second state,
wherein the first element performs display using the image signal on the basis of the third state, and
wherein the first brightness is darker than the second brightness.

2. The functional panel according to claim 1,
further comprising a third driver circuit,
wherein the third driver circuit is configured to supply a third selection signal to a fifth selection signal,
wherein the pixel set comprises a second pixel,
wherein the second pixel comprises a second element and a second pixel circuit,
wherein the second element is electrically connected to the second pixel circuit,
wherein the second element is configured to generate an imaging signal,
wherein the second pixel circuit is supplied with the third selection signal to the fifth selection signal,
wherein the second pixel circuit is initialized at a first timing on the basis of the third selection signal,
wherein the second pixel circuit obtains the imaging signal at a second timing on the basis of the fourth selection signal,
wherein the second pixel circuit is configured to supply the imaging signal at a third timing on the basis of the fifth selection signal,
wherein the first pixel circuit holds the first state or the second state from the first timing to the second timing, and
wherein the first pixel circuit holds the third state at the third timing.

3. The functional panel according to claim 1, further comprising:
a first conductive film;
a second conductive film;
a third conductive film;
a fourth conductive film; and
a fifth conductive film,
wherein the first conductive film is supplied with the first selection signal,
wherein the second conductive film is supplied with the second selection signal,
wherein the third conductive film is supplied with the image signal,
wherein the fourth conductive film is supplied with the control signal,
wherein the first pixel circuit comprises a first node, a first transistor, a first switch, and a second switch,
wherein the first transistor comprises a gate electrode electrically connected to the first node, a first electrode electrically connected to the first element, and a second electrode electrically connected to the fifth conductive film,
wherein the first switch comprises a first terminal electrically connected to the third conductive film and a second terminal electrically connected to the first node, and is configured to control a conduction state or a non-conduction state on the basis of a potential of the first conductive film,
wherein the second switch comprises a first terminal electrically connected to the fourth conductive film and a second terminal electrically connected to the first node, and is configured to control a conduction state or a non-conduction state on the basis of a potential of the second conductive film, and
wherein the first element is configured to change brightness on the basis of a potential of the first node.

4. The functional panel according to claim 2, further comprising:
a sixth conductive film;
a seventh conductive film;
an eighth conductive film;
a ninth conductive film;
a tenth conductive film;
an eleventh conductive film; and
a twelfth conductive film,
wherein the sixth conductive film is supplied with the third selection signal,
wherein the seventh conductive film is supplied with the fourth selection signal,
wherein the twelfth conductive film is supplied with the fifth selection signal,
wherein the second pixel circuit comprises a third switch, a fourth switch, a fifth switch, a second transistor, a first capacitor, and a second node,
wherein the third switch comprises a first terminal electrically connected to the second element and a second terminal electrically connected to the second node, and is configured to control a conduction state or a non-conduction state on the basis of a potential of the seventh conductive film,
wherein the fourth switch comprises a first terminal electrically connected to the second node and a second terminal electrically connected to the eighth conductive film, and is configured to control a conduction state or a non-conduction state on the basis of the potential of the sixth conductive film, wherein the first capacitor comprises a conductive film electrically connected to the second node and a conductive film electrically connected to the ninth conductive film, wherein the second transistor comprises a gate electrode electrically connected to the second node and a first electrode electrically connected to the tenth conductive film, and wherein the fifth switch comprises a first terminal electrically connected to the second electrode of the second transistor and a second terminal electrically connected to the eleventh conductive film, and is configured to control a conduction state or a non-conduction state on the basis of a potential of the twelfth conductive film.

5. The functional panel according to claim 4, further comprising:
a reading circuit;
a thirteenth conductive film;
a fourteenth conductive film; and
a fifteenth conductive film,
wherein the reading circuit comprises an amplifier circuit and a sampling circuit,
wherein the amplifier circuit comprises a third transistor,
wherein the third transistor comprises a gate electrode electrically connected to the thirteenth conductive film, a first electrode electrically connected to the eleventh conductive film, and a second electrode electrically connected to the fourteenth conductive film,
wherein the sampling circuit comprises a first terminal, a second terminal, and a third terminal,
wherein the first terminal is electrically connected to the eleventh conductive film,
wherein the second terminal is electrically connected to the fifteenth conductive film, and
wherein the third terminal is configured to supply a signal that changes on the basis of a potential of the first terminal.

6. The functional panel according to claim 2, further comprising a functional layer,
wherein the functional layer comprises the first pixel circuit and the second pixel circuit.

7. The functional panel according to claim 3, further comprising a region,
wherein the region comprises a group of pixel sets and a different group of pixel sets,
wherein the group of pixel sets is provided in a row direction,
wherein the group of pixel sets comprises the pixel set,
wherein the group of pixel sets is electrically connected to the first conductive film,
wherein the different group of pixel sets is provided in a column direction intersecting the row direction,
wherein the different group of pixel sets comprises the pixel set, and wherein the different group of pixel sets is electrically connected to the third conductive film.

8. A display device comprising:
a control portion; and
the functional panel according to claim 1,
wherein the control portion is supplied with image data and control data,
wherein the control portion generates data on the basis of the image data,
wherein the control portion generates a control signal on the basis of the control data,
wherein the control portion supplies the data and the control signal,
wherein the functional panel is supplied with the data and the control signal, and
wherein the pixel set performs display on the basis of the data.

9. An input/output device comprising:
an input portion and a display portion,
wherein the display portion comprises the functional panel according to claim 2,
wherein the input portion comprises a sensing region,
wherein the input portion senses an object approaching the sensing region, and
wherein the sensing region comprises a region overlapping with the first and second pixels.

10. A data processing device comprising:
an arithmetic device and an input/output device,
wherein the arithmetic device is supplied with input data or sensing data,
wherein the arithmetic device generates control data and image data on the basis of the input data or the sensing data,
wherein the arithmetic device supplies the control data and the image data,
wherein the input/output device supplies the input data and the sensing data,
wherein the input/output device is supplied with the control data and the image data,
wherein the input/output device comprises a display portion, an input portion, and a sensing portion,
wherein the display portion comprises the functional panel according to claim 1,
wherein the display portion displays the image data on the basis of the control data,
wherein the input portion generates the input data, and
wherein the sensing portion generates the sensing data.

11. A data processing device comprising one or more of a keyboard, a hardware button, a pointing device, a touch sensor, an illuminance sensor, an imaging device, an audio input device, an eye-gaze input device, and an attitude detection device, and the functional panel according to claim 1.

* * * * *